United States Patent
Nakaya et al.

(10) Patent No.: US 7,197,201 B2
(45) Date of Patent: Mar. 27, 2007

(54) OPTICAL WIRING SUBSTRATE FABRICATION PROCESS AND OPTICAL WIRING SUBSTRATE DEVICE

(75) Inventors: Daisuke Nakaya, Kanagawa (JP); Takeshi Fujii, Kanagawa (JP); Yoji Okazaki, Kanagawa (JP); Kazuhiko Nagano, Kanagawa (JP); Hiromi Ishikawa, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 291 days.

(21) Appl. No.: 10/456,965

(22) Filed: Jun. 9, 2003

(65) Prior Publication Data

US 2004/0037487 A1     Feb. 26, 2004

(30) Foreign Application Priority Data

Jun. 7, 2002 (JP) .............................. 2002-167401

(51) Int. Cl.
*G02B 6/12* (2006.01)
(52) U.S. Cl. ....................................... 385/14; 385/129
(58) Field of Classification Search ........ 385/129–132, 385/14, 147
See application file for complete search history.

(56) References Cited

U.S. PATENT DOCUMENTS

| | | | |
|---|---|---|---|
| 5,742,362 A * | 4/1998 | Chikamichi ..................... | 349/2 |
| 6,037,105 A * | 3/2000 | You et al. .................... | 430/321 |
| 6,356,340 B1 | 3/2002 | Spence | |
| 6,516,104 B1 * | 2/2003 | Furuyama .................... | 385/14 |
| 6,623,665 B1 * | 9/2003 | Ermer ........................ | 252/582 |
| 2002/0021426 A1 | 2/2002 | Mei et al. | |
| 2003/0031365 A1 | 2/2003 | Okuyama | |

FOREIGN PATENT DOCUMENTS

EP     0 651 266 A2     5/1995

(Continued)

OTHER PUBLICATIONS

Eldada L et al: "Robust Photopolymers for MCM, Board, and Backplane Optical Interconnects", Proceedings of the SPIE, SPIE, Bellingham, VA, US, vol. 3288, Jan. 28, 1998, pp. 175-191, XP000791214.

*Primary Examiner*—Kevin S. Wood
(74) *Attorney, Agent, or Firm*—Sughrue Mion, PLLC

(57) ABSTRACT

An optical wiring substrate fabrication method capable of simple formation, by maskless exposure, of an inclined face shape at an end portion of a core layer structuring an optical waveguide. Using an exposure apparatus, image exposure is carried out with a light beam which is modulated by a spatial modulation element in accordance with image information. A predetermined area of a photosensitive material (a photoresist), which is coated on the core layer which is a material of the optical wiring substrate, is exposed by a light beam (UV) and patterned to form an etching mask. A region corresponding to the inclined face, which is to be formed at the end portion of the core layer, is exposed and patterned by the light beam, exposure amounts of which are controlled in accordance with the inclined form of the inclined face, such that an end portion of the etching mask has an inclined face structure. When the core layer is worked by etching using this etching mask, working of the core layer at the end portion of the core layer progresses in proportion to film thickness of the etching mask, and the inclined face is formed.

28 Claims, 44 Drawing Sheets

FOREIGN PATENT DOCUMENTS

| | | |
|---|---|---|
| EP | 1 243 971 A2 | 9/2002 |
| JP | 6-265738 | 9/1994 |
| JP | 2002-82242 A | 3/2002 |
| JP | 2003-340923 A | 12/2003 |
| JP | 2003-340924 A | 12/2003 |
| WO | WO 92/18888 A1 | 10/1992 |

* cited by examiner

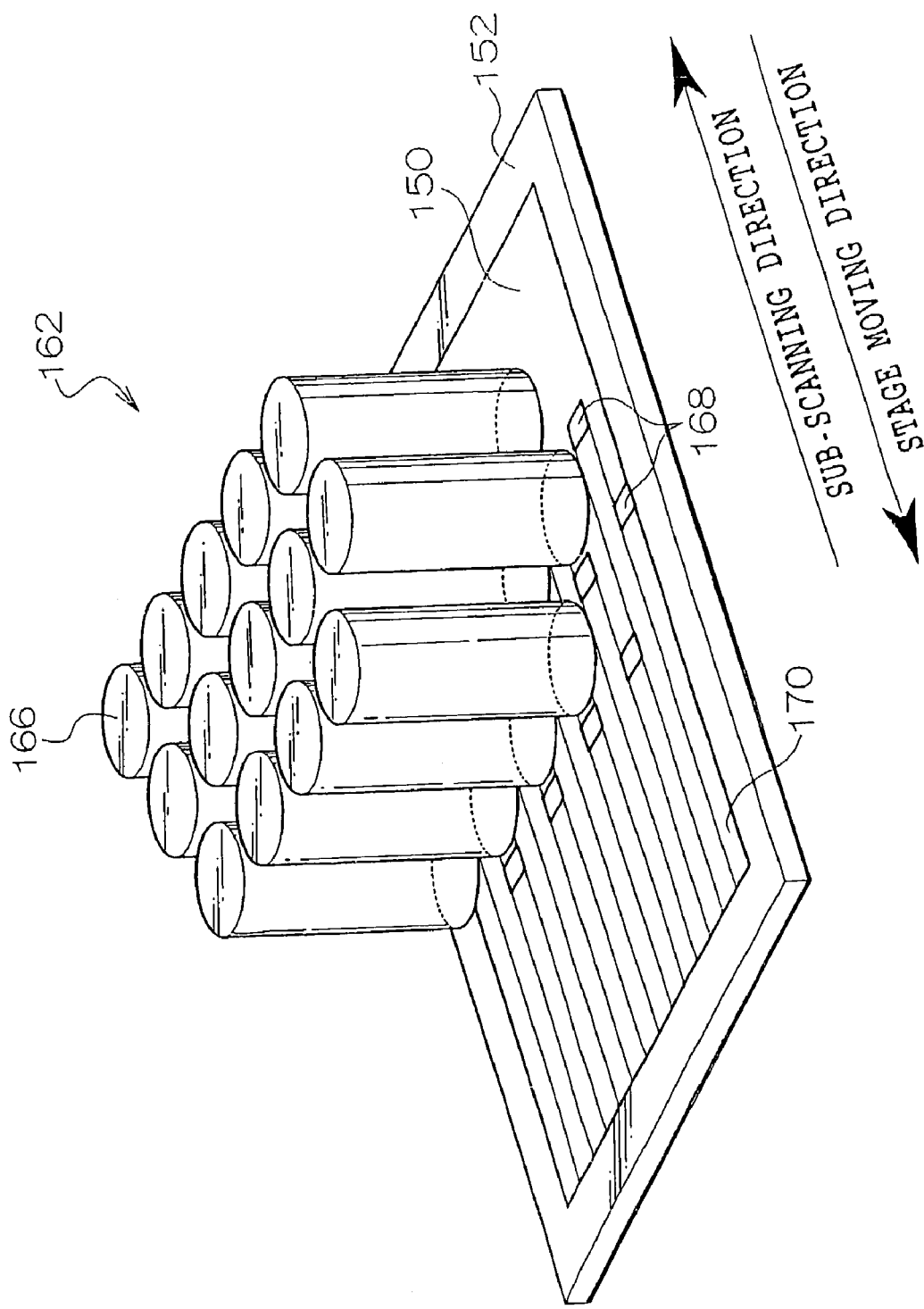

EXPOSED AREA

SUB-SCANNING DIRECTION
ONE TIME CONSTANT AND LOW-SPEED SCANNING (40mm/s)

M ROWS

N COLUMNNS

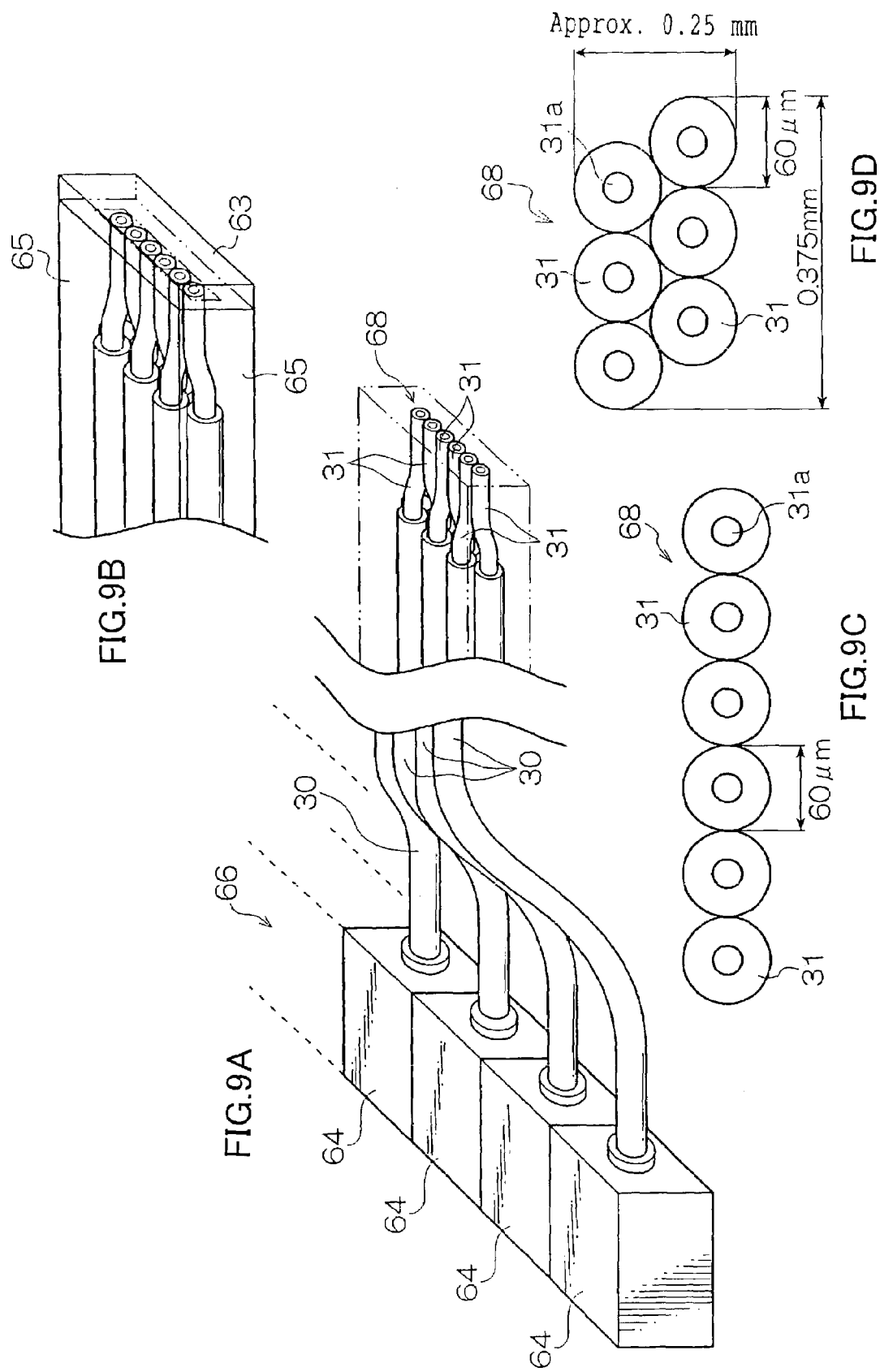

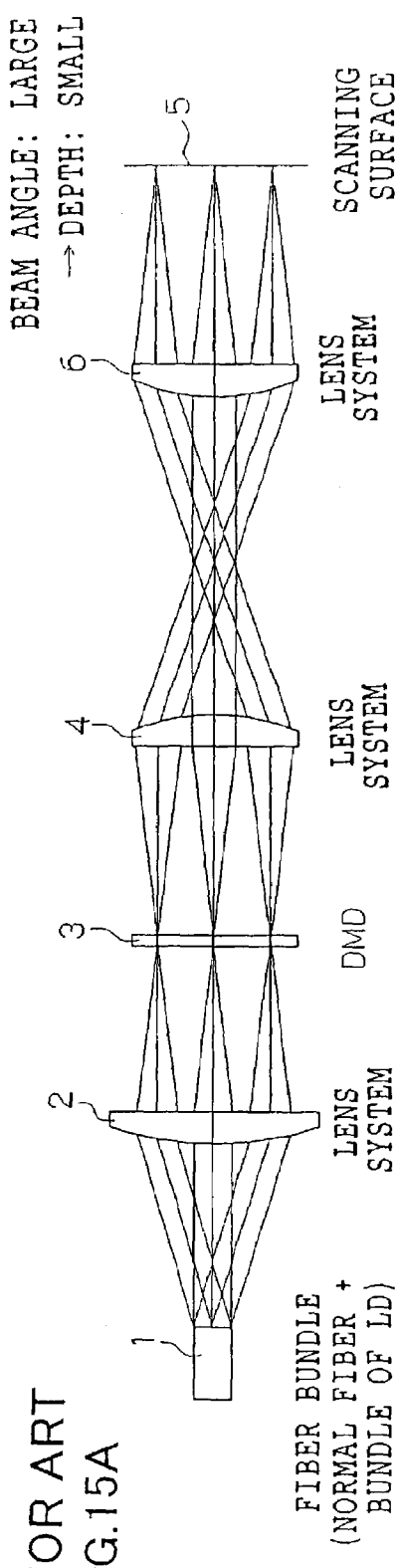
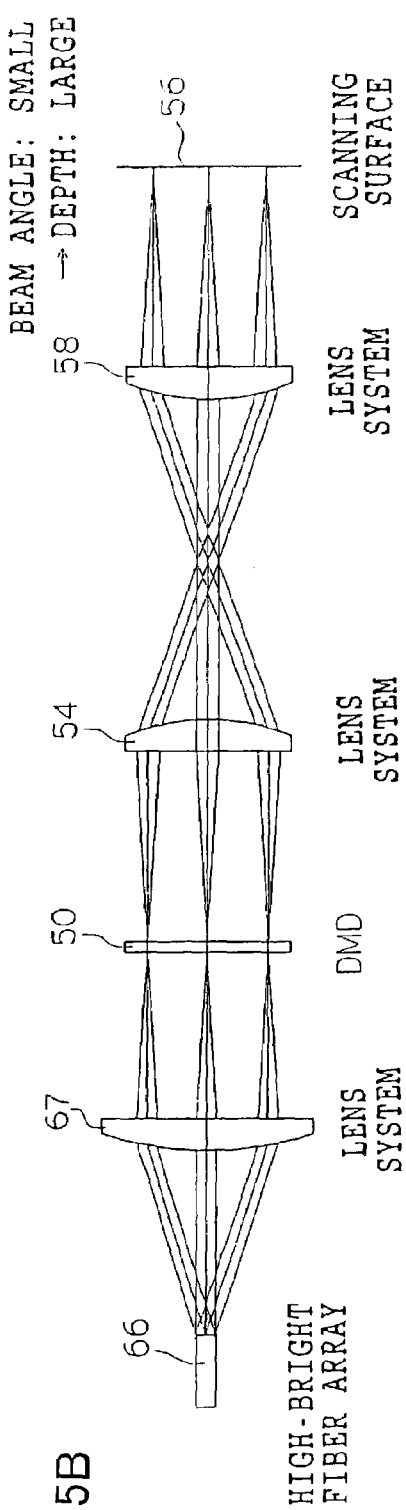

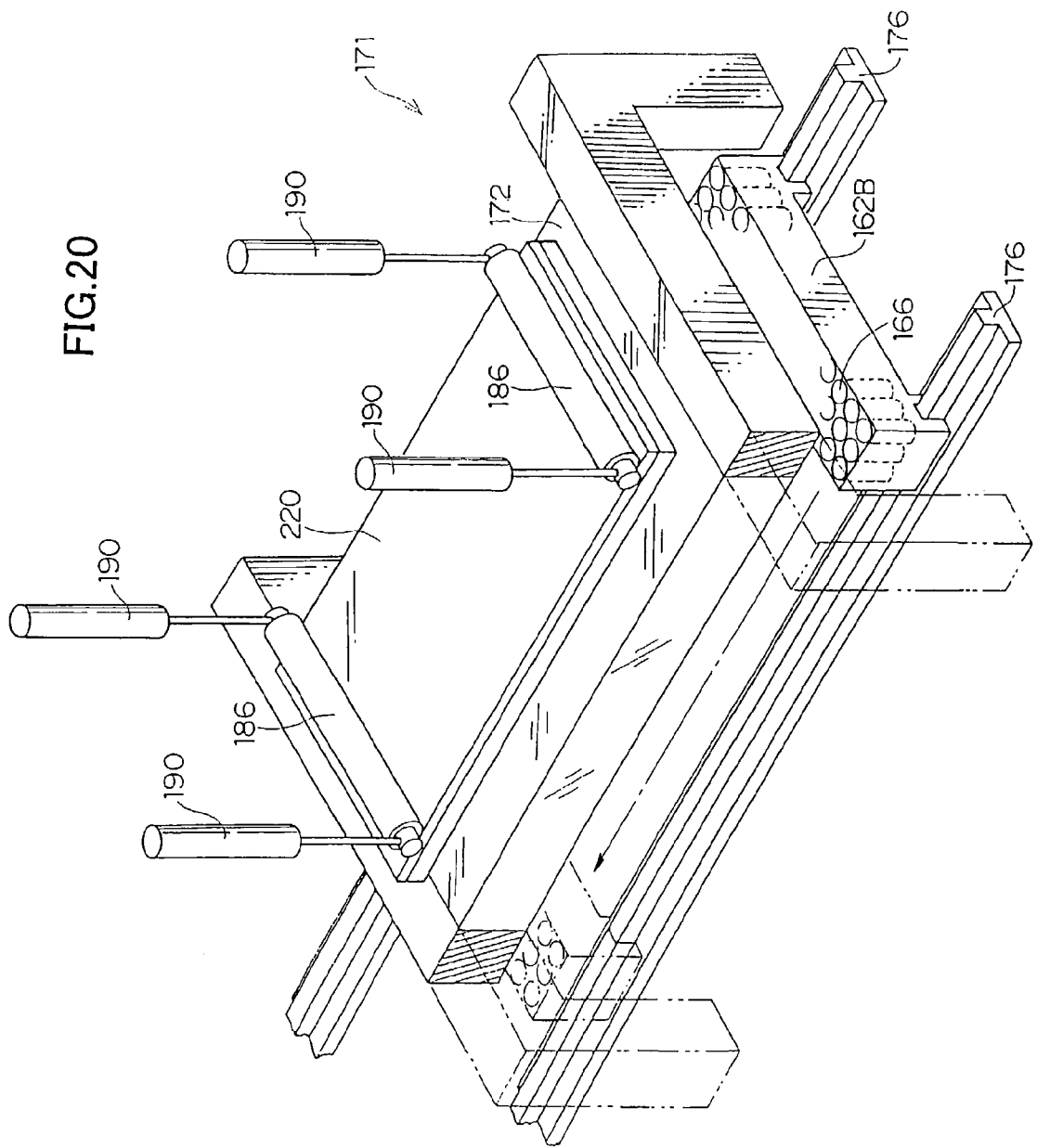

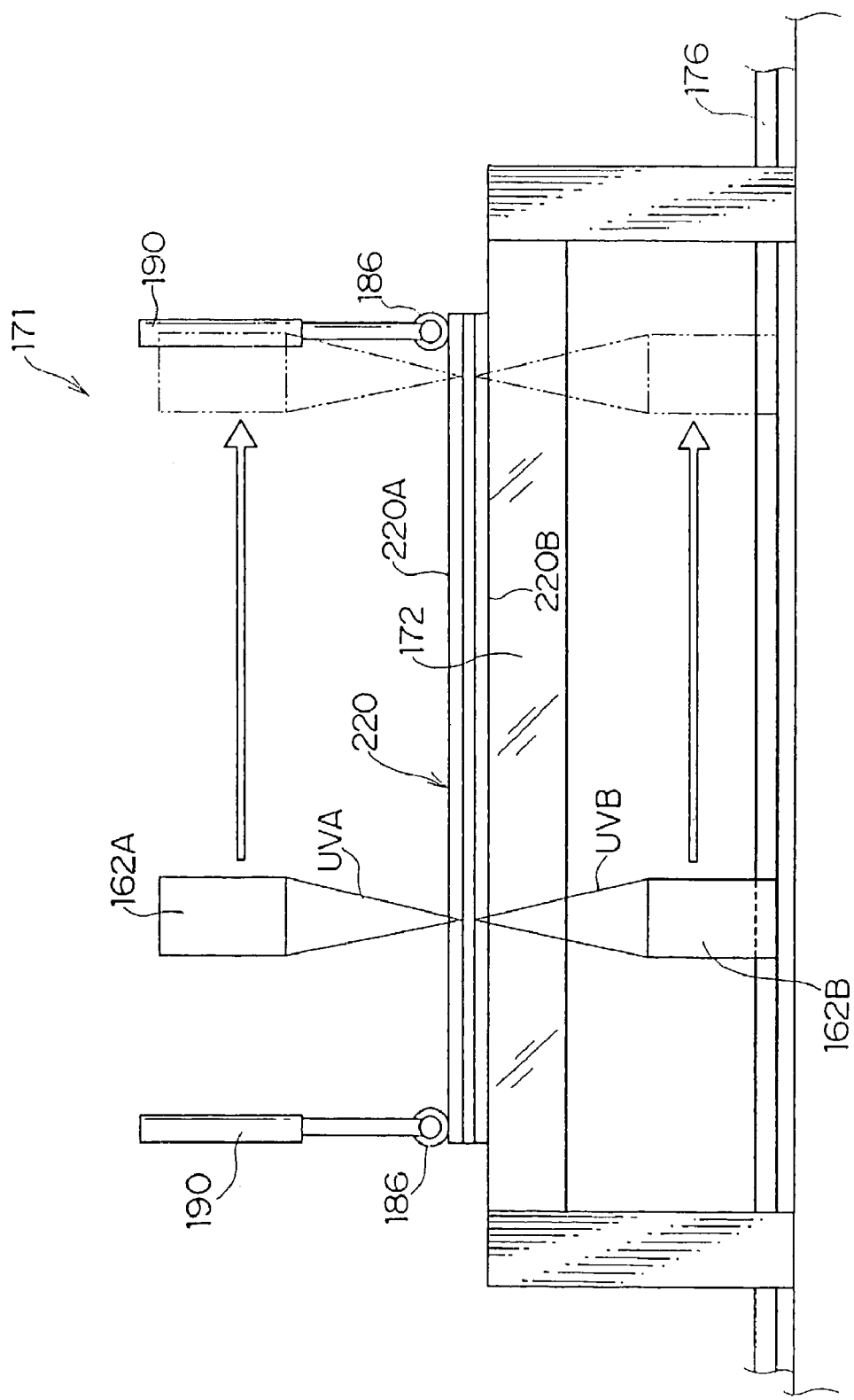

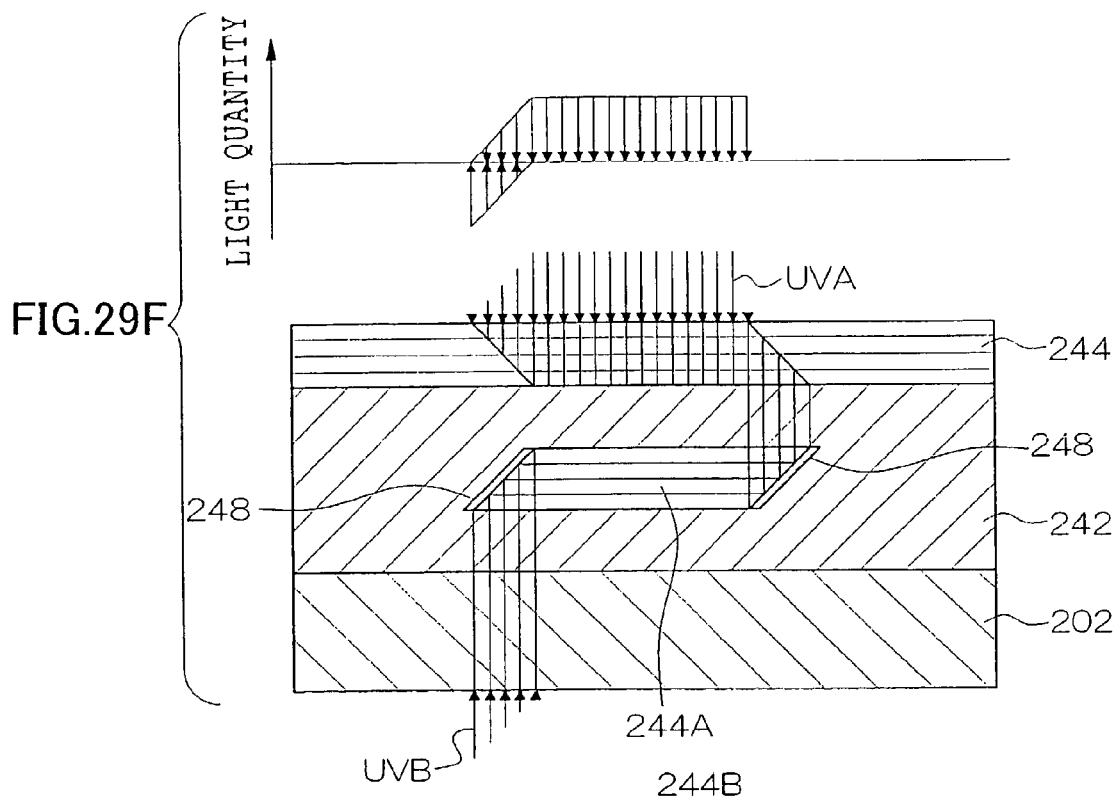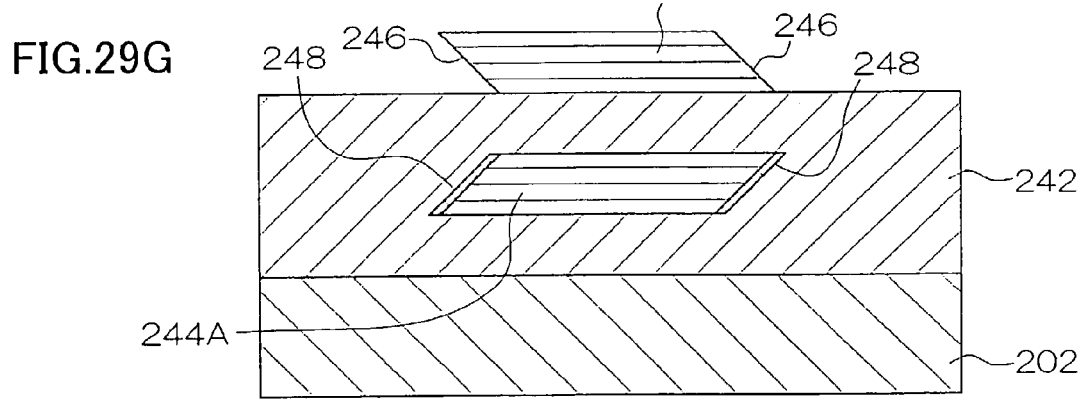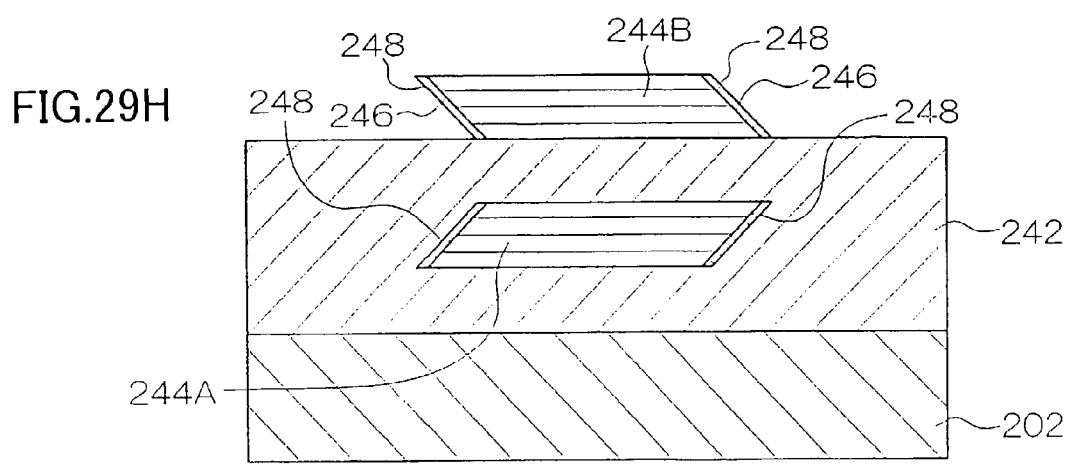

OPTICAL WIRING SUBSTRATE FABRICATION PROCESS AND OPTICAL WIRING SUBSTRATE DEVICE

BACKGROUND OF THE INVENTION

1. Field of the Invention

The present invention relates to a fabrication process and device of an optical wiring substrate.

2. Description of the Related Art

At an optical wiring substrate which is provided with optical wiring circuitry, which is structured as a circuit by optical waveguides (for example, an optical wiring circuit in which light is transmitted and the like by surface mounted-type light-emitting elements and light-receiving elements), light paths are changed by 90° between light paths at the surface mounted-type elements and light paths in the optical waveguides of the optical wiring substrate. Thus, the light is fed into the optical waveguides and emitted from the optical waveguides. End portions of the optical waveguides may accordingly be formed at an inclination of 45°, with reflection mirrors being provided at these inclined end faces.

Conventionally, in order to form an inclined surface at an end portion of an optical waveguide in such an optical wiring substrate, a photo mask is used in which density of a mask pattern at a region corresponding to the inclined face varies (increasing or decreasing) in a longitudinal direction of the optical waveguide. As a result, transmitted amounts of ultraviolet light exposed through a photoresist are varied, and an etching mask with an inclined structure is formed. The mask pattern is transferred by reactive ion etching or the like, and the optical waveguide end portion is worked to the desired inclined form (see, for example, Japanese Patent Application Laid-Open (JP-A) No. 6-265738 (pages 3 to 4 and FIG. 1)). Alternatively, a thick film resist pattern may be formed to have an inclined side face by using a photo mask with a simple structure including a mask pattern for setting end vicinities of portions that are to become mirrors to be boundaries between transparency and shading. A core may be worked to be diagonal by using this resist pattern and dry-etching (see, for example, JP-A No. 2002-82242 (pages 3 to 4 and FIG. 2).

Furthermore, in recent years, it has become possible to create such a structure without a process of etching an optical wiring substrate (a large-area waveguide film or optical waveguides) by using a photo-bleaching method (see, for example, JP-A No. 6-265738 (pages 6 to 7 and FIGS. 5 and 6) and JP-A No. 2002-14241 (page 4)) or a direct exposure method. The photo-bleaching method uses a polymer material such as polysilane, BP-PMA or the like, whose refractive index is varied by light irradiation, in a core material. (BP-PMA is a polymethacrylate (PMA) polymer including a light sensitive base formed by a benzophenone residue (BP base).) the direct etching method uses a photo-curable resin. Accordingly, production can be made simpler.

However, in the example of JP-A No. 6-265738 mentioned above, because the photo mask has a particular structure, fabrication thereof is troublesome. Furthermore, in the technique of JP-A No. 2002-82242, two photolithography processes are required for working of mirror formation portions, and the production process is more complicated.

Moreover, in these conventional examples for carrying out photolithography processes, when an optical wiring substrate is to be fabricated with a number of fabrication levels, in order to provide a plurality of levels of optical wiring circuitry in a thickness direction (a lamination direction) of the substrate, the photolithography processing is carried out repeatedly. In such cases, with substrate materials such as polyimide and the like for which moisture absorption is high and dimensional variations are large, positional accuracy of the mirror formation portions are adversely affected by expansion and contraction of the material. Therefore, in order to achieve positioning with high accuracy, it is necessary to prepare a large number of photo masks with various dimensions. As a result, there are problems in that production processes are complicated and production costs rise.

Even with a photo-bleaching method, direct exposure method or the like not requiring an etching process, a photolithography process is necessary. Therefore, when a multi-layered circuit is to be formed as described above, high accuracy positioning and mirror formation are subject to the same issues.

Meanwhile, in recent years, various exposure apparatuses which employ spatial light modulation elements such as digital micromirror devices (DMD) and the like have been proposed for carrying out image exposure with light beams modulated in accordance with image data.

For example, a DMD is a mirror device in which numerous micromirrors, which alter angles of reflection surfaces thereof in accordance with control signals, are arranged in a two-dimensional pattern on a semiconductor substrate of silicon or the like. An exposure apparatus which utilizes such a DMD is structured with a light source which irradiates laser light, a lens system which collimates the laser light irradiated from the light source, a DMD which is disposed substantially at a focusing position of the lens system, and a lens system which focuses the laser light that has been reflected at the DMD onto a scanning surface. In this exposure apparatus, each micromirror of the DMD is switched "on" and "off" by control signals generated in accordance with image data or the like, and the micromirrors modulate the laser light. Thus, image exposure is carried out by modulated laser light. In this exposure apparatus, an exposure light amount (light intensity) can be controlled at each pixel, which is a single micromirror of the spatial light modulation element. Accordingly, this exposure apparatus has been considered as being favorable for maskless fabrication of the optical wiring substrate described above.

SUMMARY OF THE INVENTION

In light of the circumstances described above, an object of the present invention is to provide a fabrication method capable of simple formation by maskless exposure of optical wiring circuitry, particularly of inclined face forms for providing reflection mirrors at end portions of optical waveguides, and/or capable of simple formation by maskless exposure of circuit structures in which optical wiring circuitry is formed at a plurality of levels in a lamination direction, and to provide an optical wiring substrate provided with such optical wiring circuitry.

In order to achieve the object described above, in accordance with a first aspect of the present invention, a method for fabricating an optical wiring substrate which includes a circuit structure including an optical waveguide is provided, the method including the steps of: preparing an optical material; and exposing a predetermined region of the optical material with a light beam modulated by a spatial modulation element in accordance with image information, for forming the optical waveguide.

In accordance with a second aspect of the present invention, an optical wiring substrate which includes at least one substrate portion which is structured as a circuit including an optical waveguide is provided, the substrate portion having been formed by a fabrication method including the steps of: preparing an optical material; and exposing a predetermined region of the optical material with a light beam modulated by a spatial modulation element in accordance with image information, for forming the optical waveguide.

BRIEF DESCRIPTION OF THE DRAWINGS

FIG. 2 is a perspective view showing structure of a scanner of the exposure apparatus relating to the first embodiment of the present invention.

FIG. 9A is a perspective view showing structure of a fiber array light source.

FIG. 9B is a partial enlarged view of the fiber array light source shown in FIG. 9A.

FIG. 9C is a plan view showing an arrangement of light emission points at a laser emission section.

FIG. 9D is a plan view showing another arrangement of light emission points at a laser emission section.

FIG. 15A is a sectional view, cut along the optical axis, showing depth of focus in a conventional exposure apparatus.

FIG. 15B is a sectional view, cut along the optical axis, showing depth of focus in the exposure apparatus relating to the first embodiment of the present invention.

FIG. 19A shows a case of low resolution, and FIG. 19B shows a case of high resolution.

FIG. 20 is a perspective view showing an exposure apparatus relating to a second embodiment of the present invention.

FIG. 21 is a side view of the exposure apparatus relating to the second embodiment of the present invention.

FIG. 29F is a diagram for explaining the fabrication process relating to the sixth embodiment, showing a stage at which the second level core layer is exposed by light beams with varying exposure light amounts from both sides.

FIG. 29G is a diagram for explaining the fabrication process relating to the sixth embodiment, showing a state in which the second level core layer is developed.

FIG. 29H is a diagram for explaining the fabrication process relating to the sixth embodiment, showing a state in which reflection mirrors are formed at inclined faces of end portions of the second level core layer.

DETAILED DESCRIPTION OF THE PREFERRED EMBODIMENTS

Below, embodiments of the present invention will be described in detail with reference to the drawings.

First Embodiment

Structure of Exposure Apparatus

Figure 1:
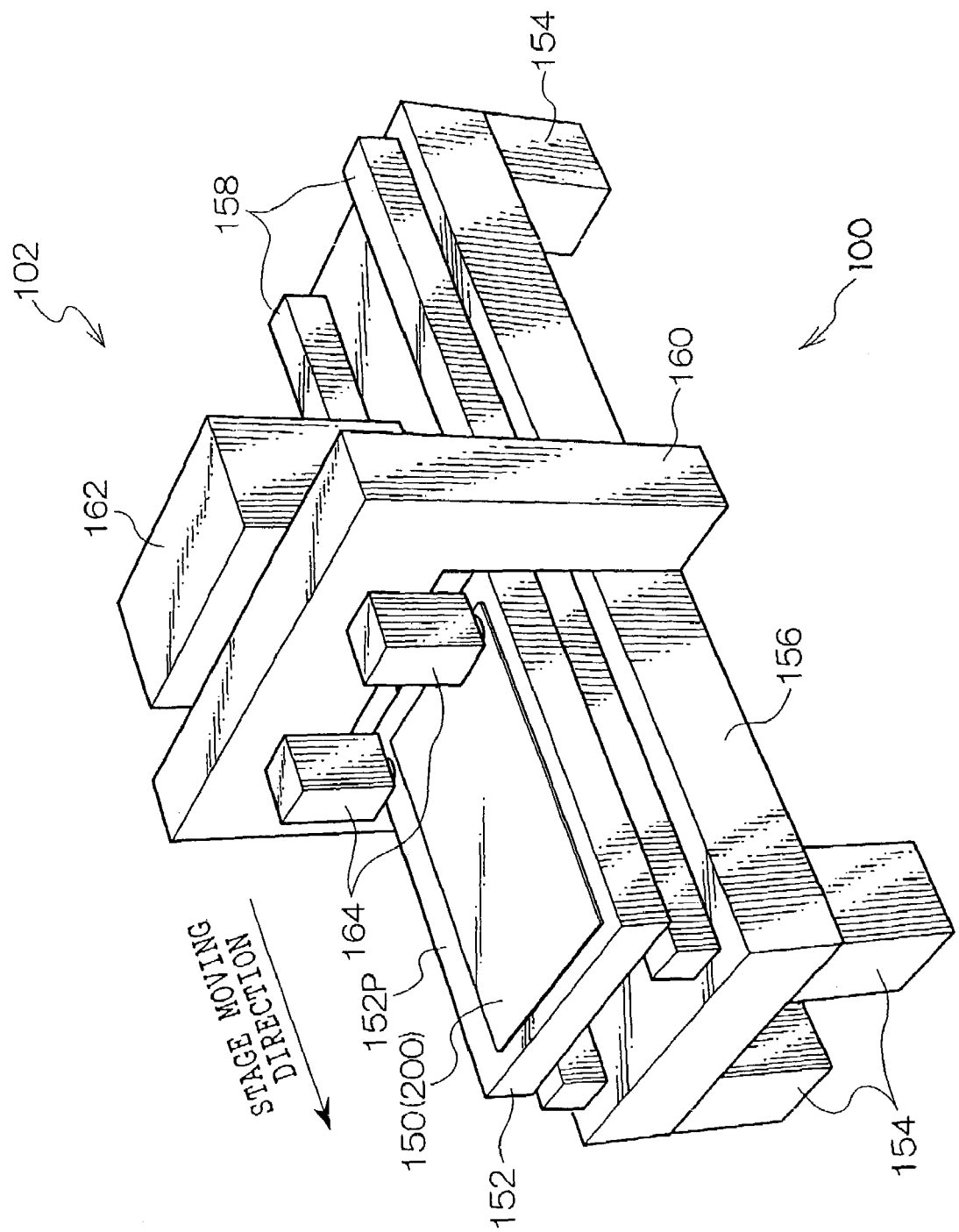
FIG. 1 is a perspective view showing the exterior of an exposure apparatus relating to a first embodiment of the present invention.

As shown in FIG. 1, an exposure apparatus 100 relating to a first embodiment of the present invention is provided with a flat board-form stage 152, which adsorbs and retains an optical wiring substrate (optical wiring substrate material) 200 at a surface thereof. At the optical wiring substrate 200, a sheet-form photosensitive material (a photoresist) 150 is layer-formed on an optical waveguide material. Two guides 158, which extend in a stage movement direction (the direction of arrow in the drawing), are provided at an upper face of a thick board-form equipment pedestal 156, which is supported at four leg portions 154. The stage 152 is disposed such that a longitudinal direction thereof is oriented in the stage movement direction, and is supported by the guides 158 so as to be reciprocatingly movable. In this exposure apparatus 100, an unillustrated driving apparatus is provided for driving the stage 152 along the guides 158.

At a central portion of the equipment pedestal 156, a gate 160, which is formed in an 'n' shape is disposed so as to straddle a movement path of the stage 152. Respective end portions of the gate 160 are fixed at two side faces of the equipment pedestal 156. Sandwiching the gate 160, a scanner 162 is provided at one side, and a plurality (for example, two) of detection sensors 164 are provided at the other side. The detection sensors 164 detect a leading end and a trailing end of the optical wiring substrate 200. The scanner 162 and the detection sensors 164 are respectively mounted at the gate 160, and are fixedly disposed upward of the movement path of the stage 152. The scanner 162 and detection sensors 164 are connected to an unillustrated controller which controls the scanner 162 and detection sensors 164.

Figure 3A:
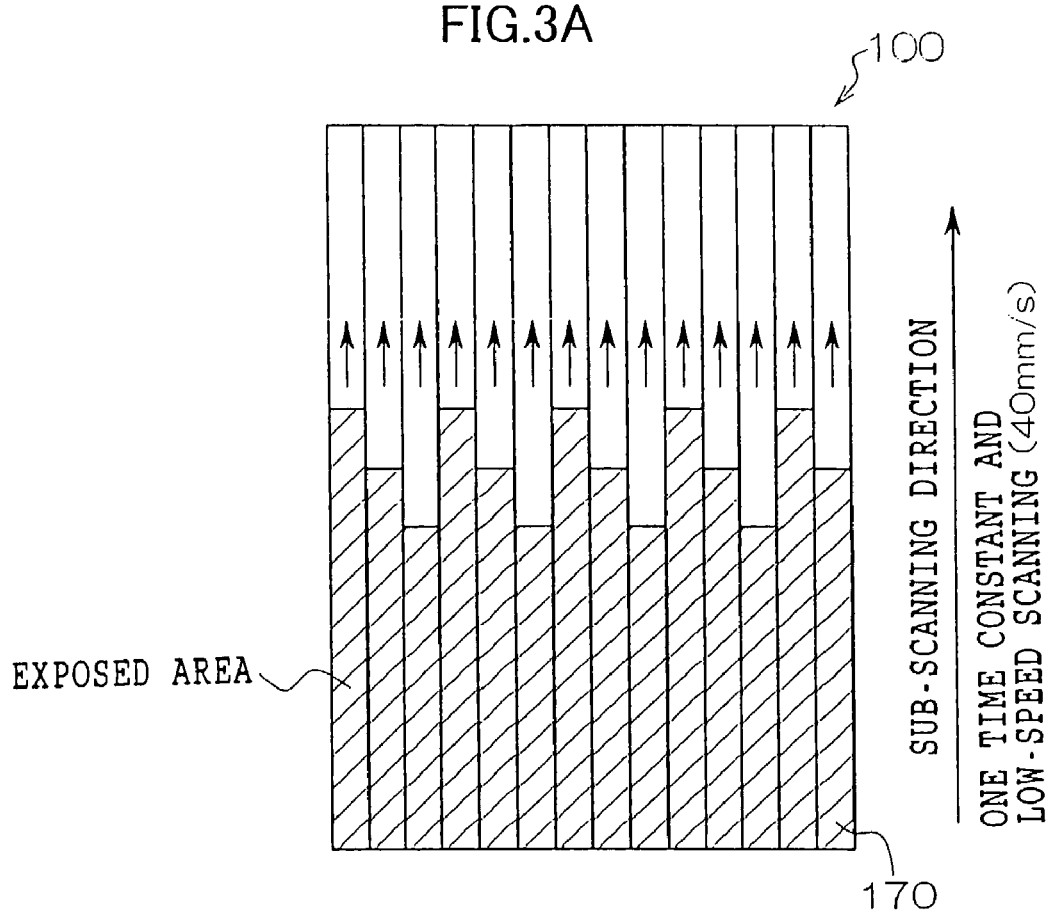
FIG. 3A is a plan view showing exposed regions formed at a photosensitive material.
Figure 3B:
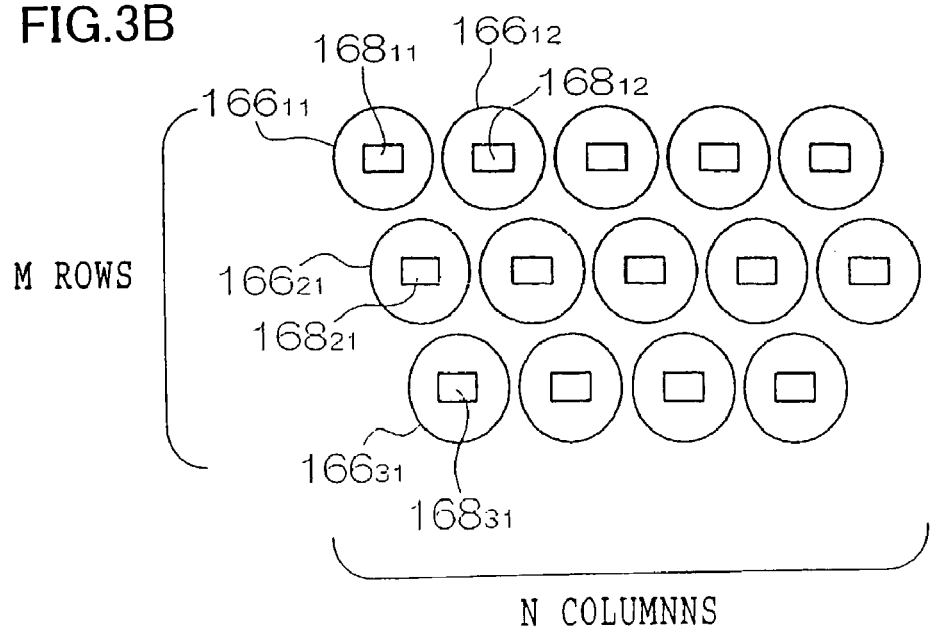
FIG. 3B is a view showing an arrangement of exposure areas due to respective exposure heads.

As shown in FIGS. 2 and 3B, the scanner 162 is equipped with a plurality (for example, fourteen) of exposure heads 166, which are arranged substantially in a matrix pattern with m rows and n columns (for example, three rows and five columns). In this example, in consideration of width of the photosensitive material 150 (the optical wiring substrate 200), four of the exposure heads 166 are provided in the third row. Note that when an individual exposure head, which is arranged in the m-th row and the n-th column is to be referred to, that exposure head is denoted as exposure head $166_{mn}$.

Exposure areas 168 exposed by the exposure heads 166 have rectangular shapes with short sides thereof in a sub-scanning direction. Consequently, in accordance with movement of the stage 152, band-form exposed regions 170 are formed on the photosensitive material 150 at the respective exposure heads 166. Note that when an exposure area exposed by an individual exposure head, which is arranged in the m-th row and the n-th column, is to be referred to, that exposure area is denoted as exposure area $168_{mn}$.

As shown in FIGS. 3A and 3B, in each row, the respective exposure heads, which are arranged in a linear arrangement, are disposed to be offset by a predetermined interval in a row arrangement direction (which interval is an integer multiple (two in the present embodiment) of the long dimension of the exposure areas), such that the band-form exposed regions 170 will be lined up without gaps therebetween in a direction intersecting the sub-scanning direction. Thus, a portion that cannot be exposed between the exposure area $168_{11}$ and the exposure area $168_{12}$ of the first row can be exposed by the exposure area $168_{21}$ of the second row and the exposure area $168_{31}$ of the third row.

Figure 4:
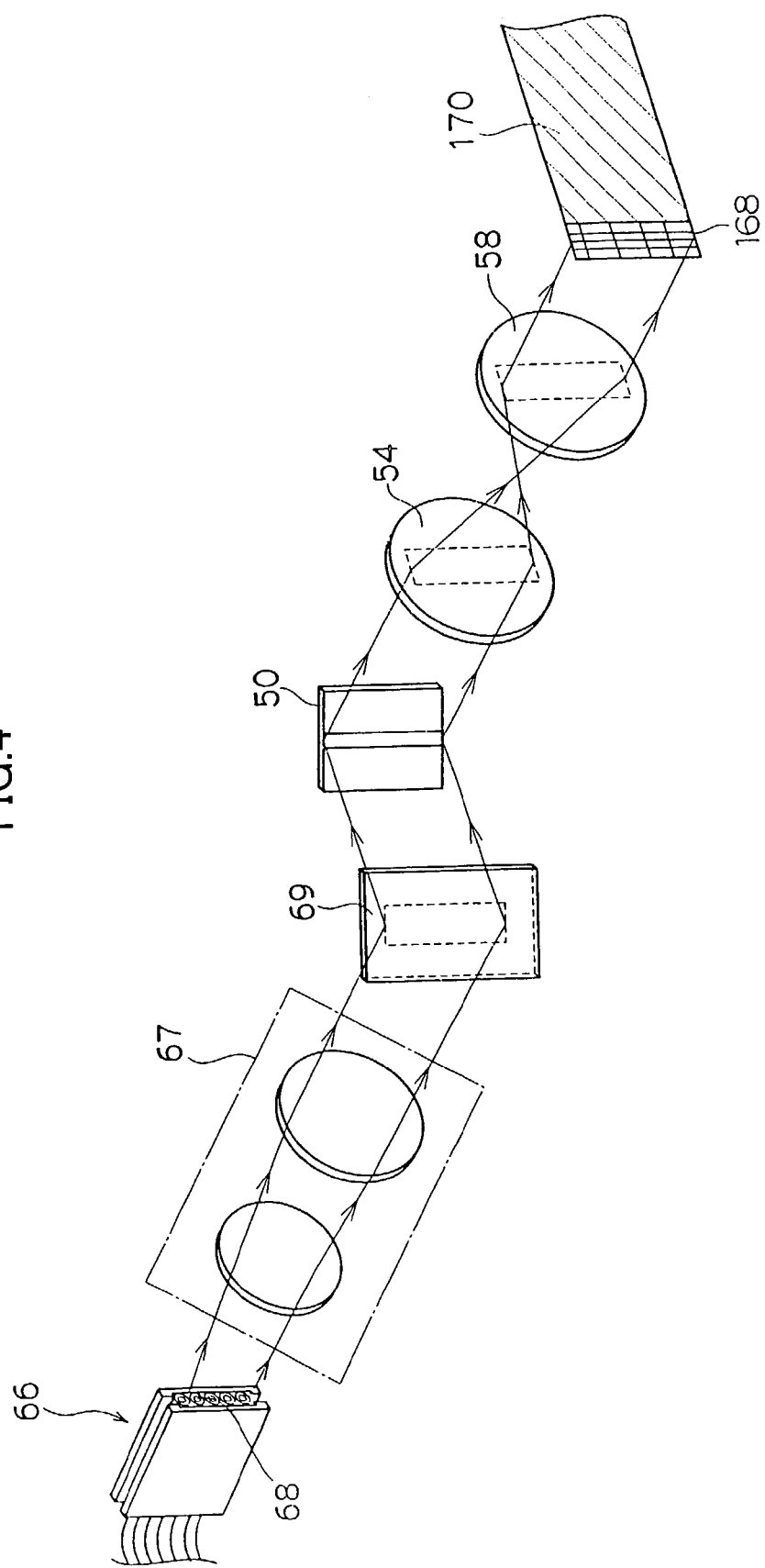
FIG. 4 is a perspective view showing general structure of an exposure head of the exposure apparatus relating to the first embodiment of the present invention.
Figure 5A:
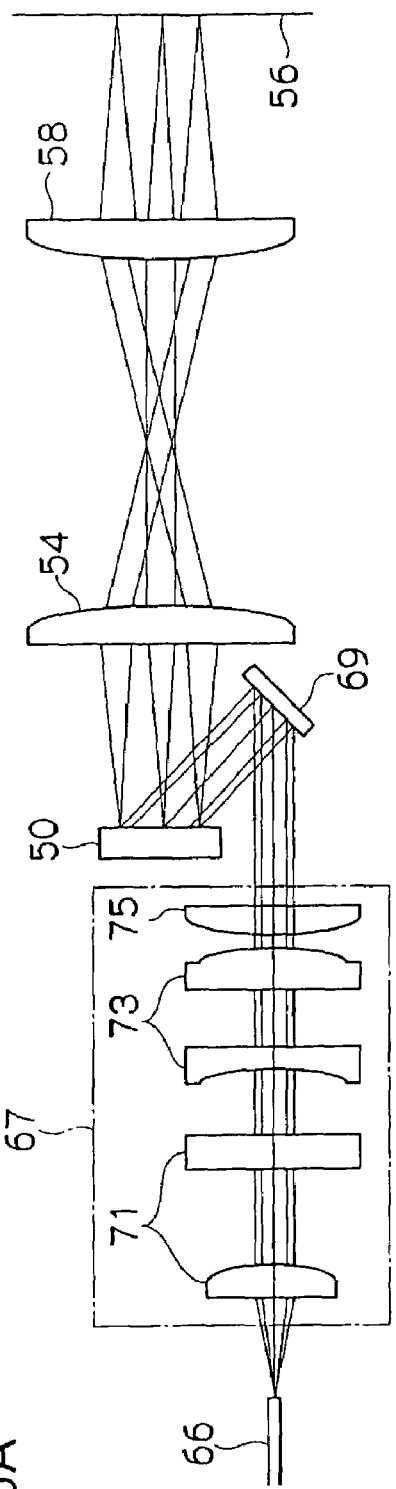
FIG. 5A is a sectional view, cut in a sub-scanning direction along an optical axis, showing structure of the exposure head shown in FIG. 4.
Figure 5B:
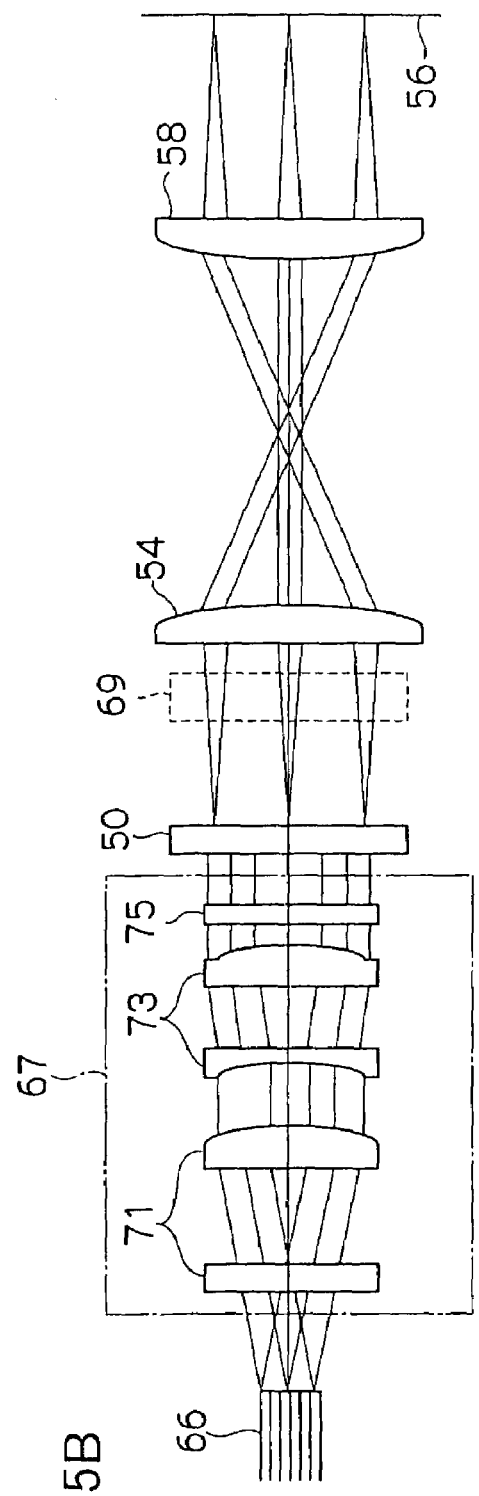
FIG. 5B is a side view showing structure of the exposure head shown in FIG. 4.

As shown in FIGS. 4, 5A and 5B, at each of the exposure areas $166_{11}$ to $166_{mn}$, a digital micromirror device (DMD) 50 is provided to serve as a spatial modulation element for modulating an incident light beam at each of pixels in accordance with image data. The DMD 50 is connected with an unillustrated controller, which is provided with a data processing section and a mirror driving control section. At the data processing section of this controller, on the basis of inputted image data, driving signals are generated for driving control of each micromirror in a region of the DMD 50 at the corresponding exposure head 166, which region is to be controlled. The regions which are to be controlled are described later. The mirror driving control section controls the angle of a reflection surface of each micromirror of the DMD 50 at the corresponding exposure head 166, on the basis of the control signals generated at the image data processing section. Control of the angles of the reflection faces is described later.

At a light incidence side of the DMD 50, a fiber array light source 66, a lens system 67 and a mirror 69 are disposed in this order. The fiber array light source 66 is equipped with a laser emission section in which emission end portions (light emission points) of optical fibers are arranged in a row along a direction corresponding to the direction of the long sides of the exposure area 168. The lens system 67 corrects laser light that is emitted from the fiber array light source 66, and focuses the light on the DMD. The mirror 69 reflects the laser light that has been transmitted through the lens system 67 toward the DMD 50.

The lens system 67 is structured with a single pair of combination lenses 71, which make the laser light that has been emitted from the fiber array light source 66 parallel, a single pair of combination lenses 73, which corrects the laser light that has been made parallel such that a light amount distribution is uniform, and a condensing lens 75 which focuses the laser light whose light amount distribution has been corrected on the DMD. The combination lenses 73 have the functions of, in the direction of arrangement of the laser emission ends, broadening portions of light flux that are close to an optical axis of the lenses and narrowing portions of the light flux that are distant from the optical axis, and in a direction intersecting this direction of arrangement, transmitting the light unaltered. Thus, the laser light is corrected such that the light amount distribution is uniform.

Lens systems 54 and 58 are disposed at a light reflection side of the DMD 50. The lens systems 54 and 58 focus the laser light that has been reflected at the DMD 50 on a scanning surface (a surface that is to be exposed) 56 of the photosensitive material 150. The lens systems 54 and 58 are disposed such that the DMD 50 and the surface to be exposed 56 have a conjugative relationship.

Figure 6:
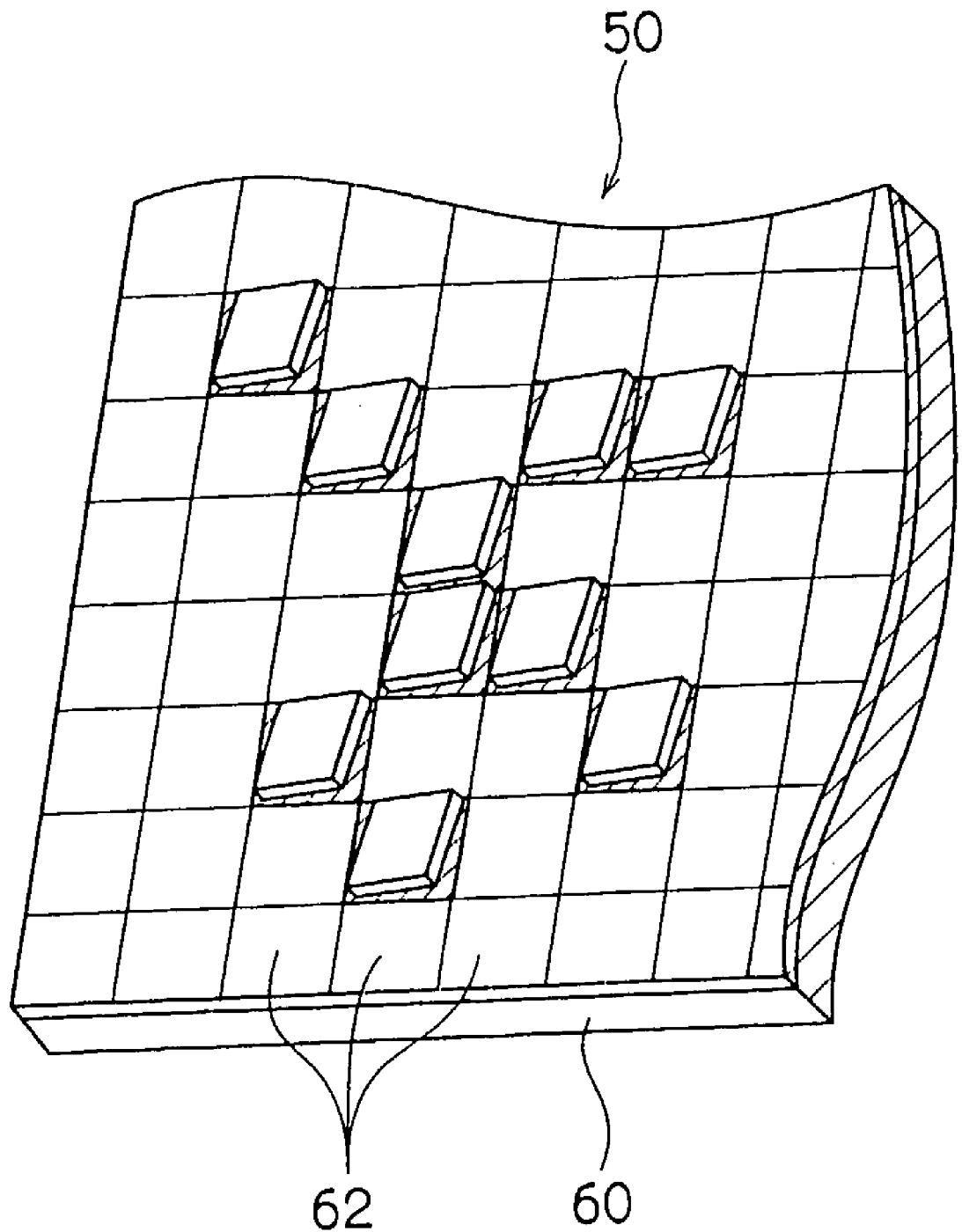
FIG. 6 is a partial enlarged view showing structure of a digital micromirror device (DMD).

As shown in FIG. 6, at the DMD 50, very small mirrors (micromirrors) 62, which are supported by support columns, are disposed on an SRAM cell (memory cell) 60. The DMD 50 is a mirror device which is structured with a large number (for example, 600 by 800) of these extremely small mirrors, which structure image elements (pixels), arranged in a checkerboard pattern. At each pixel, the micromirror 62 is provided so as to be supported at an uppermost portion of the support column. A material with high reflectivity, such as aluminium or the like, is applied by vapor deposition at the surface of the micromirror 62. Here, the reflectivity of the micromirror 62 is at least 90%. The SRAM cell 60, which is fabricated with CMOS silicon gates by a continuous semiconductor memory production line, is disposed directly under the micromirror 62, with the support column, which includes a hinge and a yoke, interposed therebetween. The whole of this structure is monolithic (integrated).

Figure 7A:
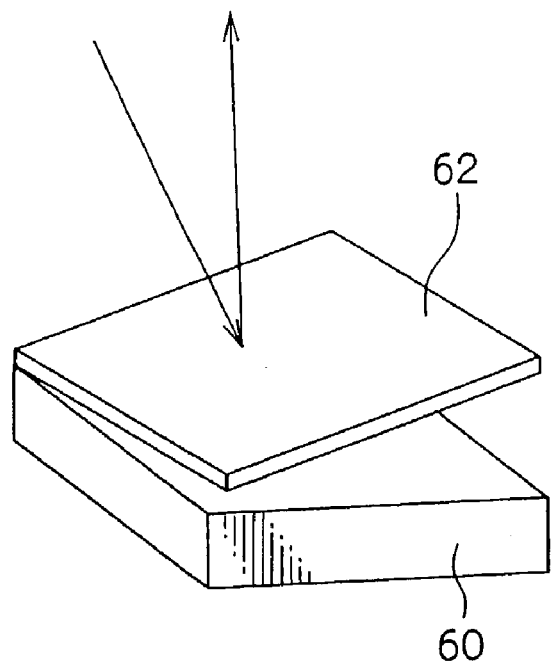
FIGS. 7A and 7B are explanatory views for explaining operation of the DMD.
Figure 7B:
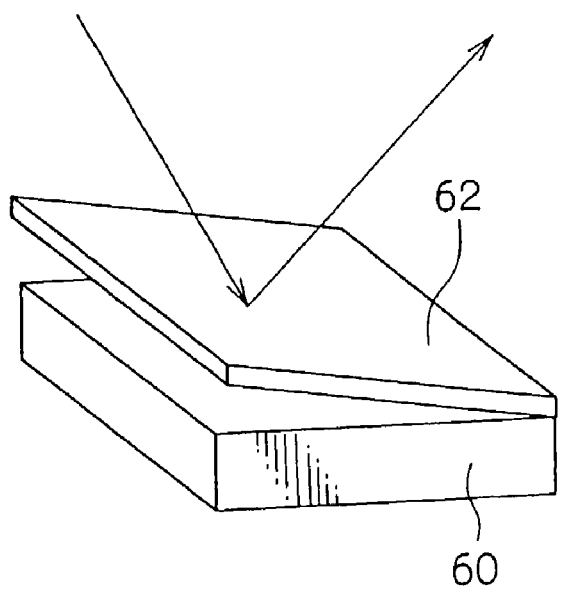

When digital signals are written to the SRAM cell 60 of the DMD 50, the micromirrors 62 supported at the support columns are inclined, about a diagonal, within a range of $\pm\alpha°$ (for example, $\pm10°$), relative to the side of the support at which the DMD 50 is disposed. FIG. 7A shows a state in which the micromirror 62 is inclined at $+\alpha°$, which is an 'ON' state, and FIG. 7B shows a state in which the micromirror 62 is inclined at $-\alpha°$, which is an 'OFF' state. Accordingly, as a result of control of the inclinations of the micromirrors 62 at the pixels of the DMD 50 in accordance with image signals, as shown in FIG. 6, light that is incident at the DMD 50 is reflected in directions of inclination of the respective micromirrors 62.

FIG. 6 shows a portion of the DMD 50 enlarged, and shows an example of a state in which the micromirrors 62 are controlled to $+\alpha°$ and $-\alpha°$. The ON-OFF control of the respective micromirrors 62 is carried out by the unillustrated controller connected to the DMD 50. A light-absorbing body (which is not shown) is disposed in the direction in which light beams are reflected by the micromirrors 62 that are in the OFF state.

Figure 8B:
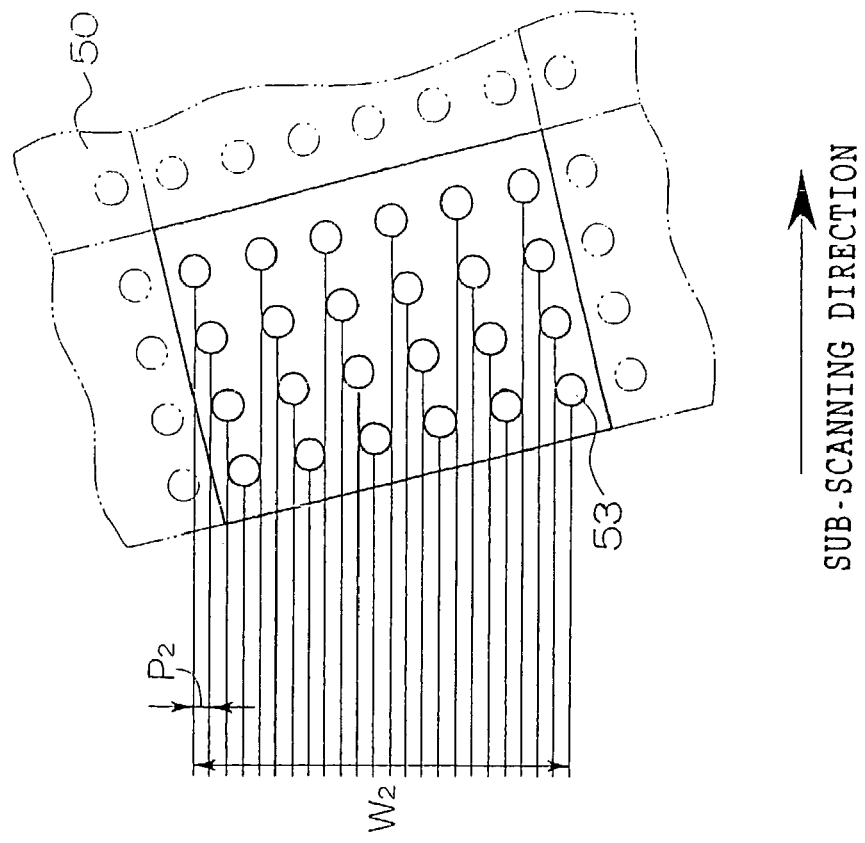
FIG. 8B is a plan view showing positions of exposure beams and scanning lines in a case in which the DMD is disposed at an angle.
Figure 8A:
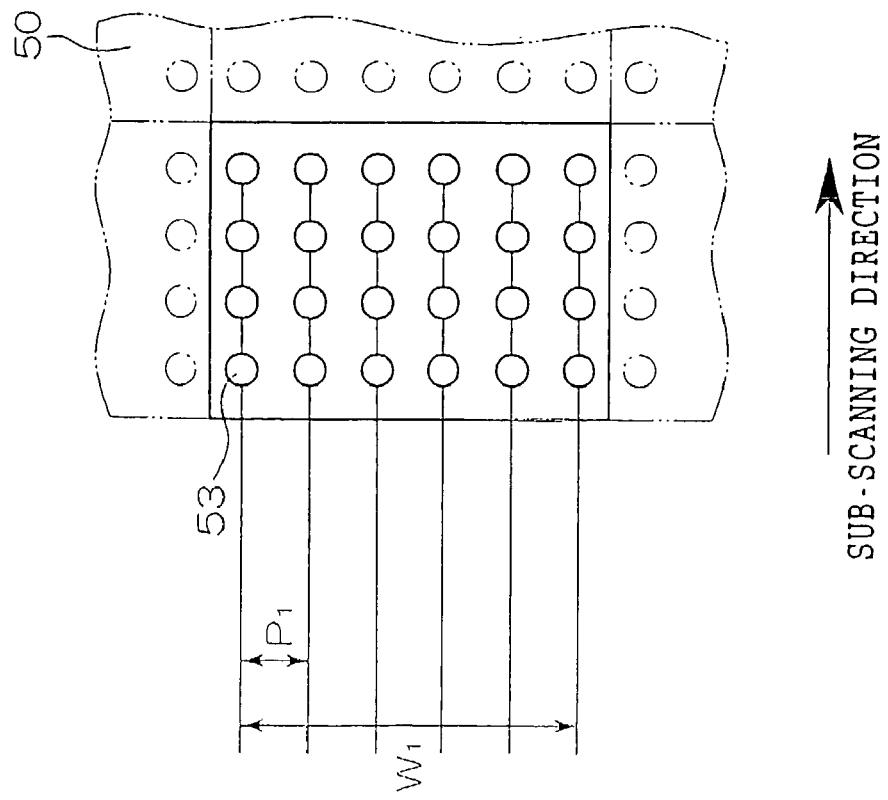
FIG. 8A is a plan view showing positions of exposure beams and scanning lines in a case in which the DMD is not disposed at an angle.

It is preferable if the DMD 50 is disposed to be slightly inclined, such that a short side thereof forms a predetermined angle θ (for example, 1° to 5°) with the sub-scanning direction. FIG. 8A shows scanning tracks of reflected light images (exposure beams) 53 formed by the micromirrors in a case in which the DMD 50 is not inclined. FIG. 8B shows scanning tracks of the exposure beams 53 in the case in which the DMD 50 is inclined.

At the DMD 50, a large number (for example, 800) of micromirrors are arranged in a long side direction to form a micromirror row, and a large number (for example, 600) of these micromirror rows are arranged in a short side direction. As shown in FIG. 8B, when the DMD 50 is inclined, a pitch $P_2$ of scanning paths (scanning lines) of the exposure beams 53 from the micromirrors is tighter than a pitch $P_1$ of scanning lines in the case in which the DMD 50 is not inclined. Thus, resolution can be greatly improved. However, because the angle of inclination of the DMD 50 is very small, a scanning width $W_2$ in the case in which the DMD 50 is inclined is substantially the same as a scanning width $W_1$ in the case in which the DMD 50 is not inclined.

The same scanning line will be superposingly exposed by different micromirror rows (multiple exposure). As a consequence of this multiple exposure, exposure positions can be controlled in very fine amounts, and high accuracy exposure can be implemented. Further, by control in very fine amounts of exposure positions at boundary lines between the plurality of exposure heads arranged in a main scanning direction, joins without steps can be formed. Further yet, by using the multiple exposure function described above and causing sets of two or more pixels to overlap for exposure, it is possible to control exposure light amounts in pixel units and/or scanning line units. This multiple exposure functions for ovelappingly exposing two or more pixels includes: a function for superposing and exposing a plurality of pixels at the same position (superposedly exposing on the same scanning line); a function for superposing and exposing a plurality of pixels not at the same position but with centers thereof being mutually offset; and a function which combines the above functions.

Instead of inclining the DMD 50, the micromirrors may be disposed in a staggered pattern in which the micromirror rows are shifted by predetermined intervals in the direction intersecting the sub-scanning direction, and the same effects can be obtained.

As shown in FIG. 9A, the fiber array light source 66 is equipped with a plurality (for example, six) of laser modules 64. At each of the laser modules 64, one end of a multi-mode optical fiber 30 is connected. At the other end of the multi-mode optical fiber 30, an optical fiber 31, whose core diameter is the same as that of the multi-mode optical fiber 30 and whose cladding diameter is smaller than that of the multi-mode optical fiber 30, is connected. As shown in FIG. 9C, emission end portions (light emission points) of the multi-mode optical fibers 31 are arranged in a single row along the main scanning direction, which intersects the sub-scanning direction, to structure a laser emission portion 68. Note that the light emission points may be arranged in two rows along the main scanning direction, as shown in FIG. 9D.

As is shown in FIG. 9B, the emission end portions of the optical fibers 31 are inserted between a pair of support plates 65, which have flat faces, and fixed. Further, a transparent protective plate 63, of glass or the like, is disposed at the light emission side of the optical fibers 31 in order to protect end faces of the optical fibers 31. The protective plate 63 may be disposed to be closely contacted with the end faces of the optical fibers 31, or may be disposed such that the end faces of the optical fibers 31 are sealed. The emission end portions of the optical fibers 31 have high optical density, tend to attract dust, and are susceptible to deterioration. However, by disposing the protective plate 63, the adherence of dust to the end faces can be prevented and deterioration can be slowed.

In this example, because the emission ends of the optical fibers 31 with small cladding diameters are arranged in a single row without gaps therebetween, some of the multi-mode optical fibers 30, which are each between two of the multi-mode optical fibers 30 that are adjacent at the section with large cladding diameters, are piled up on the adjacent two of the multi-mode optical fibers 30. The emission end of the optical fiber 31 that is joined to the multi-mode optical fiber 30 that is piled up is arranged so as to be sandwiched between the two emission ends of the optical fibers 31 that are joined to the two multi-mode optical fibers 30 that are adjacent at the section with large cladding diameters.

Figure 10:
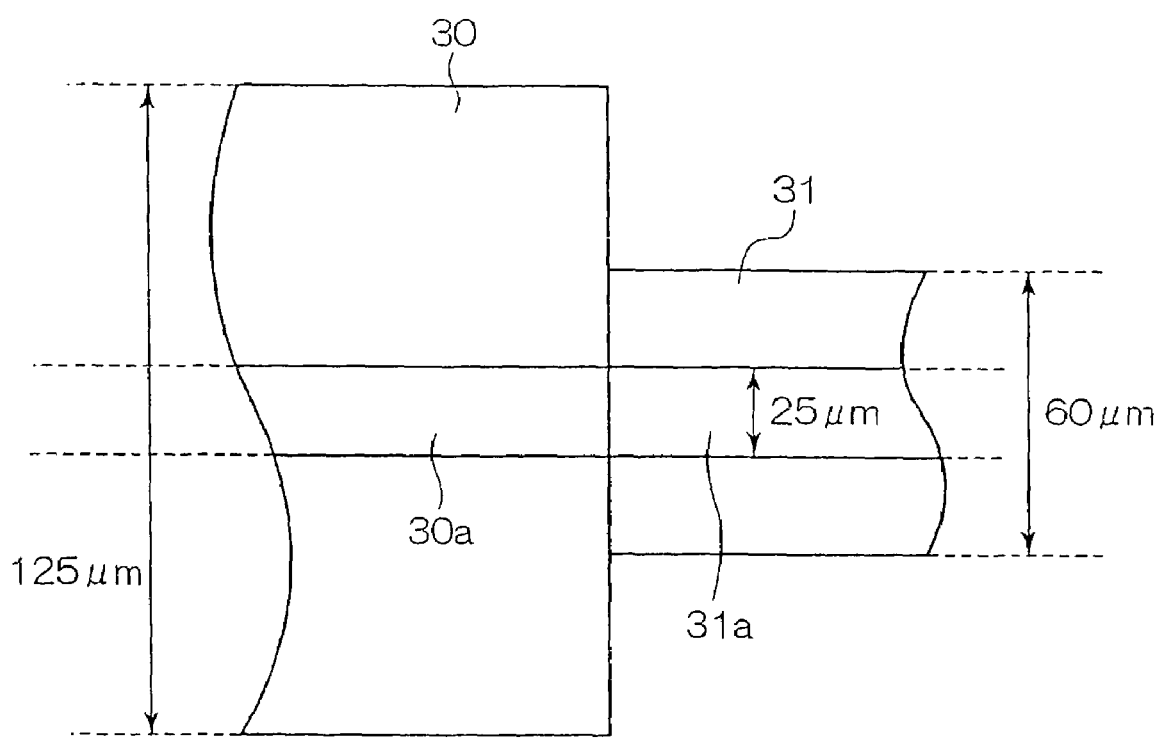
FIG. 10 is a view showing structure of a multi-mode optical fiber.

These optical fibers can be obtained by, for example, as shown in FIG. 10, coaxially joining 1 to 30 cm lengths of the optical fibers 31 with small diameters to distal end portions, at the laser light emission side, of the multi-mode optical fibers 30 with large cladding diameters. The two types of optical fiber are joined by fusing incidence end faces of the optical fibers 31 to emission end faces of the multi-mode optical fibers 30 such that central axes of the pairs of fibers coincide. As described above, a diameter of a core 31a of the optical fiber 31 has the same magnitude as a diameter of a core 30a of the multi-mode optical fiber 30.

A short-strip optical fiber, at which the optical fiber whose cladding diameter is smaller is fused to an optical fiber whose length is short and whose cladding diameter is larger, may be joined at the emission end of the multi-mode optical fiber 30 via a ferrule, an optical connector or the like. Because the joining is carried out using the connector or the like so as to be detachable, replacement of a distal end portion, in a case in which the optical fiber whose cladding diameter is smaller has been damaged, is simple, and costs required for maintenance of the exposure head can be reduced. Herebelow, the optical fiber 31 may on occasions be referred to as an exposure end portion of the multi-mode optical fiber 30.

As the multi-mode optical fiber 30 and the multi-mode optical fiber 31, any of step index-type optical fibers, graded index-type optical fibers and multiplex-type optical fibers can be used. For example, a step index-type optical fiber produced by Mitsubishi Cable Industries, Ltd. can be used. In the present embodiment, the multi-mode optical fiber 30 and the optical fiber 31 are step index-type optical fibers. The multi-mode optical fiber 30 has cladding diameter=125 µm, core diameter=25 µm, NA=0.2, and transmittance of an end face coating=99.5% or more. The optical fiber 31 has cladding diameter=60 µm, core diameter=25 µm, and NA=0.2.

Figure 11:
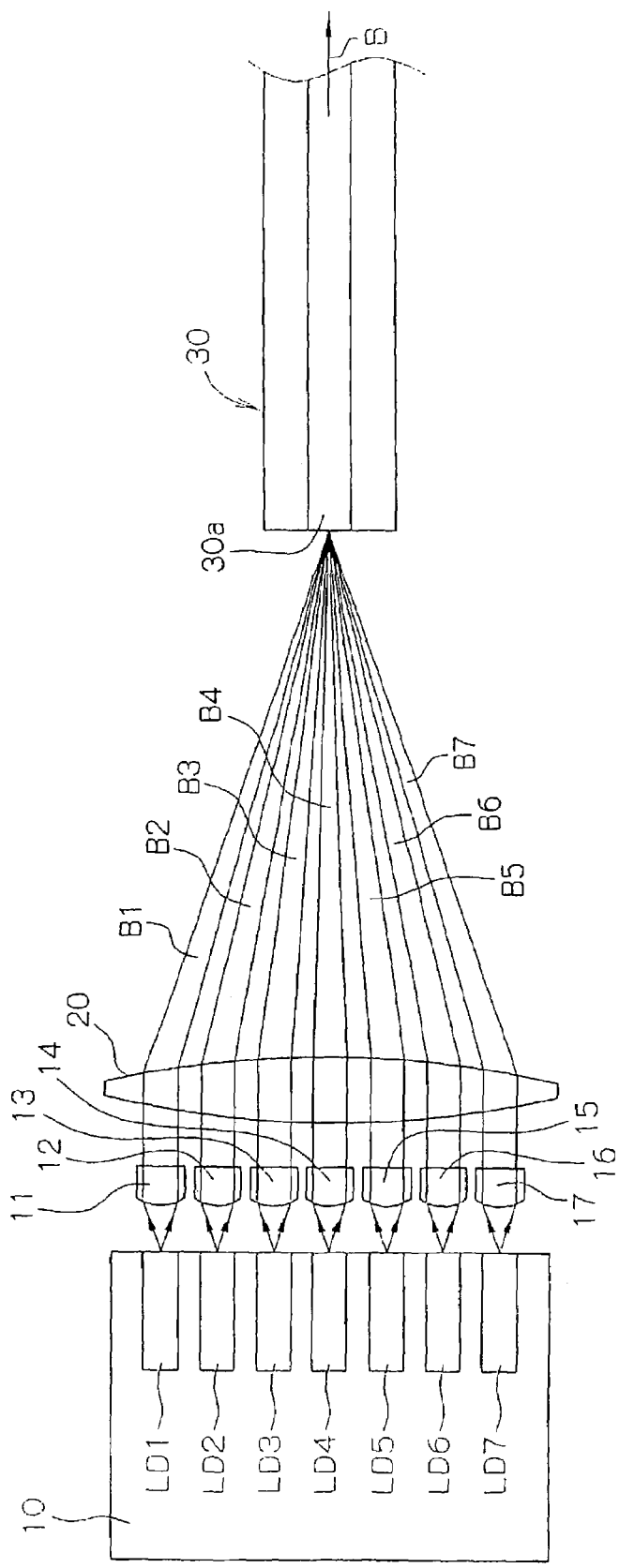
FIG. 11 is a plan view showing structure of a multiplex laser light source.

The laser module 64 is structured by a multiplexed laser light source (fiber light source) shown in FIG. 11. This multiplex laser light source is structured with a plurality (for example, seven) of chip-form lateral multi-mode or single-mode UV-type semiconductor lasers LD1, LD2, LD3, LD4, LD5, LD6 and LD7, collimator lenses 11, 12, 13, 14, 15, 16 and 17, a single condensing lens 20, and one of the multi-mode optical fibers 30. The UV-type semiconductor lasers LD1 to LD7 are fixedly arranged on a heat block 10. The collimator lenses 11 to 17 are provided in correspondence with the UV-type semiconductor lasers LD1 to LD7, respectively. The UV-type semiconductor lasers LD1 to LD7 all have the same oscillation wavelength and maximum output. Note that the number of semiconductor lasers is not limited to seven.

Figure 12:
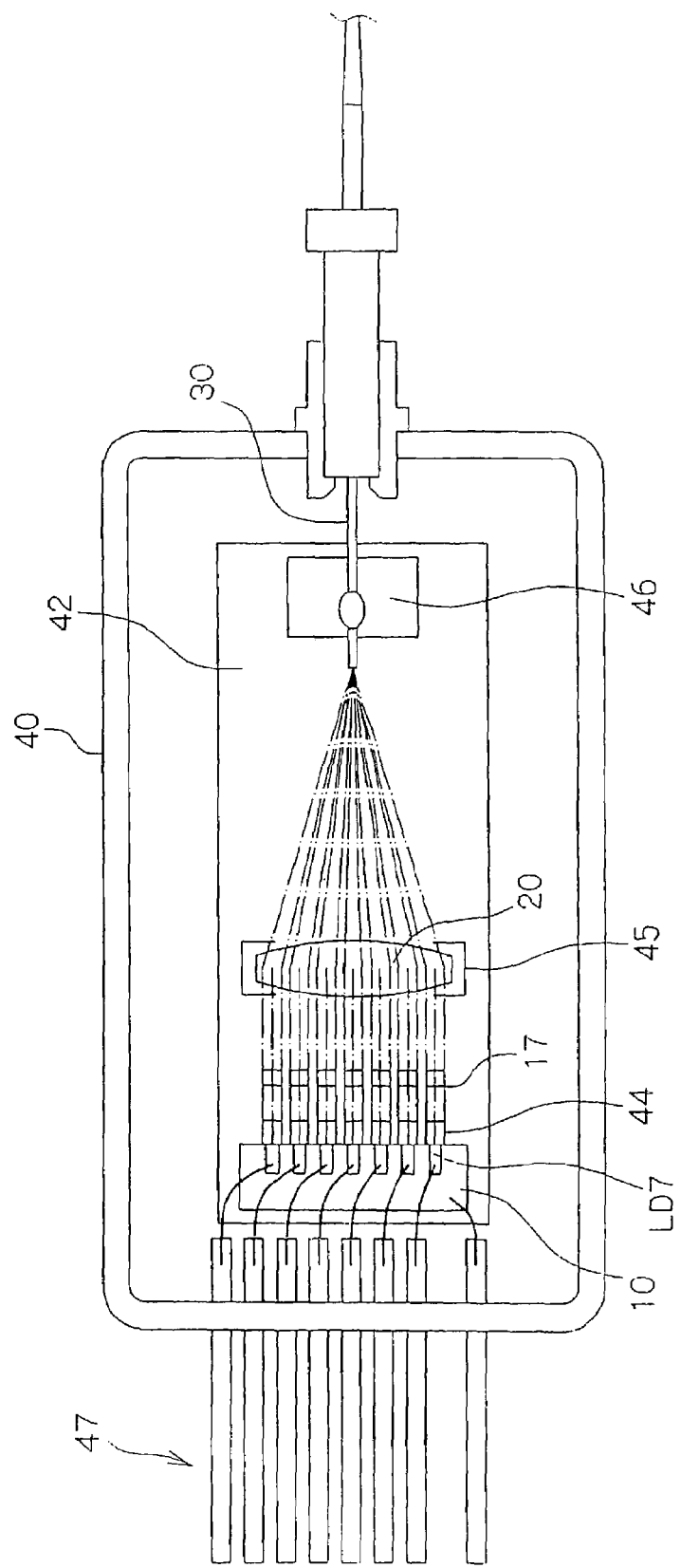
FIG. 12 is a plan view showing structure of a laser module.
Figure 13:
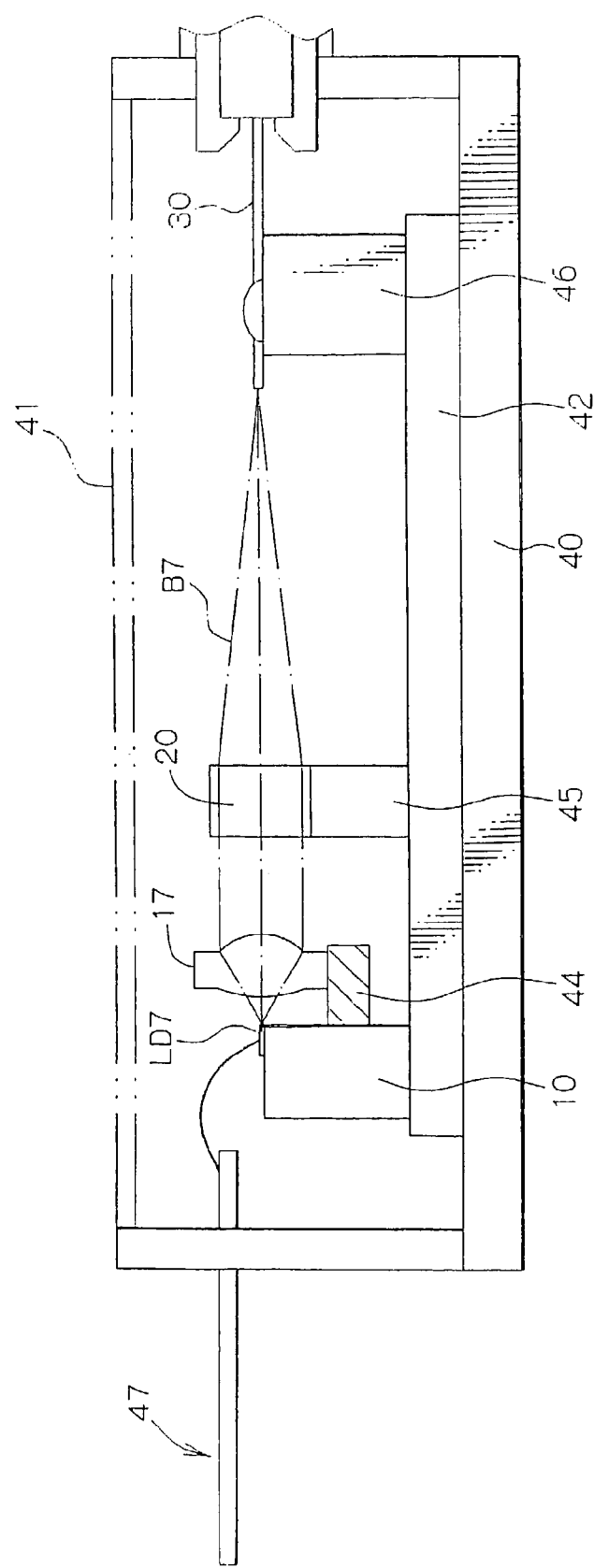
FIG. 13 is a side view showing structure of the laser module shown in FIG. 12.

As shown in FIGS. 12 and 13, the above-described multiplex laser light source, together with other optical elements, is accommodated in a box-like package 40, which opens upward. The package 40 is provided with a package lid 41 prepared so as to close this opening of the package 40. After an air removal treatment, sealed gas is introduced and the opening of the package 40 is closed by the package lid 41. Thus, the above-described multiplex laser light source is hermetically sealed in a closed space (sealed space) formed by the package 40 and the package lid 41.

A baseplate 42 is fixed at a lower face of the package 40. The heat block 10, a condensing lens holder 45 and a fiber holder 46 are attached at an upper face of the baseplate 42. The condensing lens holder 45 holds the condensing lens 20. The fiber holder 46 holds an incidence end portion of the multi-mode optical fiber 30. An opening is formed in a wall face of the package 40. The emission end portion of the multi-mode optical fiber 30 is passed through this opening and led out to outside the package.

A collimator lens holder 44 is attached at a side face of the heat block 10, and holds the collimator lenses 11 to 17. Openings are formed in a lateral wall face of the package 40. Wiring 47, which supplies driving current to the UV-type semiconductor lasers LD1 to LD7, is passed through these openings and led out to outside the package.

Note that in FIG. 12, in order to alleviate complexity of the drawing, of the plurality of UV-type semiconductor lasers, only the UV-type semiconductor laser LD7 is marked with a reference numeral, and of the plurality of collimator lenses, only the collimator lens 17 is marked with a reference numeral.

Figure 14:
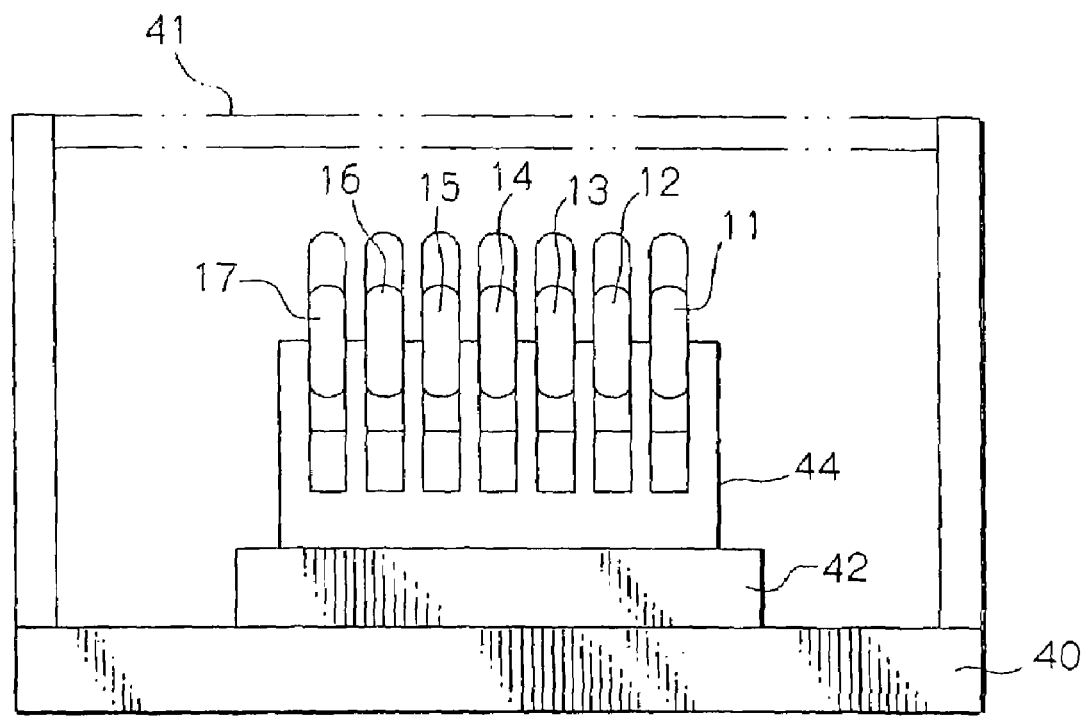
FIG. 14 is a partial side view showing structure of the laser module shown in FIG. 12.

FIG. 14 shows front face shapes of attachment portions of the collimator lenses 11 to 17. Each of the collimator lenses 11 to 17 has a long, narrow, cut-down shape with parallel flat faces defining a region that includes an optical axis of a circular-form lens which is provided with an aspherical surface. The collimator lenses with this long, narrow shape can be formed, for example, by molding-formation of resin or optical glass. The collimator lenses 11 to 17 are closely disposed in a direction of arrangement of light emission points of the UV-type semiconductor lasers LD1 to LD7 (the left-right direction in FIG. 14) such that the length directions of the collimator lenses 11 to 17 cross the direction of arrangement of the light emission points.

As the UV-type semiconductor lasers LD 1 to LD7, lasers may be employed which are provided with an active layer with a light emission width of 2 µm, and which respectively emit laser beams B1 to B7 in forms which widen at angles of, for example, 10° and 30° with respect, respectively, to a direction parallel to the active layers and a direction perpendicular to the active layers. These UV-type semiconductor lasers LD1 to LD7 are disposed such that the light emission points are lined up in a single row in the direction parallel to the active layers.

Accordingly, the laser beams B1 to B7 emitted from the light emission points are incident, respectively, on the collimator lenses 11 to 17 having the long, narrow forms described above, in states in which the direction for which the spreading angle of the beam is greater coincides with the length direction of the lens and the direction in which the spreading angle is smaller coincides with a width direction (a direction intersecting the length direction). Specifically, the width of each of the collimator lenses 11 to 17 is 1.1 mm and the length thereof is 4.6 mm, and the laser beams B1 to B7 incident thereat have beam diameters in the horizontal direction and the vertical direction of 0.9 mm and 2.6 mm, respectively. Further, each of the collimator lenses 11 to 17 has a focusing length f1=3 mm, NA=0.6 and lens arrangement pitch=1.25 mm.

The condensing lens 20 is cut away in a long, narrow shape with parallel flat faces defining a region that includes an optical axis of a circular-form lens which is provided with an aspherical surface, and is formed in a shape which is long in the direction of arrangement of the collimator lenses 11 to 17 (i.e., the horizontal direction) and short in a direction perpendicular thereto. The condensing lens 20 has a focusing distance f2=23 mm and NA=0.2. The condensing lens 20 is formed by, for example, molding-formation of resin or optical glass.

Operation of the Exposure Apparatus

Next, operation of the exposure apparatus described above will be explained.

In the exposure heads 166 of the scanner 162, the respective laser beams B1, B2, B3, B4, B5, B6 and B7, which are emitted in divergent forms from the respective UV-type semiconductor lasers LD1 to LD7 that structure the multiplex laser light source of the fiber array light source 66, are converted to parallel light by the corresponding collimator lenses 11 to 17. The laser beams B1 to B7 that have been collimated are focused by the condensing lens 20, and converge at the incidence end face of the core 30a of the multi-mode optical fiber 30.

In the present example, a condensing optical system is structured by the collimator lenses 11 to 17 and the condensing lens 20, and a multiplexing optical system is structured by the condensing optical system and the multi-mode optical fiber 30. Thus, the laser beams B1 to B7 focused by the condensing lens 20 as described above enter the core 30a of the multi-mode optical fiber 30, are propagated in the optical fiber, multiplexed to a single laser beam B, coupled at the emission end portion of the multi-mode optical fiber 30, and emitted from the optical fiber 31.

In each laser module, a coupling efficiency of the laser beams B1 to B7 into the multi-mode optical fiber 30 is 0.85. Therefore, in a case in which the respective outputs of the UV-type semiconductor lasers LD1 to LD7 are 30 mW, the multiplexed laser beam B can be obtained with an output of 180 mW (=30 mW×0.85×7) from each of the optical fibers 31 arranged in the array pattern. Accordingly, output of the laser emission portion 68 in which six of the optical fibers 31 are arranged in the array pattern is approximately 1 W (=180 mW×6).

At the laser emission portion 68 of the fiber array light source 66, high-luminance light emission points as described above are arranged in a single row along the main scanning direction. Because a conventional fiber light source, in which laser light from a single semiconductor laser is focused at a single optical fiber, would have low output, a desired output could not be obtained without arranging these conventional light sources in a large number of rows. However, because the multiplex laser light source employed in the present embodiment has high output, a desired output can be obtained with only a small number of rows, for example, one row.

For example, in a conventional fiber light source, in which semiconductor lasers are focused at optical fibers in a one-to-one relationship, lasers with outputs of around 30 mW (milliwatts) are commonly employed as the semiconductor lasers, and multi-mode optical fibers with core diameter 50 μm, cladding diameter 125 μm, and NA (aperture number) 0.2 are employed as the optical fibers. Therefore, if an output of around 1 W (watt) is to be obtained, forty-eight (8×6) multi-mode optical fibers must be bundled. Thus, from a light emission region with an area of 0.62 mm² (0.675 mm by 0.925 mm), luminance of this laser emission portion 68 is $1.6 \times 10^6$ W/m², and luminance from each optical fiber is $3.2 \times 10^6$ w/m².

In contrast, in the present embodiment, an output of approximately 1 W can be provided by six multi-mode optical fibers, as described above. Thus, from a light emission region of the laser emission portion 68 with an area of 0.0081 mm² (0.325 mm×0.025 mm), luminance of the laser emission portion 68 is $123 \times 10^6$ W/m². Thus, a luminance about eighty times higher than in the conventional case can be expected. Furthermore, the luminance from each optical fiber is $90 \times 10^6$ W/m². Thus, a luminance around twenty-eight times higher than in the conventional case can be expected.

Now, a difference in focusing depth between the conventional exposure head and the exposure head of the present embodiment will be described with reference to FIGS. 15A and 15B. A diameter in the sub-scanning direction of the light-emitting region of the bundle-form fiber light source of the conventional exposure head is 0.675 mm, whereas the diameter in the sub-scanning direction of the light-emitting region of the fiber array light source of the exposure head of the present embodiment is 0.025 mm. As shown in FIG. 15A, with the conventional exposure head, because the light-emitting region of a light source 1 (the bundle-form fiber light source) is large, the angle of convergence of light incident on a DMD 3 is large. Therefore, the angle of convergence of light incident on a scanning surface 5 is large. Consequently, the beam diameter is susceptible to broadening with respect to a condensing direction (displacement in a direction of focusing).

In contrast, as shown in FIG. 15B, with the exposure head of the present embodiment, the diameter in the sub-scanning direction of the light-emitting region of the fiber array light source 66 is smaller. Therefore, the angle of convergence of light that has passed through the lens system 67 and is incident on the DMD 50 is smaller. Consequently, the angle of convergence of light incident on the surface to be exposed 56 is smaller. That is, the focusing depth is longer. In this example, the diameter in the sub-scanning direction of the light-emitting region is about a thirtieth that in the conventional case, and a focusing depth substantially corresponding to the diffraction limit can be obtained. Accordingly, the present embodiment is excellent for exposure with very fine spots. In this example, the size of one pixel as projected on the exposure surface is 10 μm by 10 μm. Note that, although the DMDs are reflection-type spatial modulation elements, FIGS. 15A and 15B are expanded views, for the purpose of explaining optical relationships.

Image data corresponding to an exposure pattern is inputted at the unillustrated controller connected to the DMD 50, and is temporarily stored in a frame memory in the controller. This image data is data which represents a density of each pixel structuring an image with a binary value (whether or not a dot is to be recorded).

The stage 152, at which the optical wiring substrate 200 is set, is moved along the guides 158 at a constant speed by the unillustrated driving apparatus, from an upstream side of the gate 160 to a downstream side thereof. When the stage 152 is passing under the gate 160, and the leading end of the optical wiring substrate 200 has been detected by the detection sensors 164 attached at the gate 160, the image data stored in the frame memory is read out as a plurality of line portion units in sequence, and control signals for each of the exposure heads 166 are generated on the basis of the image data read from the data processing section. Hence, the micromirrors of the DMDs 50 at the respective exposure heads 166 are respectively switched on and off by the mirror driving control section on the basis of the control signals that have been generated.

When laser light is irradiated from the fiber array light source 66 to the DMD 50, if a micromirror of the DMD 50 is in the ON state, the reflected laser light is focused on the surface to be exposed 56 of the photosensitive material 150 by the lens systems 54 and 58. Thus, the laser light irradiated from the fiber array light source 66 is turned on or off at each pixel, and the photosensitive material 150 is exposed in a unit with a number of pixels substantially the same as the number of pixels employed at the DMD 50 (the exposure area 168). Further, as the photosensitive material 150 (the optical wiring substrate 200) is moved together with the stage 152 at the constant speed, the photosensitive material 150 is sub-scanned in a direction opposite to the stage movement direction by the scanner 162, and the strip-form exposed regions 170 are formed at the respective exposure heads 166.

Figure 16A:
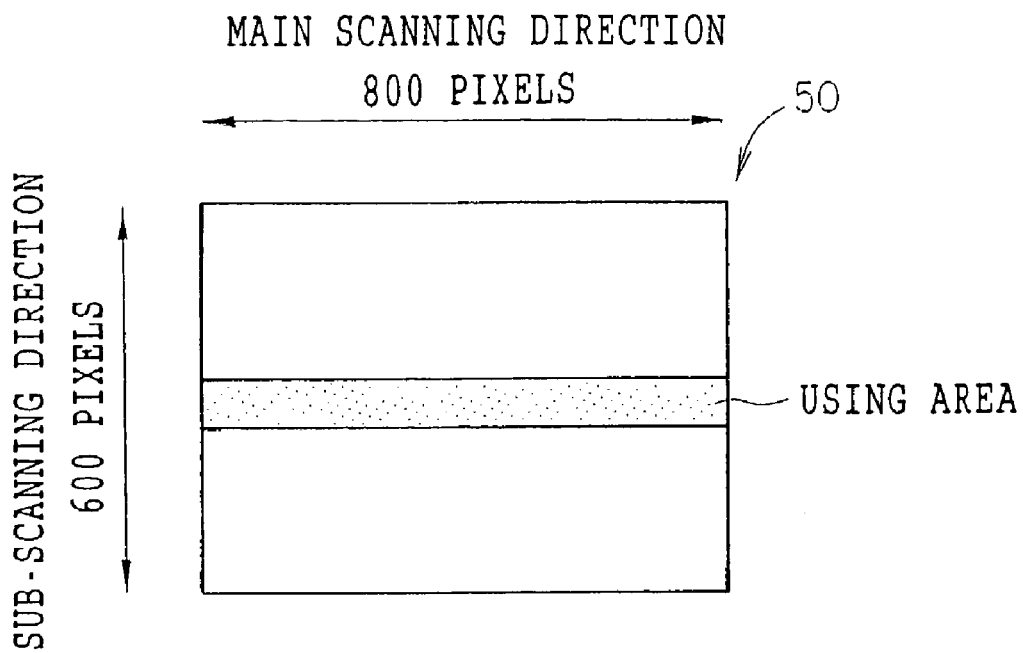
FIG. 16A is a view showing an example of an employed region of the DMD.
Figure 16B:
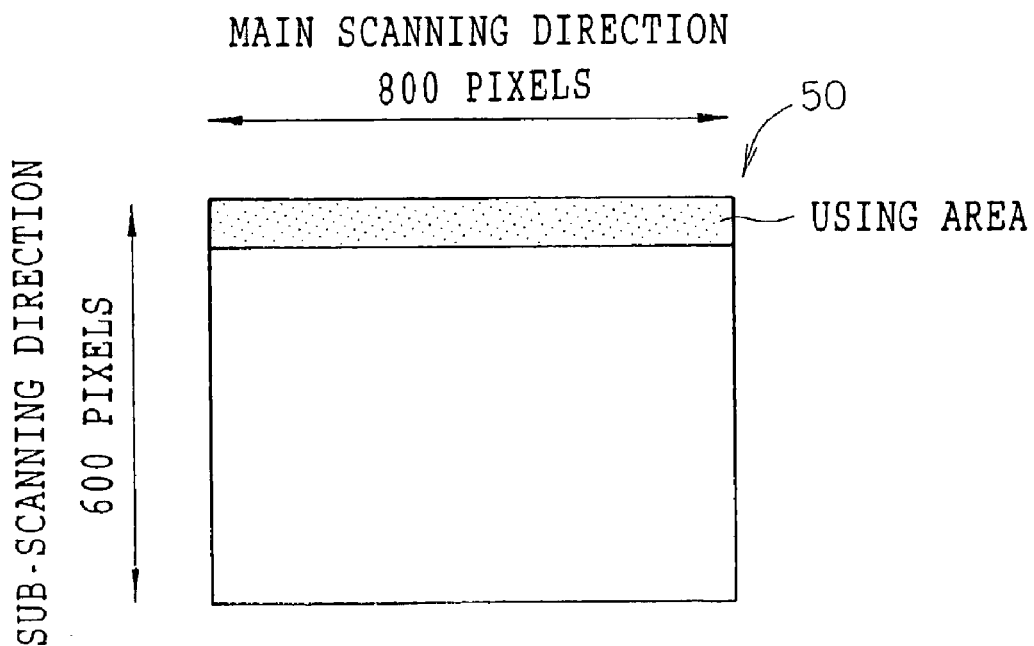
FIG. 16B is a view showing another example of an employed region of the DMD.

As shown in FIGS. 16A and 16B, at the DMD 50 of the present embodiment, 600 micromirror rows, in each of which 800 of the micromirrors are arranged in the main scanning direction, are arranged in the sub-scanning direction. In the present embodiment, control by the controller so as to drive only a portion of the micromirror rows (for example, 800 micromirrors by 100 rows) is possible.

Micromirror rows that are disposed at a central portion of the DMD 50 may be employed, as shown in FIG. 16A, and micromirror rows that are disposed at an end portion of the DMD 50 may be employed, as shown in FIG. 16B. Further, in a case in which defects have occurred at some of the micromirrors, the micromirror rows that are to be employed may be suitably changed in accordance with the situation, by employing micromirror rows in which defects have not occurred, or the like.

There is a limit to a data processing speed of the DMD 50, and a modulation rate for one line is determined in proportion to the number of pixels employed. Thus, the modulation rate for one line can be accelerated by employing only a portion of the micromirror rows. Further, in the case of an exposure technique in which the exposure head is continuously moved relative to the exposure surface, there is no need to employ all pixels in the sub-scanning direction.

For example, in a case in which only 300 of the 600 rows of micromirrors are employed, modulation for each line can be twice as fast as in a case in which all 600 lines are employed. Further, in a case in which only 200 of the 600 rows of micromirrors are employed, modulation for each line can be three times as fast as in the case of employing all 600 lines. Specifically, a region which is 500 mm in the sub-scanning direction can be exposed in 17 seconds. Furthermore, in a case in which only 100 lines are employed, modulation for one line can be done six times as quickly. That is, a region which is 500 mm long in the sub-scanning direction can be exposed in 9 seconds.

The number of micromirror rows that are employed, that is, the number of micromirrors arranged in the sub-scanning direction, is preferably at least 10 and at most 200, and is more preferably at least 10 and at most 100. An area corresponding to one micromirror, which corresponds to one pixel, is 15 μm×15 μm. Therefore, when an employed region of the DMD 50 is reduced, it is preferable that this region is at least 12 mm by 150 μm and at most 12 mm by 3 mm, and more preferably at least 12 mm by 150 μm and at most 12 mm by 1.5 mm.

Figure 17A:
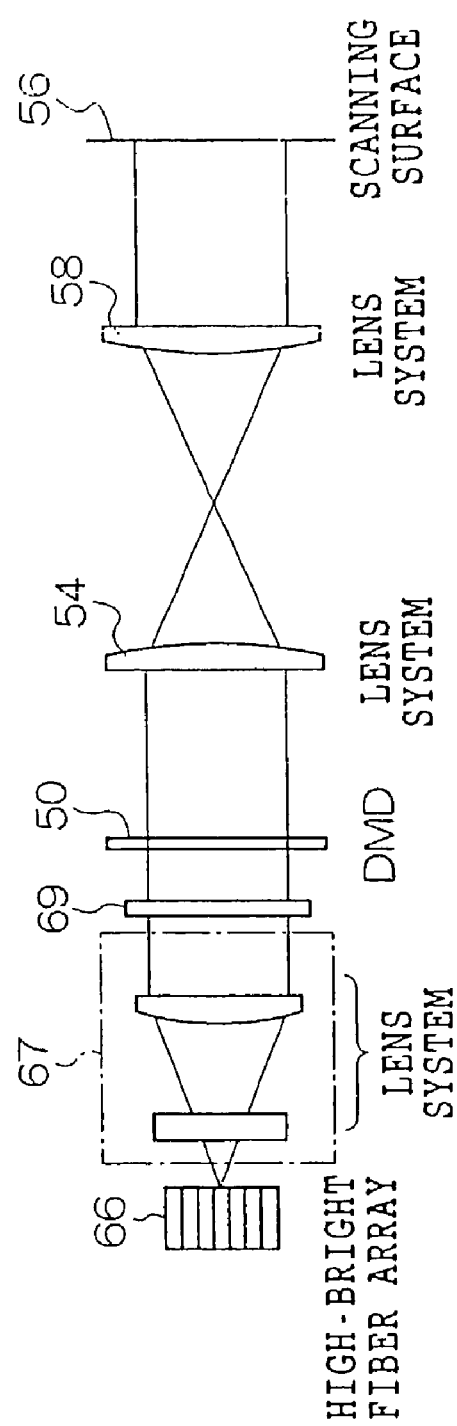
FIG. 17A is a side view showing a case in which the employed region of the DMD is appropriate.
Figure 17B:
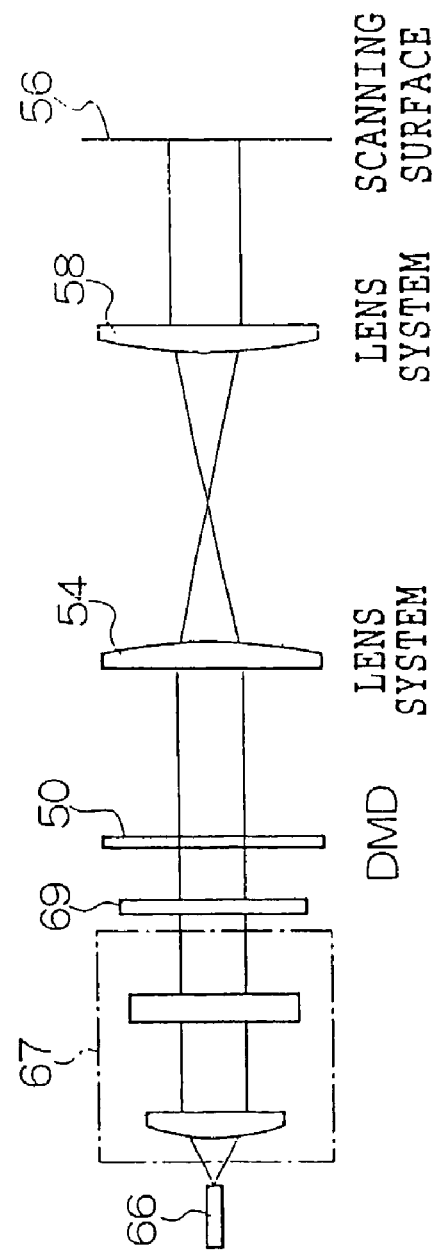
FIG. 17B is a sectional view, cut in a sub-scanning direction along the optical axis, of FIG. 17A.

If the number of micromirror rows that are employed is within the ranges described above, the laser light that is irradiated from the fiber array light source 66 can be made substantially parallel by the lens system 67 and irradiated at the DMD 50, as shown in FIGS. 17A and 17B. It is preferable if an irradiated region of the DMD 50 which is irradiated with the laser light substantially coincides with the region of the DMD 50 that is employed. If the irradiated region is larger than the employed region, efficiency of utilization of the laser light will fall.

There is a requirement that the diameter in the sub-scanning direction of the light beam that is focused on the DMD 50 is made smaller by the lens system 67, in accordance with the number of micromirrors arranged in the sub-scanning direction. Thus, if the number of micromirror rows that are employed is less than 10, the angle of convergence of the light incident at the DMD 50 will be large, and the focusing depth of the light beam at the surface to be exposed 56 will be shallow, which is not preferable. In addition, the number of micromirror rows that are employed is preferably 200 or less from the viewpoint of modulation rate. Note that, although the DMD is a reflection-type spatial modulation element, FIGS. 17A and 17B are expanded views, for the purpose of explaining optical relationships.

When sub-scanning of the photosensitive material 150 by the scanner 162 has been completed and the trailing end of the optical wiring substrate 200 has been detected by the detection sensors 164, the stage 152 is driven back along the guides 158 by the unillustrated driving apparatus, to a start point at an upstream-most side of the gate 160, and is again moved along the guides 158, at a constant speed, from the upstream side to the downstream side of the gate 160.

Thus, the exposure apparatus of the present embodiment is provided with the DMD in which 600 micromirror rows, in each of which 800 micromirrors are arranged in the main scanning direction, are arranged in the sub-scanning direction. However, by the controller controlling so as to drive only some of the micromirror rows, a modulation rate for one line can be made faster than in a case in which all of the micromirror rows are driven. Thus, exposure at high speed is possible.

Furthermore, at the light source which illuminates the DMD, the high luminance fiber array light source in which the emission end portions of the optical fibers of the multiplexed laser light sources are arranged in the form of an array is used. Thus, an exposure apparatus which is provided with high output and deep focusing depth can be implemented. In addition, because the output of each fiber light source is larger, the number of fiber light sources required for providing a desired output is smaller, and a reduction in costs of the exposure apparatus can be achieved.

In particular, in the present embodiment, because the cladding diameters of the emission ends of the optical fibers are set to be smaller than the cladding diameters of the incidence ends thereof, the light emission portion diameters are smaller and a fiber array light source with a higher luminance can be provided. Consequently, an exposure apparatus featuring a deeper focusing depth can be realized. For example, in a case of very high resolution exposure with a beam diameter of 1 μm or less and a resolution of 0.1 μm or less, a long focusing depth can be obtained, and high-speed, high-precision exposure is possible, which is suitable for an exposure process of, for example, thin film transistors (TFT) and the like, which require high resolution. In the exposure apparatus 100 of the present invention, the resolution of image exposure is set to fall within a range of 0.1 to 2.5 μm.

Fabrication of Optical Wiring Substrate

Next, a method for fabricating an optical wiring substrate (optical wiring circuit) using the exposure apparatus described above will be described.

Figure 18A:
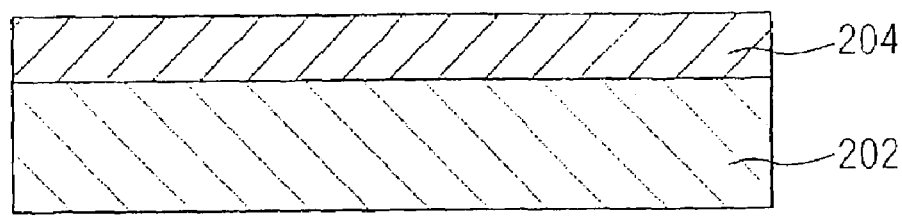
FIG. 18A is a diagram for explaining a process relating to the first embodiment of the present invention for fabrication of an optical wiring substrate by an etching method, showing a state in which a cladding layer is formed on a temporary support.
Figure 18B:
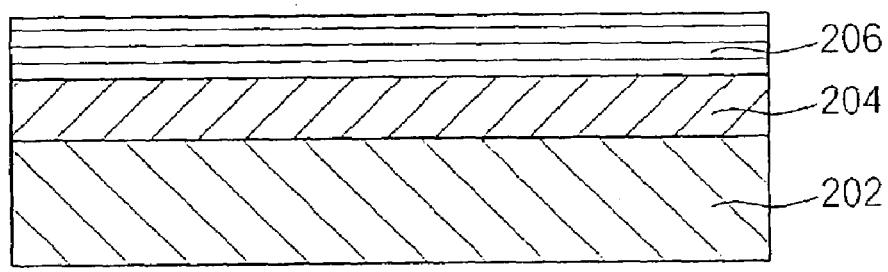
FIG. 18B is a diagram for explaining the fabrication process relating to the first embodiment, showing a state in which a core layer is formed on the cladding layer.

FIGS. 18A to 18J show a process for fabricating the optical wiring substrate by an etching method. First, in FIG. 18A, a cladding layer (a layer of fluorinated polyimide) 204 is formed by coating and baking a fluorinated polyamic acid solution at a temporary support 202. In FIG. 18B, a core layer (a fluorinated polyimide layer) 206 whose refractive index is larger than that of the cladding layer 204 is similarly formed on the cladding layer 204 by coating and baking.

Figure 18C:
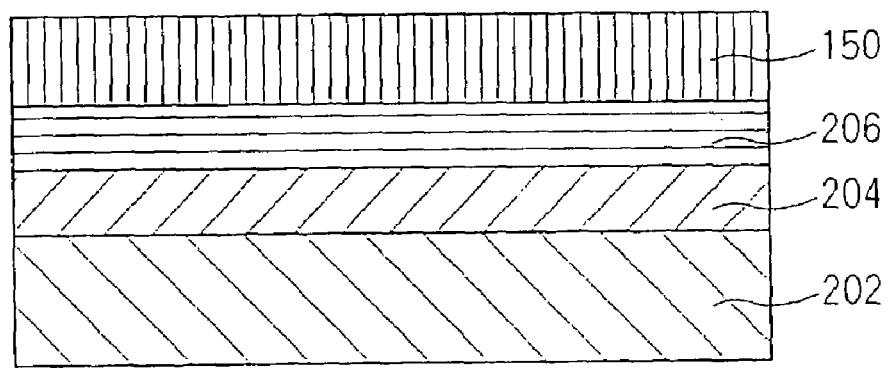
FIG. 18C is a diagram for explaining the fabrication process relating to the first embodiment, showing a state in which a photoresist is coated onto the core layer.

Then, in FIG. 18C, a positive-type photoresist (a photosensitive epoxy resin or the like), which serves as the photosensitive material 150, is coated as a thick film (laminated in the case of a dry film) on the core layer 206, after which this optical wiring substrate material is set on the stage 152 of the exposure apparatus 100 of the present embodiment.

Figure 18D:
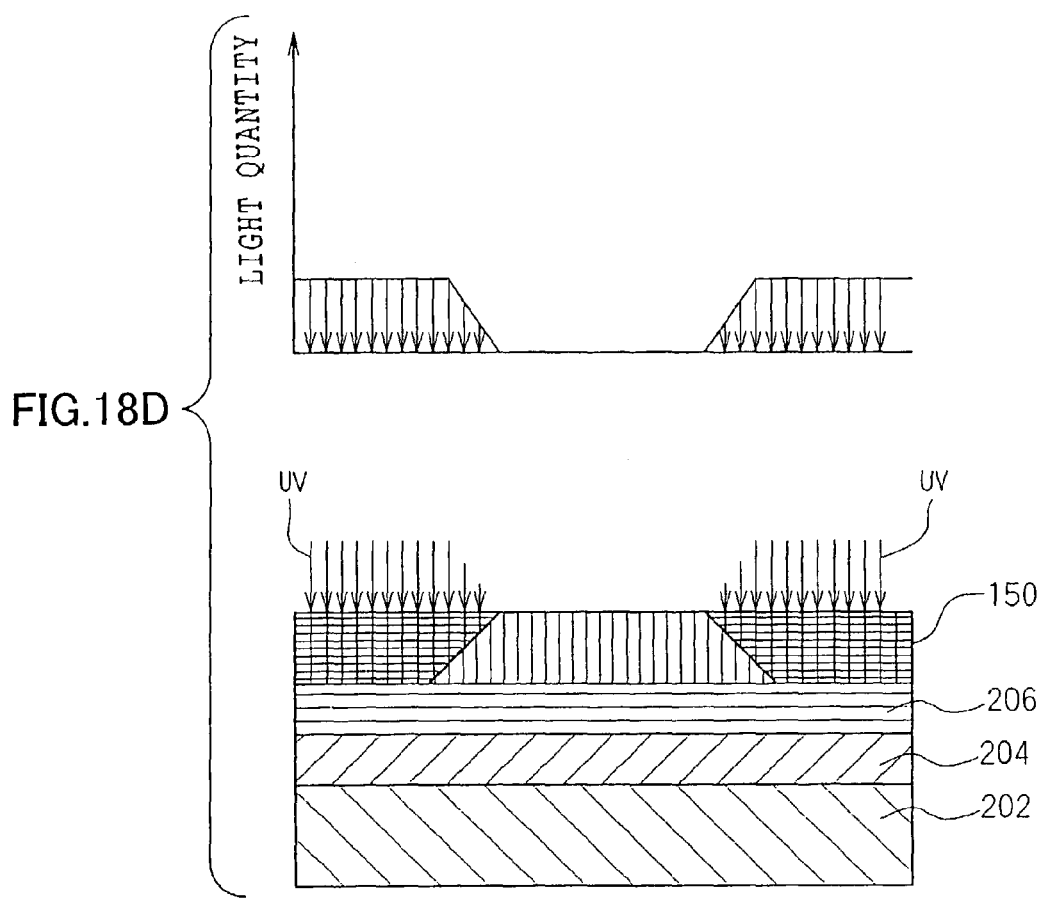
FIG. 18D is a diagram for explaining the fabrication process relating to the first embodiment, showing a stage at which the photoresist is exposed with varying light amounts by a light beam.

The apparatus is operated and an exposure operation is commenced. As described earlier, laser light is illuminated from the scanner 162 in accordance with the movement of the stage 152 and an exposure pattern is exposed at the photosensitive material 150. In the present embodiment, exposure light amounts which expose pattern end portions are varied by multiple exposure, in which sets of two or more pixels are overlappingly exposed. Thus, as shown in FIG. 18D, at a predetermined region of the core layer 206 corresponding to a portion at which a reflection mirror is to be disposed, the number of overlapping exposures is reduced stepwise from a distal end side to an inner side, and a distribution of exposure light amounts (the arrows UV) controls exposure light amounts such that the predetermined region is inclined as shown in the drawing (at about 45°). In FIG. 18D, the paper depth direction is the main scanning direction, and the horizontal direction is the sub-scanning direction.

Figure 18E:
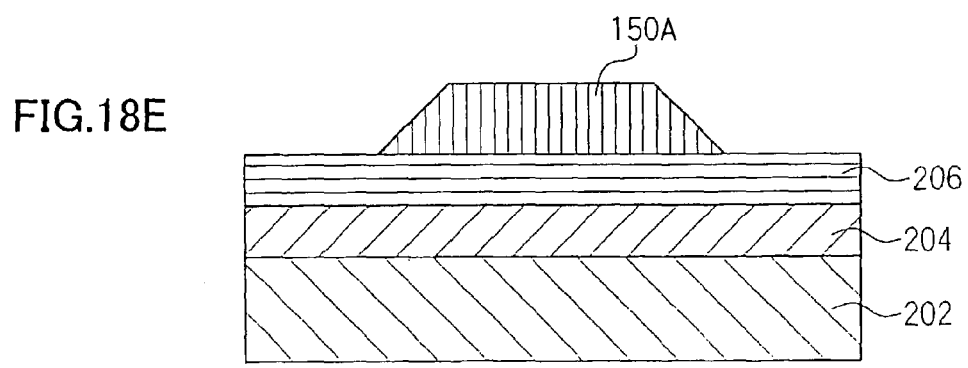
FIG. 18E is a diagram for explaining the fabrication process relating to the first embodiment, showing a state in which the photoresist is developed.

After this exposure process of the photosensitive material 150 by the exposure apparatus 100 has been completed, the exposed optical wiring substrate material is removed from the stage 152, and the photosensitive material 150 is developed. Here, because a pattern form (film thickness) of the photosensitive material 150 varies in accordance with the exposure light amount, an etching mask 150A with a trapezoid cross-sectional form at which inclined portions are structured with inclined faces as shown in FIG. 18E can be formed.

Figure 18F:
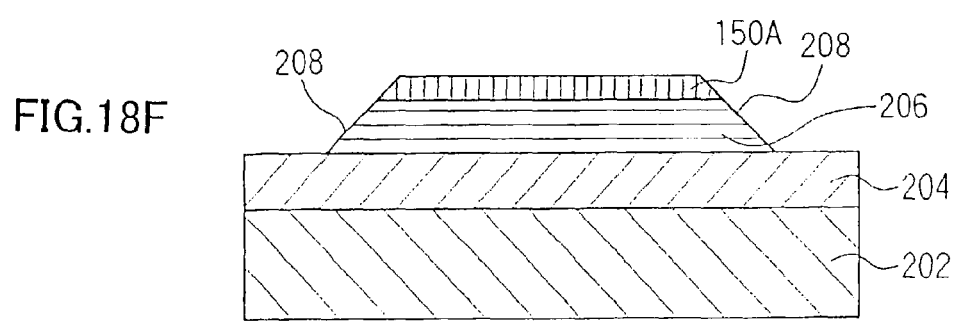
FIG. 18F is a diagram for explaining the fabrication process relating to the first embodiment, showing a state in which the core layer is dry-etched.

In FIG. 18F, the core layer 206 is worked by dry-etching, such as reactive ion etching or the like. In this etching process, the etching mask 150A is worked by etching as the core layer 206 is etched. Worked amounts at end portions of the core layer 206 have a proportional relationship to the film thickness of the etching mask 150A. That is, the working amounts experienced by the etched material are larger where the film thickness is thin than where the film thickness is thick. Thus, at the end portions of the core layer 206, inclined faces 208 are formed at an angle in accordance with the pattern form of the etching mask 150A.

Figure 18G:
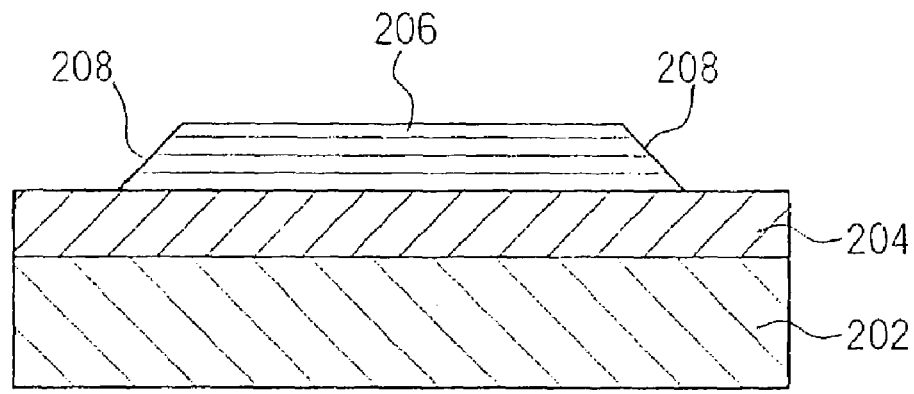
FIG. 18G is a diagram for explaining the fabrication process relating to the first embodiment, showing a state in which an etching mask is stripped away.
Figure 18H:
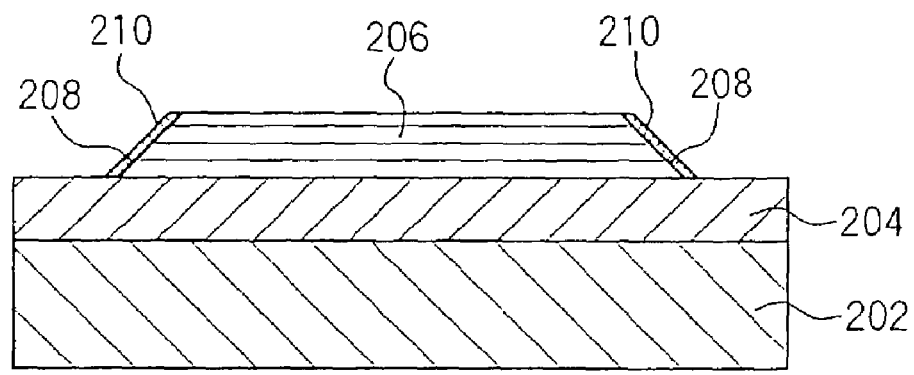
FIG. 18H is a diagram for explaining the fabrication process relating to the first embodiment, showing a state in which reflection mirrors are formed at inclined faces of core layer end portions.

In FIG. 18G, the etching mask 150A is stripped away. In FIG. 18H, in order to increase the light reflectivity of the core layer 206 at the inclined faces 208, metal is vapor-deposited at the inclined faces 208 and thin film-form reflection mirrors 210 are formed.

Figure 18I:
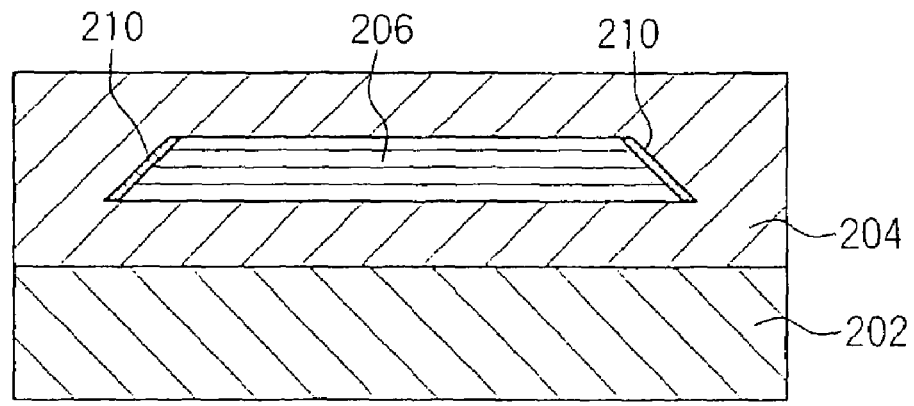
FIG. 18I is a diagram for explaining the fabrication process relating to the first embodiment, showing a state in which the core layer is covered by a cladding layer.
Figure 18J:
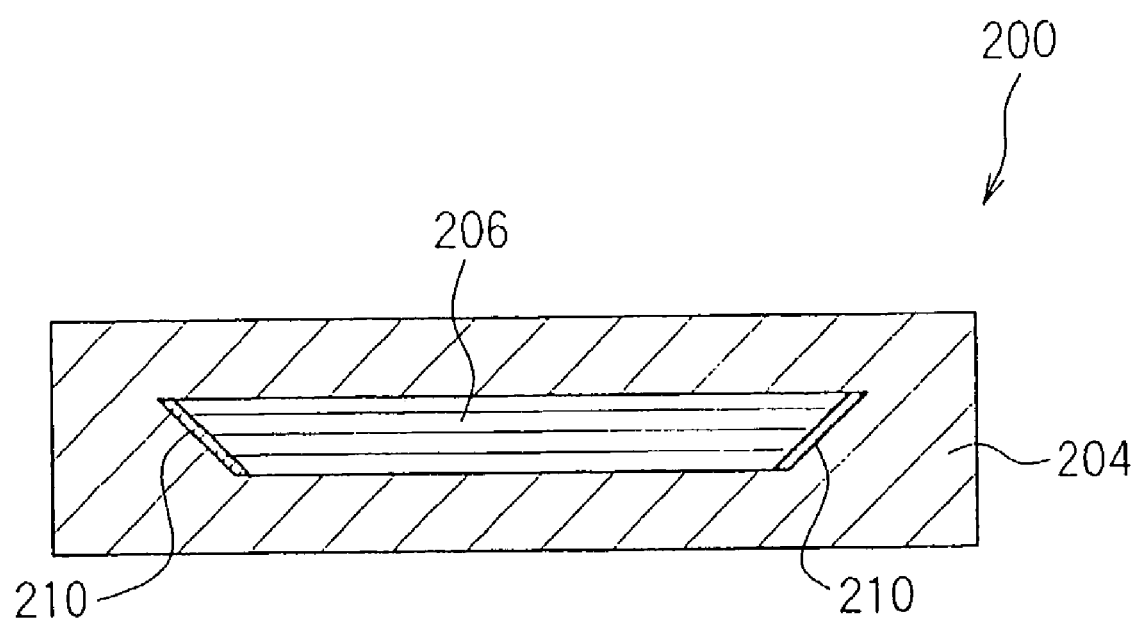
FIG. 18J is a diagram for explaining the fabrication process relating to the first embodiment, showing a completed optical wiring substrate fabricated by the etching method.

Finally, in FIG. 18I, the fluorinated polyamic acid solution is coated and baked, and the core layer 206 is covered by the cladding layer 204. The core layer 206 and cladding layer 204 are stripped from the temporary support 202, and the optical wiring substrate 200 is completed (FIG. 18J).

As described above, in the optical wiring substrate fabrication method relating to the present embodiment, after the photosensitive material 150 (photoresist) is formed as a film on the core layer 206, image exposure is carried out, using the exposure apparatus 100, with a light beam which is modulated by the DMD 50 in accordance with image information. Thus, the predetermined regions of the photosensitive material 150 are exposed by the light beam and patterned. As a result, the etching mask 150A is formed. Further, the regions corresponding to the inclined faces 208 formed at the end portions of the core layer 206 are exposed and patterned by the light beam whose exposure light amounts are controlled in accordance with the inclined forms of the inclined faces 208. Hence, the end portions of the photosensitive material 150 serve as inclined face structures and the core layer 206 is worked by etching. Thus, even without utilizing special photomasks, as in the prior art, an optical waveguide is provided with the inclined faces 208 for forming the reflection mirrors 210, which feed light L into the core layer 206 and/or emit light L from the core layer 206. Hence, optical wiring circuitry which is structured as a circuit by such optical waveguides and the optical wiring substrate can be fabricated with ease.

By using this maskless exposure, fabrication in accordance with circuit variations, complex circuit structures and the like is simple. Furthermore, because high-speed exposure of large areas is possible with line exposure, film that is supplied in roll form can be formed into optical wiring circuits with high speed and large areas. Further still, even with a circuit pattern in which the optical waveguides form an optical sheet bus with a plurality of buses, high-volume production is possible.

Further, in the present embodiment, the light beam from the exposure apparatus 100 is modulated by the DMD 50 and scanned, and light amounts from the scanned light beam are controlled using multiple exposure to expose sets of two or more pixels overlappingly. Thus, control of exposure light amounts from the light beam is simple, in addition to which inclined forms of the etching mask formed by the light beam can be made smooth.

Figure 19A:
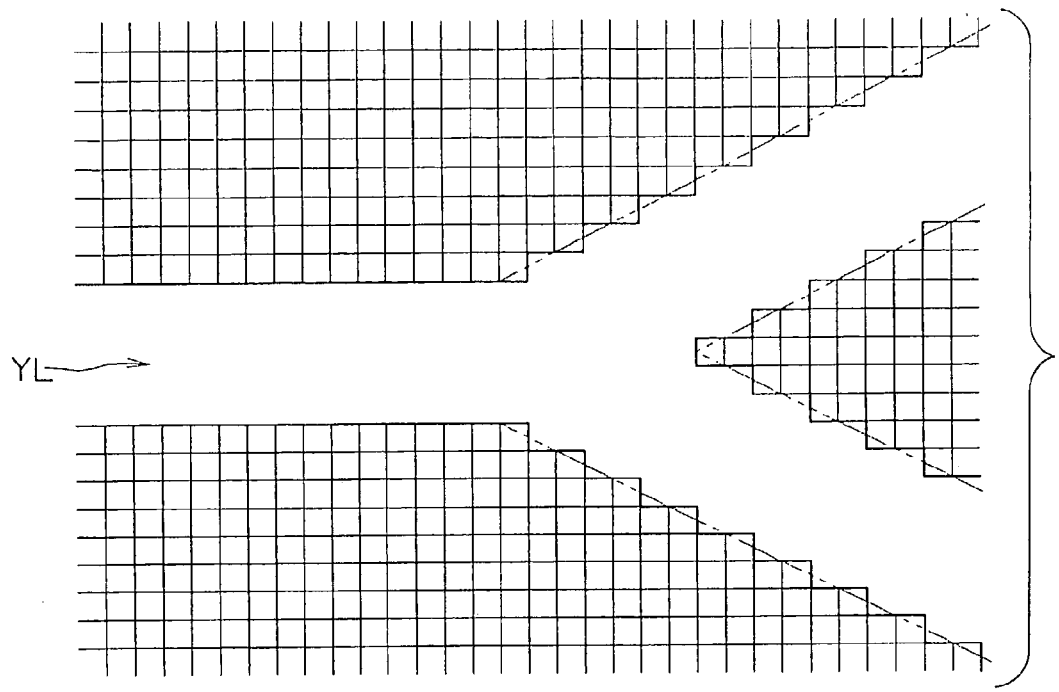
FIGS. 19A and 19B are plan views schematically showing a difference between pattern forms for cases in which a branched circuit is formed by light beams with different resolutions.
Figure 19B:
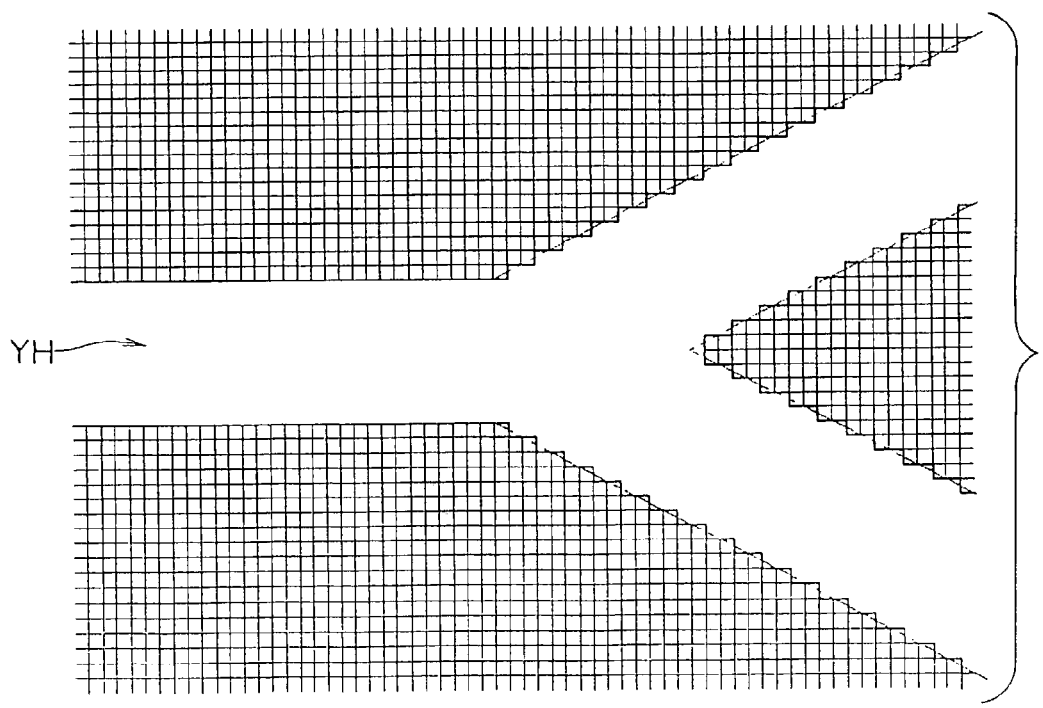

Further again, because light beam exposure with an extremely high precision, at a resolution of 0.1 to 2.5 µm is realized, the pattern form of the optical waveguides that are formed is made more excellent, and propagation losses of the circuitry can be suppressed. For example, in a case in which a branching circuit having the form of a letter Y is exposed and formed, as schematically shown in FIGS. 19A and 19B, the branching circuit YH of FIG. 19B is exposed with a light beam at a higher resolution than the branching circuit YL of FIG. 19A, and the form of the pattern at angled portions is more excellent. Consequently, the branched circuit YH is a circuit with smaller propagation losses.

Further still, in the present embodiment, because a positive-type photoresist is used, the pattern form of inclined structures can be formed at the etching mask 150A with ease.

Second Embodiment

Next, a method of fabricating an optical wiring substrate in which an optical wiring circuit is provided with a plurality of levels will be described.

FIGS. 20 and 21 show an exposure apparatus for forming an optical wiring circuit with a plurality of levels, which relates to a second embodiment of the present invention. In this exposure apparatus 171, a stage 172 is formed with a transparent glass plate of a predetermined thickness (for example, 10 mm). Pairs of rails 176 are provided respectively above and below the stage 172. The rails 176 are disposed to be parallel along a longitudinal direction of the stage 172 (the upper side rails 176 are not shown in the drawings). At each pair of rails 176, a line-form scanner 162A or 162B, which is provided with a plurality of the aforementioned exposure heads 166, is provided traversing a width direction of the stage 172 (the main scanning direction). The scanners 162A and 162B are controlled and driven by an unillustrated driving apparatus, and are structured to move along the rails 176 in the sub-scanning direction.

An optical wiring substrate material (optical wiring substrate 220), which is laid on the stage 172, is pressured at both end portions in a length direction thereof to be fixed by a pair of rollers 186. Each of the rollers 186 is supported at both ends of a roller axis thereof by an actuator 190, such as an air cylinder or the like, which is disposed upward of the roller 186. The rollers 186 are moved in the vertical direction by driving of the actuators 190. Thus, the rollers 186 fix the optical wiring substrate 220 and release fixing of the optical wiring substrate 220.

With the structure described above, during an exposure operation of the exposure apparatus 171, as shown in FIG. 21, laser light UVA is irradiated at an upper face (front face) 220A of the optical wiring substrate 220. The laser light UVA is emitted traversing the main scanning direction from the upper side scanner 162A. Laser light UVB, which is similarly emitted from the lower side scanner 162B, is irradiated through the stage 172 to a lower face (rear face) 220B of the optical wiring substrate 220. By moving each scanner along the rails 176 in the sub-scanning direction, both faces of the optical wiring substrate 220 are simultaneously exposed in a single cycle of scanning, without inversion of the substrate.

Next, a method for fabricating an optical wiring substrate, which is provided with an optical wiring circuit with a plurality of levels, using the exposure apparatus 171 described above, will be described. First, by the steps of FIGS. 18A to 18C of the fabrication process described earlier, the cladding layer (fluorinated polyimide layer) 204, the core layer (fluorinated polyimide layer) 206 whose refractive index is larger than that of the cladding layer 204, and the photosensitive material (positive-type photoresist) 150 are formed in this order on the temporary support 202. Here, the temporary support 202 is formed by a transparent material having optical transmissivity (a glass plate, a transparent resin plate or the like).

The optical wiring substrate 220 is set on the stage 172 of the exposure apparatus 171, and the apparatus is operated. The actuators 190 are driven to move the rollers 186 downward, the two ends of the optical wiring substrate 220 are fixed by the rollers 186, and operation of the apparatus is commenced. As described above, the scanner 162A and scanner 162B are driven in the sub-scanning direction. In accordance therewith, laser light is irradiated from each of the scanners, and an exposure pattern is exposed at the photosensitive material 150 in accordance with image data.

Figure 22A:
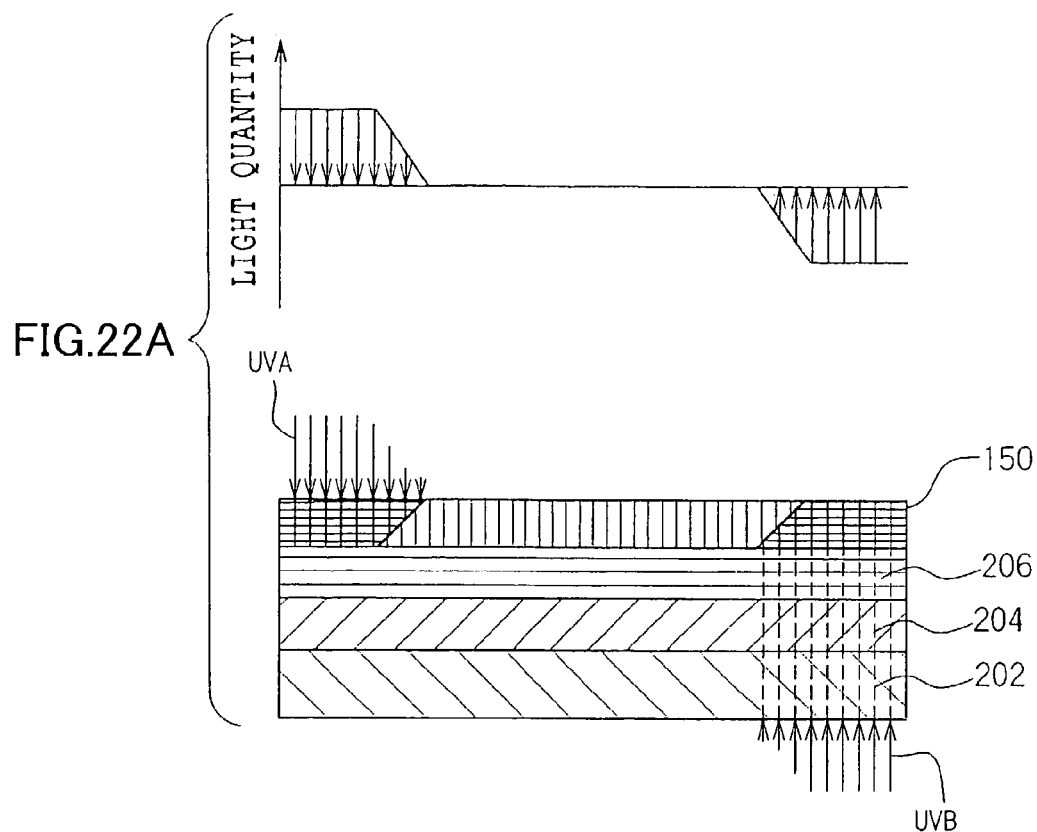
FIG. 22A is a diagram for explaining a process relating to the second embodiment of the present invention for fabrication of an optical wiring substrate, which is provided with a plurality of levels of optical wiring circuitry, by an etching method, showing a stage at which a photoresist is exposed by light beams from both sides with varying exposure light amounts.

In this case too, exposure light amounts at pattern end portions are varied by exposing with multiple exposure. As an exposure pattern, as shown in FIG. 22A, one of the pattern end portions (at the left side of the drawing) is exposed by laser light UVA from the scanner 162A disposed above, and another of the pattern end portions (at the right side of the drawing) is exposed by laser light UVB which is irradiated from the scanner 162B disposed below and transmitted through the stage 172, the temporary support 202, the cladding layer 204 and the core layer 206. For the light amount distribution of each laser light, similarly to the fabrication method described above, the number of overlapping exposures is reduced stepwise from a distal end side to an inner side of a predetermined region of the core layer 206, which corresponds to a portion at which a reflection mirror is to be disposed. The distributions of exposure light amounts (the arrows UVA and the arrows UVB) control exposure light amounts such that the predetermined region is inclined (at about 45°) as shown in the drawing. In the drawing, the paper depth direction is the main scanning direction, and the horizontal direction is the sub-scanning direction.

Figure 22B:
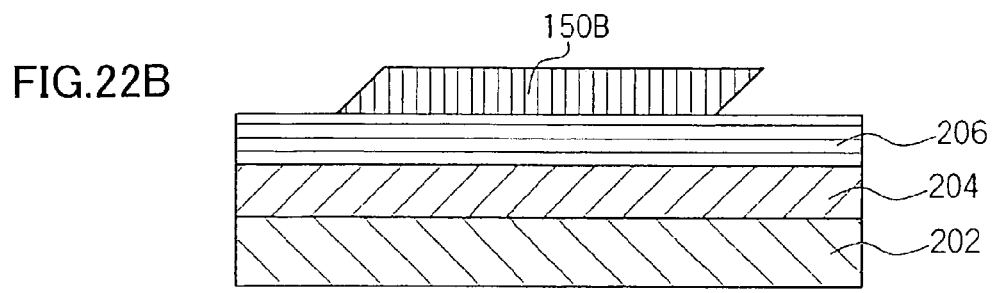
FIG. 22B is a diagram for explaining the fabrication process relating to the second embodiment, showing a state in which the photoresist is developed.

After this exposure process of the photosensitive material 150 by the exposure apparatus 171 has been completed, the photosensitive material 150 is developed. By this developing process, an etching mask 150B is formed which, as shown in FIG. 22B, has a parallelogram-form cross-section at which the end portion at the right side is set to be an inclined face structure with an inverted taper (undercut).

Figure 22C:
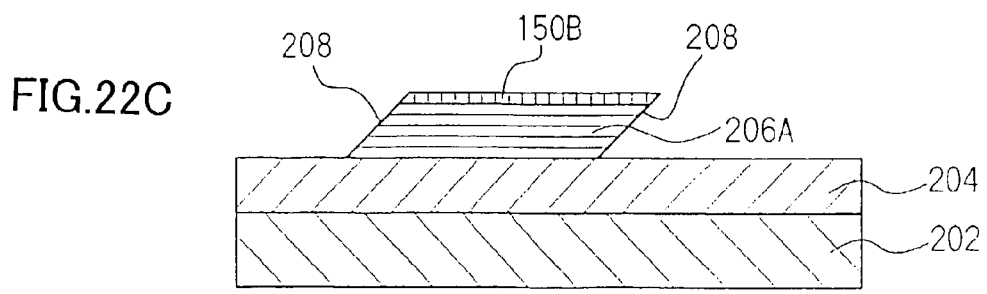
FIG. 22C is a diagram for explaining the fabrication process relating to the second embodiment, showing a state in which a first core layer is dry-etched.
Figure 24A:
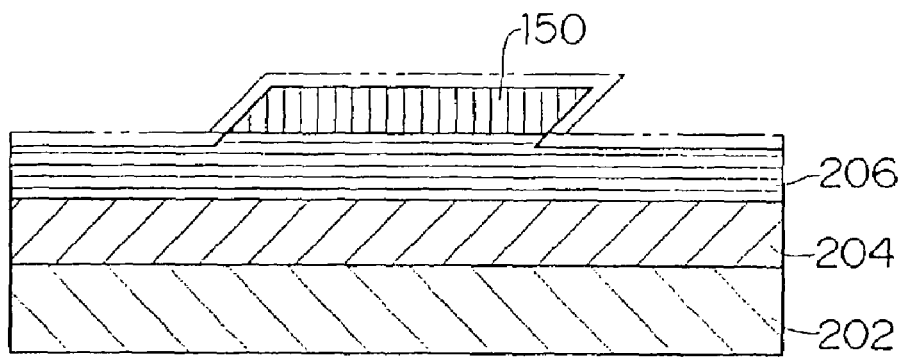
FIGS. 24A, 24B and 24C are diagrams for explaining the process of FIG. 22C in detail, and are diagrams schematically showing stages of progress as the core layer and etching mask are progressively worked by dry-etching.
Figure 24B:
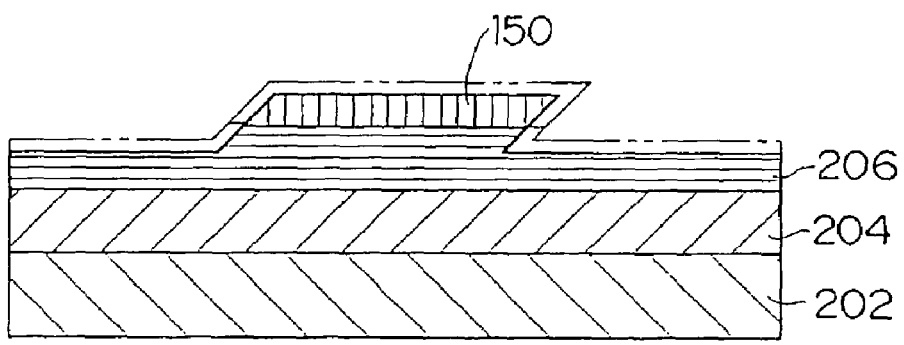
Figure 24C:
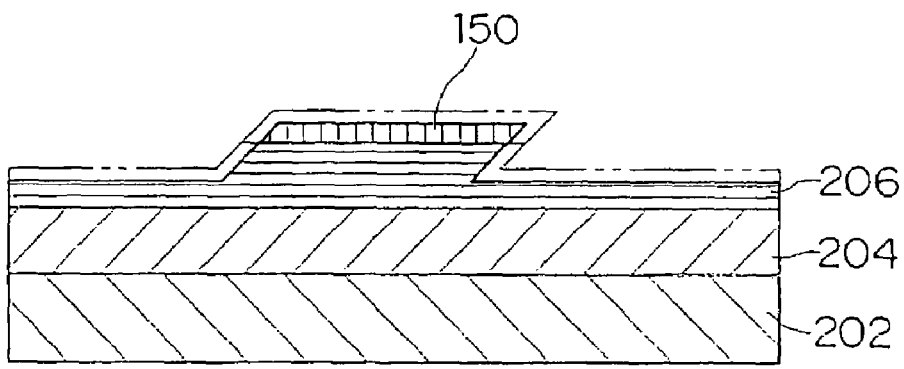

In FIG. 22C, dry-etching is implemented for working the core layer 206. The core layer 206 is worked by etching together with the etching mask 150B by the same effects as in the etching process described earlier. Stages of this working are shown in FIGS. 24A to 24C. As shown in these drawings, erosion of the core layer 206 and etching mask 150B by the etching process progresses at the inverted taper portion of the etching mask 150B. In accordance with this progress, the erosion progresses downward into the core layer 206. At the same time, erosion to the inner side of the inclined face (toward the left side of the drawing) progresses. As a result, at the core layer 206, the parallelogram form of the etching mask 150B is gradually made smaller and the mask pattern thereof is transferred to the core layer 206. Consequently, after the etching process, a core layer 206A with a parallelogram-form cross-section is formed, as shown in FIG. 22C.

Figure 22D:
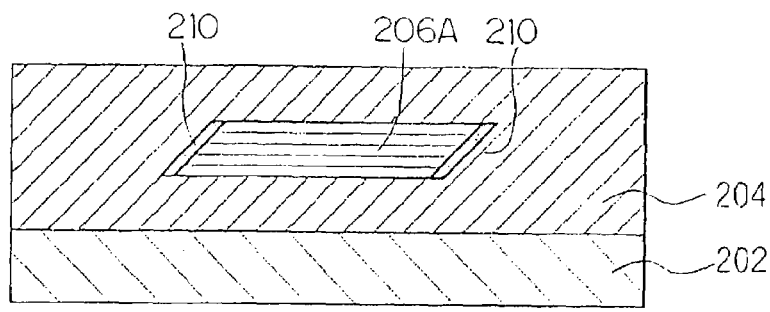
FIG. 22D is a diagram for explaining the fabrication process relating to the second embodiment, showing a state in which reflection mirrors are formed at inclined surfaces of end portions of the first core layer and the core layer is covered by a cladding layer.

Then, after the etching mask 150B has been stripped away, the thin film-form reflection mirrors 210 are formed by vapor deposition of metal or the like at the inclined faces 208 at the two end portions of the core layer 206A. The core layer 206A is covered by the cladding layer 204. Thus, as shown in FIG. 22D, a single-level optical wiring circuit is formed. The optical wiring circuit is structured as a circuit by the optical waveguide formed by the core layer 206A, at both ends of which the reflection mirrors are provided, and the cladding layer 204, which covers the core layer 206A.

Figure 22E:
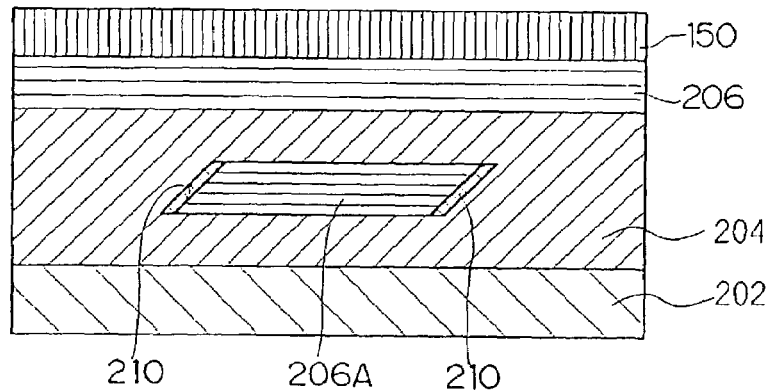
FIG. 22E is a diagram for explaining the fabrication process relating to the second embodiment, showing a state in which a second core layer is formed on the cladding layer and a photoresist is coated thereon.
Figure 22F:
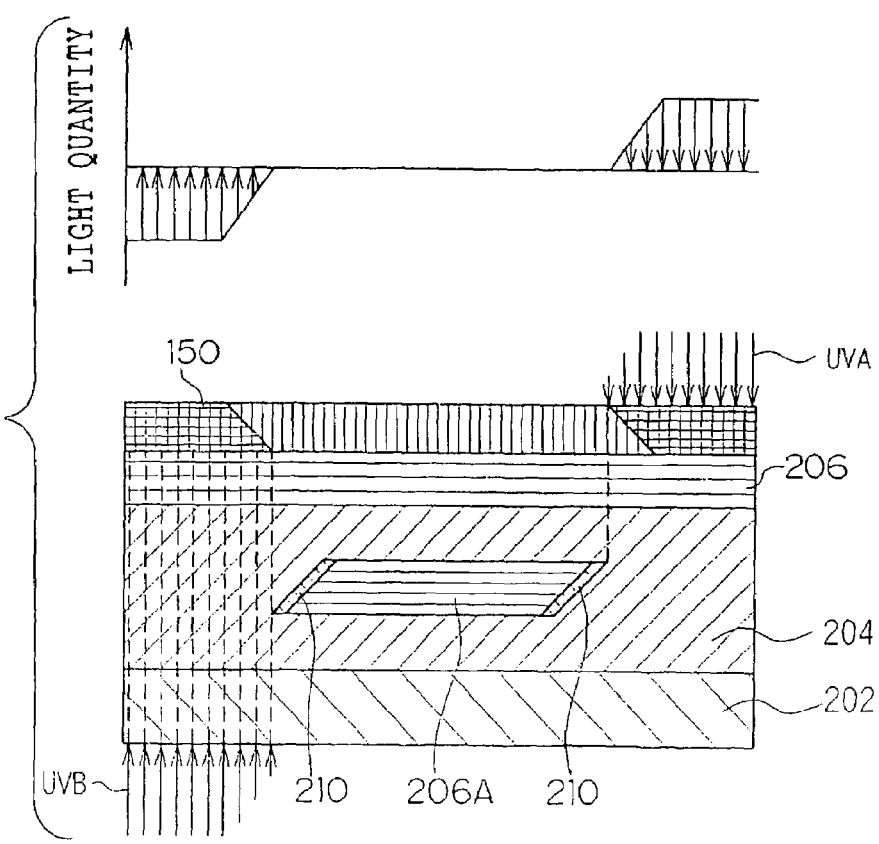
FIG. 22F is a diagram for explaining the fabrication process relating to the second embodiment, showing a stage at which the photoresist is exposed by light beams from both sides with varying exposure light amounts.

Thereafter, in order to form a second level of optical wiring circuitry, in FIG. 22E, the core layer 206 and the photosensitive material (positive-type photoresist) 150 are formed in this order on the cladding layer 204. Then, in FIG. 22F, exposure processing is again implemented by the exposure apparatus 171. For this second exposure, as shown in the drawing, the exposure direction, from above or below, at each pattern end portion is set to the opposite direction. Thus, a portion at the other pattern end is exposed with laser light UVA from the upper scanner 162A, and a portion at the one pattern end is exposed by laser light UVB irradiated from the lower scanner 162B and transmitted through the stage 172, the temporary support 202, the cladding layer 204 and the core layer 206. These exposure regions are set to be regions which are substantially adjacent at outer sides relative to the end portions of the first level core layer 206A, and the light amount distributions of the laser lights are similar to those of the first exposure.

Figure 22G:
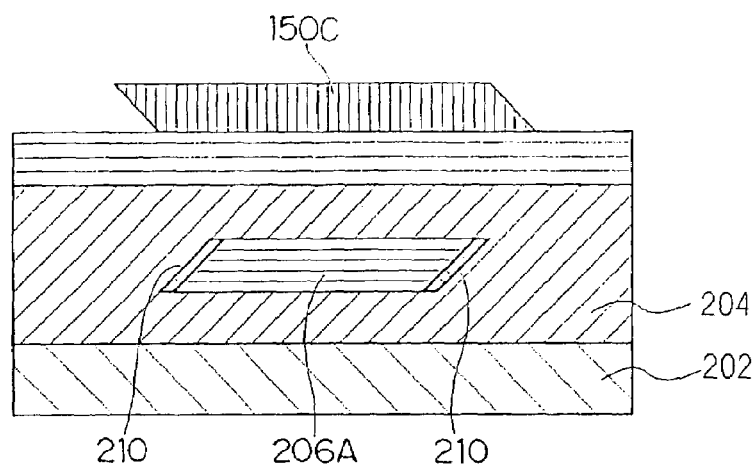
FIG. 22G is a diagram for explaining the fabrication process relating to the second embodiment, showing a state in which the photoresist is developed.
Figure 22H:
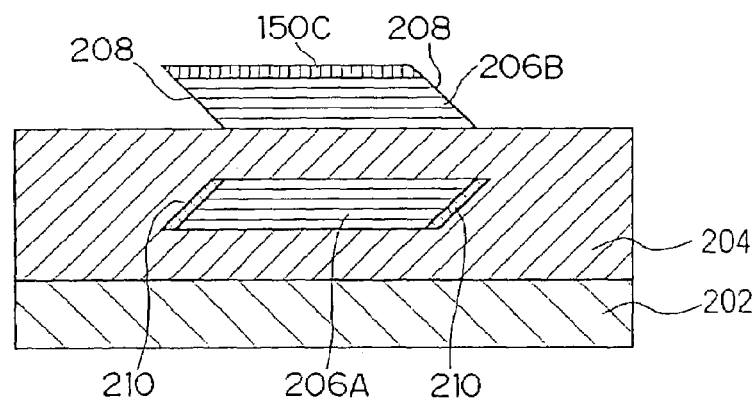
FIG. 22H is a diagram for explaining the fabrication process relating to the second embodiment, showing a state in which the second core layer is dry-etched.

Consequently, when the photosensitive material 150 is developed after the exposure process, as shown in FIG. 22G, an etching mask 150C is formed with a parallelogram-form cross-section, a left side end portion of which is an inverted taper face. Dry-etching is implemented using this etching mask 150C and, by the same effects as described in FIGS. 24A to 24C, the mask pattern of the etching mask 150C is transferred to the core layer. Thus, a second level core layer 206B shown in FIG. 22H is formed. This core layer 206B has a parallelogram form which is vertically inverted relative to the first level core layer 206A. Positions of inclined faces of the two end portions of each core layer are disposed to respectively substantially overlap in the vertical direction.

Figure 22I:
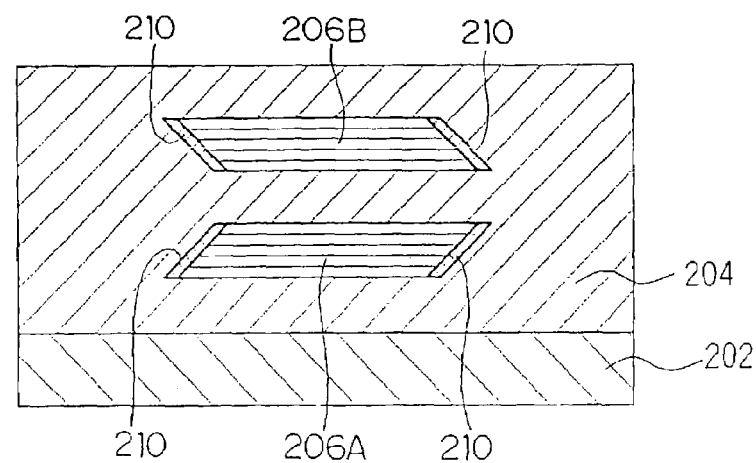
FIG. 22I is a diagram for explaining the fabrication process relating to the second embodiment, showing a state in which reflection mirrors are formed at inclined surfaces of end portions of the second core layer and the core layer is covered by a cladding layer.
Figure 23:
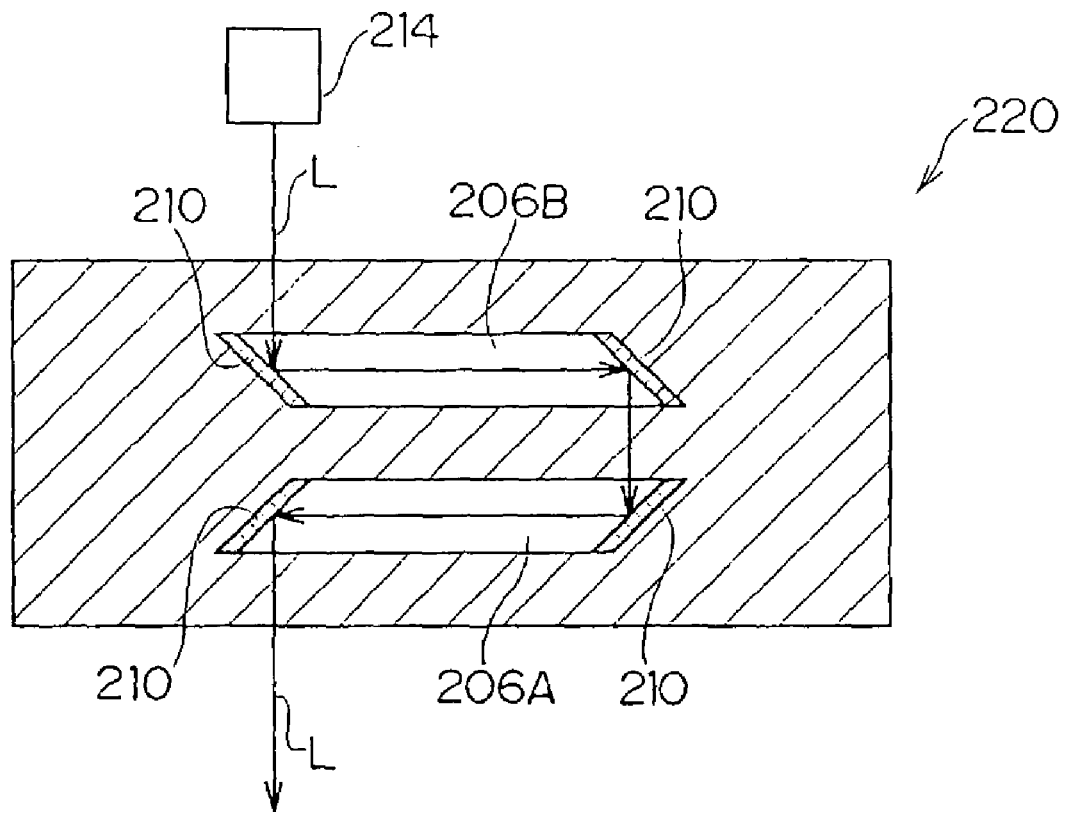
FIG. 23 is a diagram showing a completed form and a usage example of an optical wiring substrate provided with a plurality of layers of optical wiring circuitry, which has been fabricated by the etching method.

The remaining etching mask 150C is stripped away, and the reflection mirrors 210 are formed at the inclined faces 208 at the two end portions of the core layer 206B by vapor deposition of metal or the like. The core layer 206B is covered by the cladding layer 204 and, as shown in FIG. 22I, a second level optical wiring circuit is formed. Finally, the temporary support 202 is stripped away and, as shown in FIG. 23, the optical wiring substrate 220, in which optical wiring circuitry is provided at a plurality of levels, is completed.

When this optical wiring substrate 220 is used, for example, as shown in the drawing, light L, from a light-emitting element 214 at the upper side, is incident on the reflection mirror 210 at the left side end portion of the optical wiring circuit that is disposed at the upper level (the core layer 206B). Hence, the light L reflected at the reflection mirror 210 is guided along the core layer 206B and reaches the reflection mirror 210 at the opposite end portion, whereat the light L is reflected and emitted downward. The light L is then incident on and reflected at the reflection mirror 210 at the right side end portion of the optical wiring circuitry disposed at the lower level (the core layer 206A), and passes into the core layer 206A. The light L is guided by the core layer 206A, reflected at the reflection mirror 210 at the left side end portion, and emitted to the lower side of the optical wiring substrate 220.

Now, in the fabrication of the optical wiring substrate by the two-stage photolithography process described above, because relative positional accuracy of the first and second exposure patterns is high, well known alignment techniques, scaling functions and the like can be used. For alignment marks that are necessary therefor, a method using, for example, the reflection mirrors 210 formed at the core layer 206A, a method in which a mark pattern corresponding to the alignment marks is exposed and formed separately from the optical waveguide pattern by the first exposure, and the like are available. These alignment marks are then imaged by a CCD camera or the like mounted at the exposure apparatus, the positions of the alignment marks are found from image data, and scaling and the like are implemented on the basis of this positional data. Thus, an optical wiring substrate provided with solid optical wiring circuitry which is positioned with high accuracy is can be obtained. Furthermore, more than two levels of optical wiring circuitry can be formed easily, by repeating the photolithography process in the same manner as above.

A method for forming inverted taper faces at end portions of the etching mask other than the two-sided exposure described above may be used. For example, desired shapes can be formed by changing exposure conditions, etching conditions and the like.

As is described above, in fabrication of an optical wiring substrate provided with a plurality of levels of optical wiring circuitry, the substrate can be formed with greater ease by digital maskless exposure using light beams than by conventional mask exposure. Moreover, alignment, scaling and the like can be employed more easily, and consequently solid optical wiring circuitry can be positioned with higher accuracy.

Third Embodiment

Next, a method for fabricating an optical wiring substrate (optical wiring circuitry) using the exposure apparatus 100 described for the first embodiment, by using a photo-bleaching method, will be described.

Figure 25A:
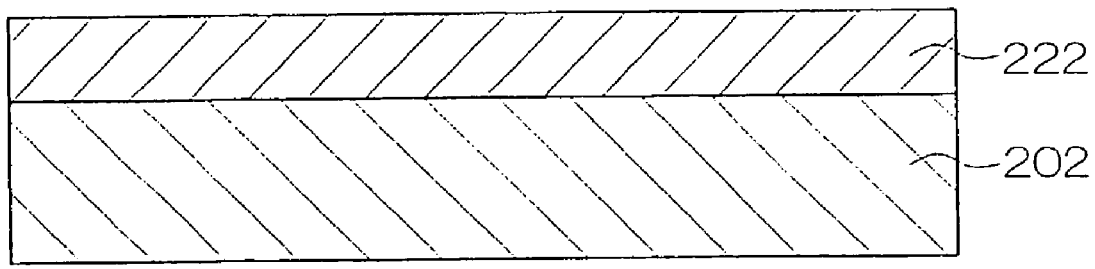
FIG. 25A is a diagram for explaining a process relating to a third embodiment of the present invention for fabrication of an optical wiring substrate by a photo-bleaching method, showing a state in which a cladding layer is formed on a temporary support.
Figure 25B:
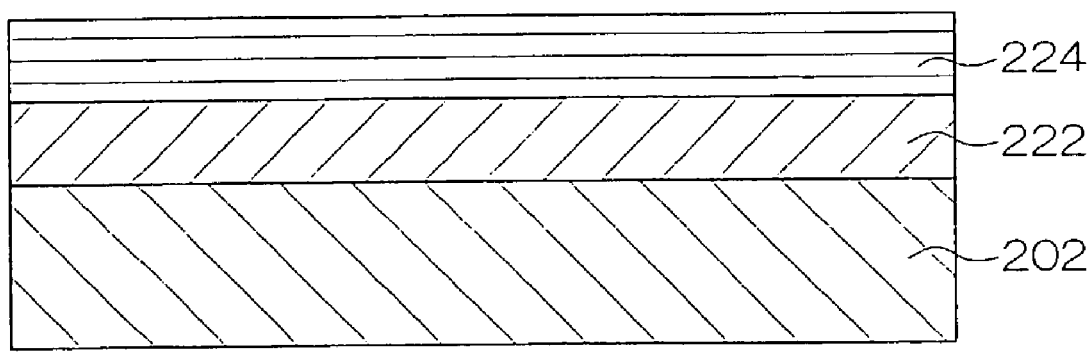
FIG. 25B is a diagram for explaining the fabrication process relating to the third embodiment, showing a state in which a core layer is formed on the cladding layer.

FIGS. 25A to 25F show a process for fabricating an optical wiring substrate by a photo-bleaching method. First, in FIG. 25A, a cladding layer 222 is formed by coating and baking polyvinylidene fluoride (PVDF) at the temporary support 202. In FIG. 25B, a core layer 224 is formed on the cladding layer 222 by coating and baking polysilane, which serves as a polymer material for photo-bleaching, and which has a refractive index larger than that of the cladding layer 222 and has a characteristic of being sensitive to UV light such that the molecular structure thereof changes and the refractive index falls.

Figure 25C:
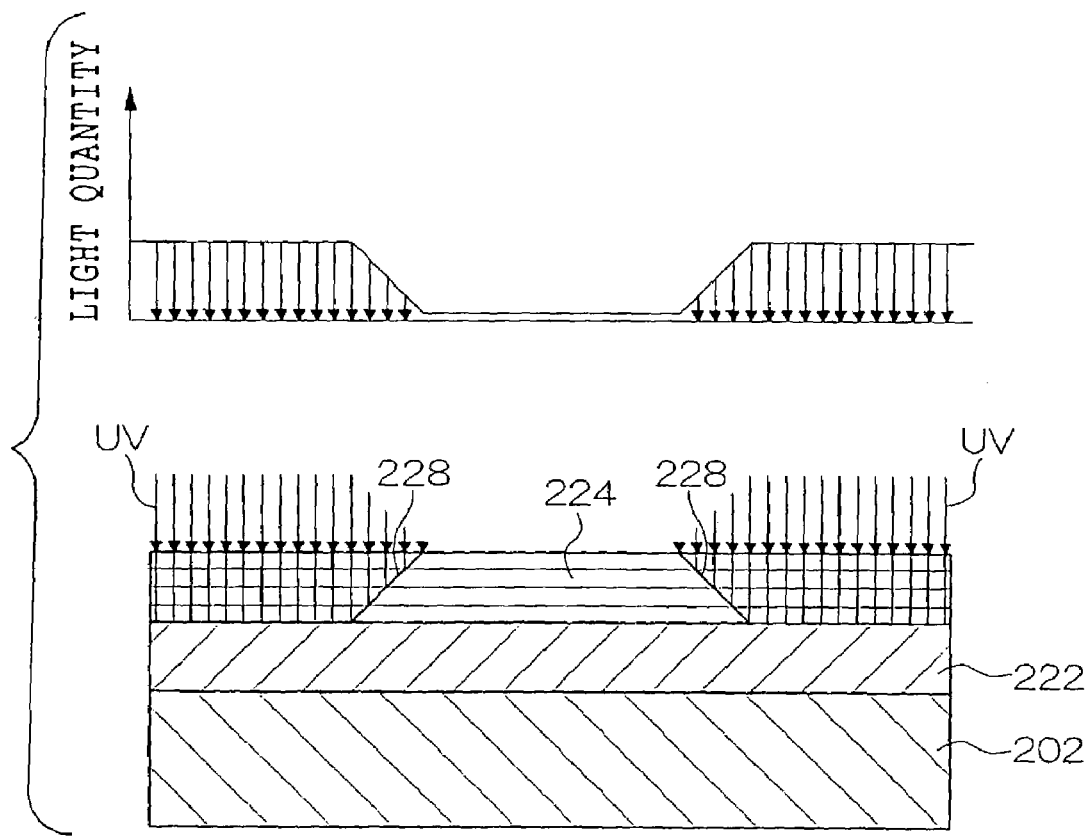
FIG. 25C is a diagram for explaining the fabrication process relating to the third embodiment, showing a stage at which the core layer is exposed with varying exposure light amounts by a light beam.

This optical wiring substrate material is set on the stage 152 of the exposure apparatus 100 and a predetermined exposure pattern is exposed at the core layer 224 by laser light (UV light) irradiated from the scanner 162. Here too, as shown in FIG. 25C, at a predetermined region of the core layer 224, which corresponds to an inclined face to be formed at an end portion of the core layer 224, the number of overlapping exposures by multiple exposure for exposing two or more pixels overlappingly is reduced stepwise from a distal end side to an inner side, and a distribution of exposure light amounts (the arrows UV) controls exposure light amounts such that the predetermined region is inclined (at about 45°) as shown in the drawing.

Because of the characteristics of the polysilane employed in the core layer 224, an exposed region of the core layer 224, which is exposed by the laser light, is exposed and the refractive index thereof is reduced. This low-refractivity portion becomes a cladding layer 226, and an unexposed high-refractivity portion becomes the core layer 224. Inclined faces 228, which are inclined in accordance with distributions of exposure light amounts, are formed at boundaries with the cladding layer 226 at end portions of the core layer 224 (left and right end portions in FIG. 25C).

Figure 25D:
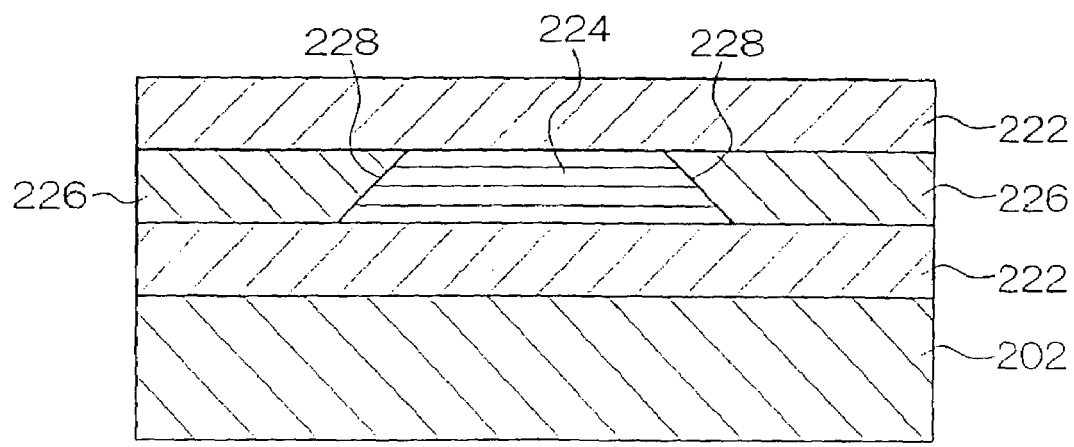
FIG. 25D is a diagram for explaining the fabrication process relating to the third embodiment, showing a state in which the core layer is covered by a cladding layer.
Figure 25E:
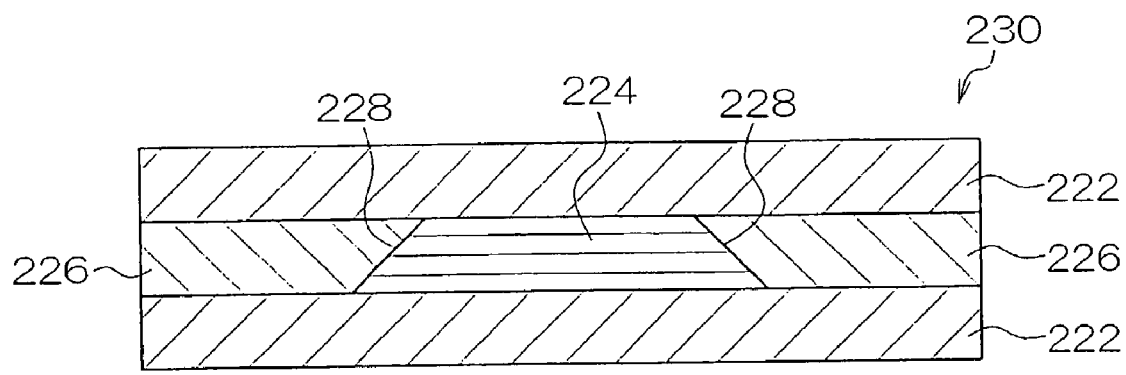
FIG. 25E is a diagram for explaining the fabrication process relating to the third embodiment, showing a state in which the optical wiring substrate is stripped from the temporary support.

After the exposure process of the core layer 224 by the exposure apparatus 100 has been completed, the exposed optical wiring substrate material is removed from the stage 152. In FIG. 25D, polyvinylidene fluoride (PVDF) is coated and baked, and the core layer 224 and cladding layer 226 are covered by the cladding layer 222. Finally, the optical wiring substrate 220 is stripped away from the temporary support 202, and an optical wiring substrate 230 is completed (FIG. 25E).

Figure 26:
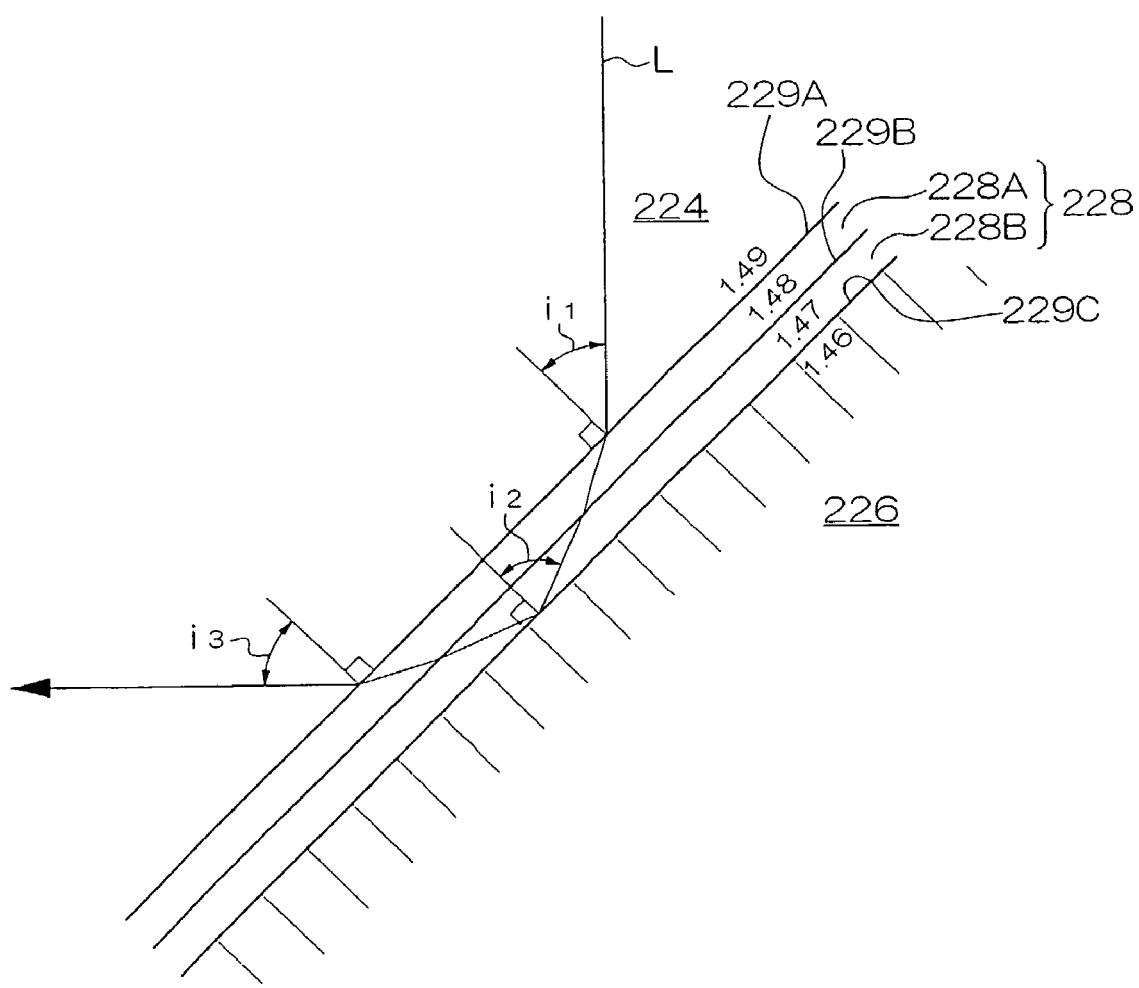
FIG. 26 is an enlarged schematic sectional diagram showing a core layer and cladding layer of an optical wiring substrate fabricated by the photo-bleaching method, a distribution of refractivities of an inclined face, and a state of light reflection by the inclined face.

Refractivity of this optical wiring substrate 230 varies in the vicinity of the inclined face 228. A distribution of refractive indexes of the inclined face 228 is shown schematically in FIG. 33. In the case of polysilane, the reflactive index thereof can be varied by around 6%. The inclined face 228 has a distribution of reflactivities which is varied stepwise in a direction substantially perpendicular to the inclined face 228 within a characteristic range. The inclined face 228 has a two step (two layer) structure which is formed by an inclined face first layer 228A with higher refractivity at the core layer 224 side thereof and an inclined face second layer 228B with lower refractivity at the cladding layer 226 side. In FIG. 26, relationships between refractive indices of the inclined face 228, the core layer 224 and the cladding layer 226 are such that the core layer 224>the inclined face first layer 228A>the inclined face second layer 228B>the cladding layer 226.

Figure 25F:
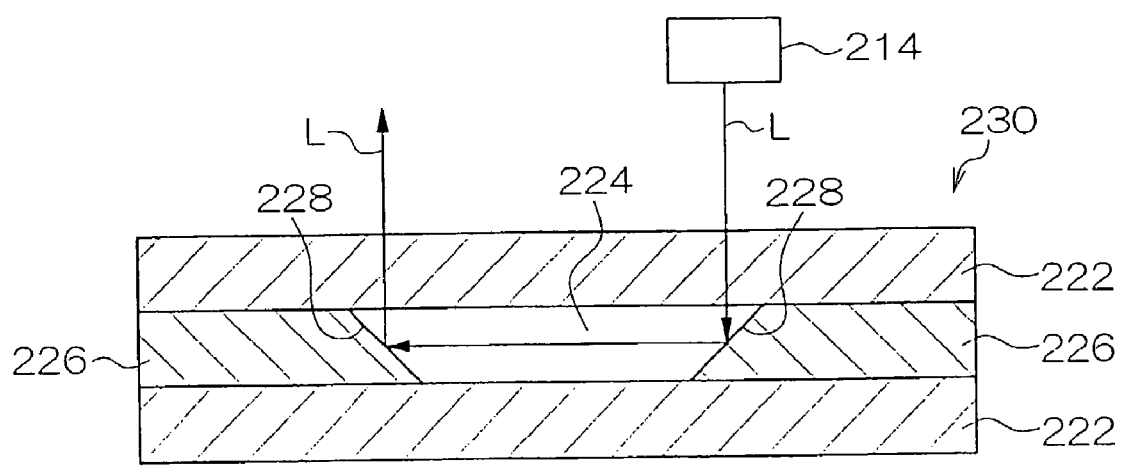
FIG. 25F is a diagram for explaining the fabrication process relating to the third embodiment, showing a completed state of the optical wiring substrate fabricated by the photo-bleaching method, and a usage example thereof.

At this inclined face 228, as shown in FIGS. 25F and 26, when light L is irradiated from the light-emitting element 214 and is incident at an angle of incidence $i_1 = 45°$, the light L is refracted to a side such that an angle of refraction becomes larger at, respectively, a boundary surface 229A, between the core layer 224 and the inclined face first layer 228A, and a boundary surface 229B, between the inclined face first layer 228A and the inclined face second layer 228B. The light L is incident on a boundary surface 229C, between the inclined face second layer 228B and the cladding layer 226, at an angle of incidence $i_2$. Because this angle of incidence $i_2$ is larger than the angle of incidence $i_1$, a rate of reflection of light which is reflected at the boundary surface 229C is raised. The reflected light L is refracted to a side such that the angle of refraction becomes smaller at the boundary surface 229B and at the boundary surface 229A, and passes into the core layer 224 at an angle of refraction $i_3=45°$.

In this manner, the light L that is incident at the inclined face 228 at the angle of incidence $i_1=45°$ is reflected with a high reflection coefficient by the inclined face 228, which includes the boundary surface 229A, the boundary surface 229B and the boundary surface 229C, and the light path is changed by 90° (FIGS. 25F and 26 show a state in which the light L is incident from above and is reflected to the left). Thus, this inclined face 228 functions as a reflection mirror.

Hence, the light L that has been reflected at the inclined face 228 is transmitted through the core layer 224 as far as the inclined face 228 at an opposite end portion of the core layer 224. At this inclined face 228, the light L is reflected with a high reflection coefficient in the same manner, the light path is changed by 90°, and the light is emitted upward.

As has been described above, in the method of fabricating an optical wiring substrate by the photo-bleaching method relating to the present embodiment, the exposure apparatus 100 is used to carry out image exposure with a light beam which is modulated by the DMD 50 in accordance with image information. Predetermined regions of the core layer 224 formed by the polymer material for photo-bleaching (polysilane), whose refractive index is lowered by irradiation with UV light, are exposed and patterned by the light beam, and the cladding layer 226, whose refractive index is lower than that of the core layer 224, is formed. End portions of the core layer 224 are exposed and patterned by the light beam, whose light amounts are controlled in accordance with the inclined forms of the inclined faces 228. Thus, the inclined faces 228, which function as reflection mirrors, are formed.

Accordingly, in fabrication of optical wiring substrates by the photo-bleaching method, core layers and cladding layers which structure optical waveguides can be formed by maskless exposure, and fabrication of optical wiring circuitry and optical wiring substrates is simple.

Similarly to the etching method, because the exposure is maskless exposure, fabrication in accordance with circuit variations, complex circuit structures and the like is simple. Furthermore, because the exposure is line exposure, even with film that is supplied in roll form, circuit patterns such as optical sheet buses, optical wiring circuits and the like can be formed with high speeds and large areas. Further yet, because the method uses a light beam with extremely high precision, at a resolution of the order of 0.1 μm, pattern forms can form optical waveguides and optical branching circuits in which propagation losses are excellently suppressed. At the inclined faces 228 provided at the end portions of the core layer 224, because control of exposure light amounts by multiple exposure is simple, the inclined forms can be made smooth.

The distribution of refractivity of the inclined face 228 shown in FIG. 26 is schematically shown as an example thereof. In an alternative case in which, for exampe, the refractive index is varied stepwise in three steps (three layers) or more in the direction substantially perpendicular to the inclined face 228, or a case in which the refractive index is varied practically continuously with extremely small variation intervals, similarly to the effect described above, the light L that is incident at the inclined face 228 can be reflected with a high reflection coefficient. Thus, the light L can be effectively diverted by the inclined face 228 functioning as a reflection mirror, even without a reflection mirror being provided separately.

Fourth Embodiment

Next, a method of fabricating an optical wiring substrate which is provided with optical wiring circuitry with a plurality of levels by the photo-bleaching method, using the exposure apparatus 171 described for the second embodiment, will be described.

First, by the steps of FIGS. 25A to 25B of the third embodiment, the cladding layer (polyvinylidene fluoride layer) 222 and the core layer (layer of a polymer material for photo-bleaching) 224, whose refractive index is larger than that of the cladding layer 222, are formed in this order on the temporary support 202, which is a glass plate or the like.

Figure 27A:
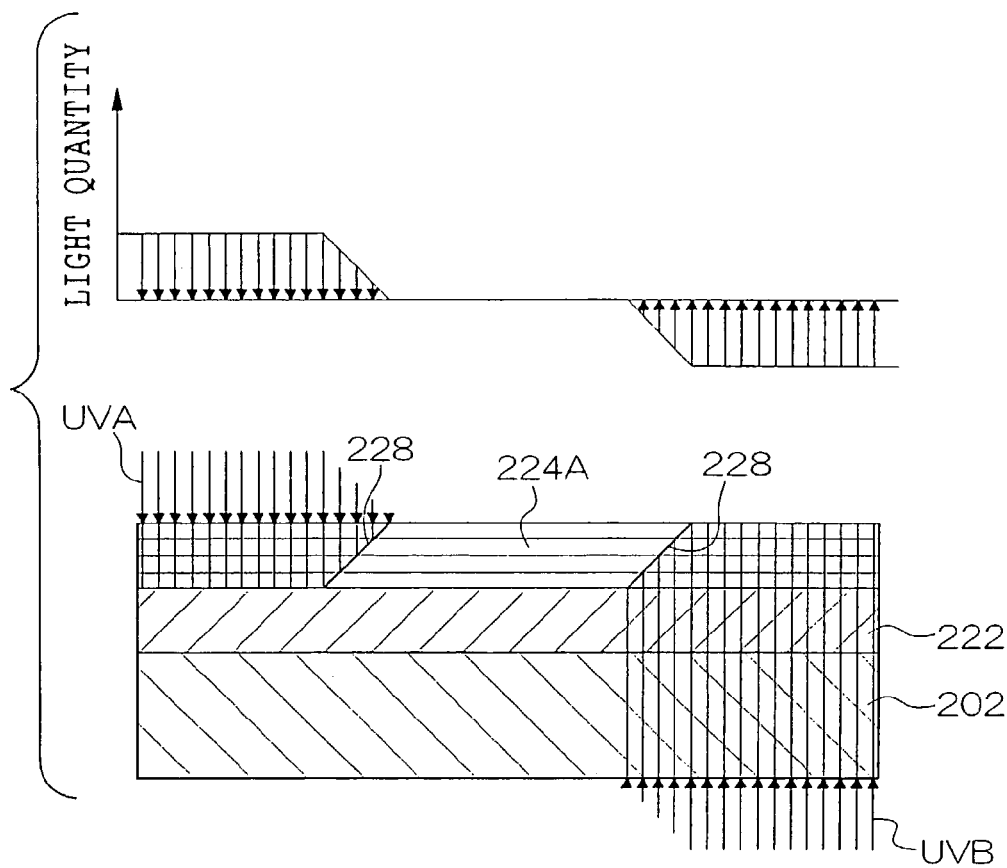
FIG. 27A is a diagram for explaining a process relating to a fourth embodiment of the present invention for fabrication of an optical wiring substrate, which is provided with a plurality of levels of optical wiring circuitry, by a photo-bleaching method, showing a stage at which a first level core layer is exposed by light beams with varying exposure light amounts from both sides.

This optical wiring substrate material is set on the stage 172 of the exposure apparatus 171. One end portion of the core layer 224 (the left side in the drawings) is exposed with laser light UVA from the scanner 162A disposed at the upper side, and the other end portion (the right side in the drawings) is exposed by laser light UVB, which is irradiated from the scanner 162B disposed at the lower side and transmitted through the stage 172, the temporary support 202 and the cladding layer 222. For the light amount distribution of each laser light, again, as shown in FIG. 27A, the number of overlapping exposures by multiple exposure, to overlappingly expose sets of two or more pixels, is reduced stepwise from a distal end side to an inner side of a predetermined region of the core layer 224 corresponding to a portion at which an inclined face is to be formed. Accordingly, the distributions of exposure light amounts (the arrows UVA and the arrows UVB) control exposure light amounts such that the predetermined region is inclined (at about 45°) as shown in the drawing.

Consequently, a predetermined region of the core layer 224 is exposed, the refractive index thereof is reduced, and the predetermined region becomes a cladding layer 226A. An unexposed region becomes a core layer 224A with a parallelogram-form cross-section, which is structured with an inverted taper-form inclined face structure at a right side end portion thereof. At boundaries of the cladding layer 226A with end portions of the core layer 224A (the left and right side end portions in FIG. 27A), the inclined faces 228 are formed at angles according to the exposure light amount distributions.

Figure 27B:
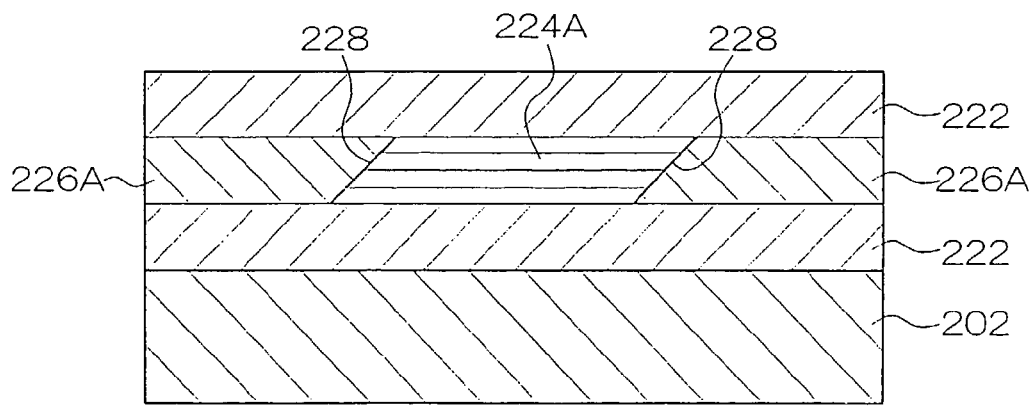
FIG. 27B is a diagram for explaining the fabrication process relating to the fourth embodiment, showing a state in which the first level core layer is covered by a cladding layer.

After this exposure process of the first level core layer has been completed, the exposed optical wiring substrate material is removed from the stage 172. In FIG. 27B, the core layer 224A and cladding layer 226A are covered by the cladding layer 222. Thus, a first level optical wiring circuit is formed, which is structured as a circuit by an optical waveguide, which is formed by the core layer 206A at both end portions of which the inclined faces 228 are provided, and the cladding layers 222 and 226A, which cover the core layer 206A.

Figure 27C:
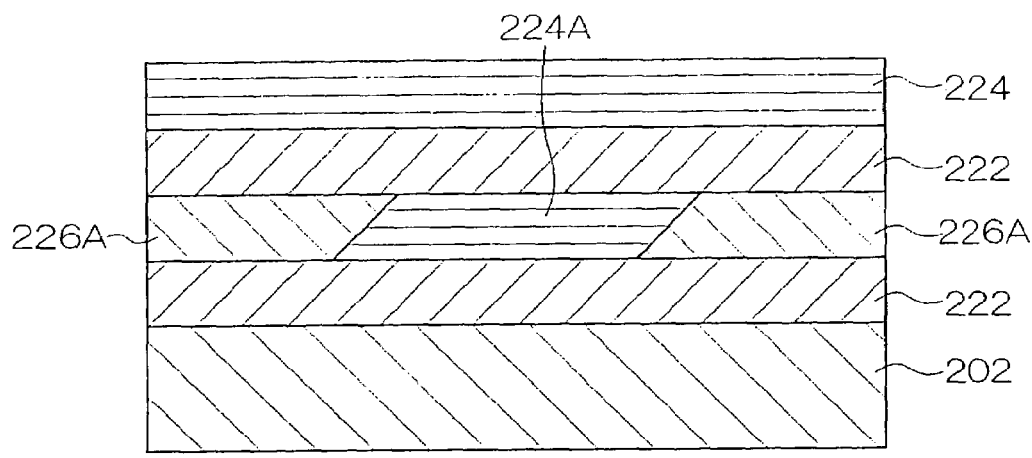
FIG. 27C is a diagram for explaining the fabrication process relating to the fourth embodiment, showing a state in which a second level core layer is formed on the cladding layer.
Figure 27D:
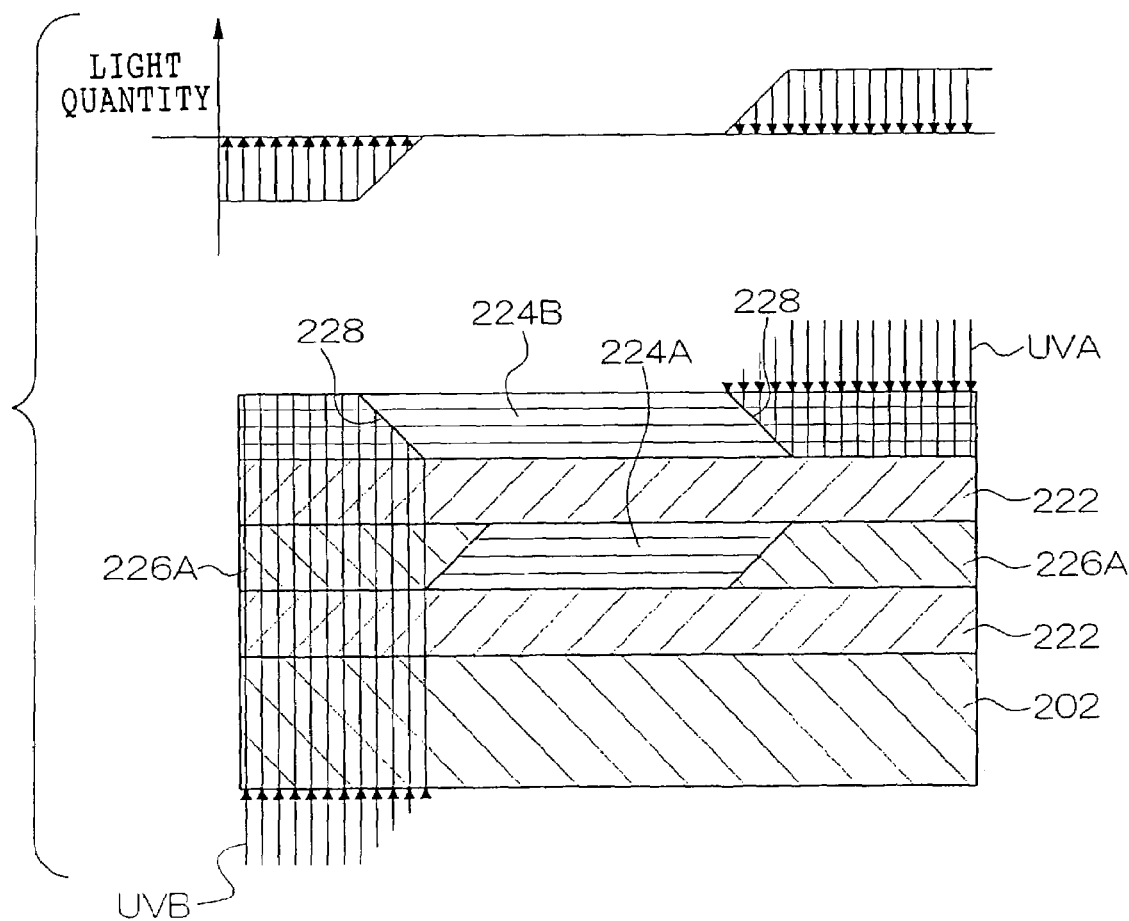
FIG. 27D is a diagram for explaining the fabrication process relating to the fourth embodiment, showing a stage at which the second level core layer is exposed by light beams with varying exposure light amounts from both sides.

Thereafter, in order to form a second level of optical wiring circuitry, in FIG. 27C, the core layer 224 is formed on the cladding layer 222. Then, in FIG. 27D, exposure processing is again implemented by the exposure apparatus 171. For this second exposure, as shown in the drawing, the exposure direction, from above or below, at each pattern end portion is set to the opposite direction. Thus, a portion at the other end of the core layer 224 is exposed with laser light UVA from the upper scanner 162A, and a portion at the one end of the core layer 224 is exposed by laser light UVB irradiated from the lower scanner 162B and transmitted through the stage 172, the temporary support 202, the cladding layer 222, the cladding layer 226A and the cladding layer 222. The region exposed by the laser light UVB is set to a region which is substantially adjacent at an outer side relative to the end portion of the first level core layer 224A, and the light amount distributions of the laser lights are similar to those of the first exposure.

As a result, the exposed region of the core layer 224 is exposed, the refractive index thereof is reduced, and the exposed region becomes a cladding layer 226B. An unexposed region becomes a core layer 224B with a parallelogram-form cross-section, which is structured with an inverted taper-form inclined face structure at a left side end portion thereof. At boundaries of the cladding layer 226B with end portions of the core layer 224B (the left and right side end portions in FIG. 27D), the inclined faces 228 are formed at angles according to the exposure light amount distributions. The right side inclined face 228 of the core layer 224B and the inclined face 228 of the core layer 224A are disposed to substantially overlap in the vertical direction.

Figure 27E:
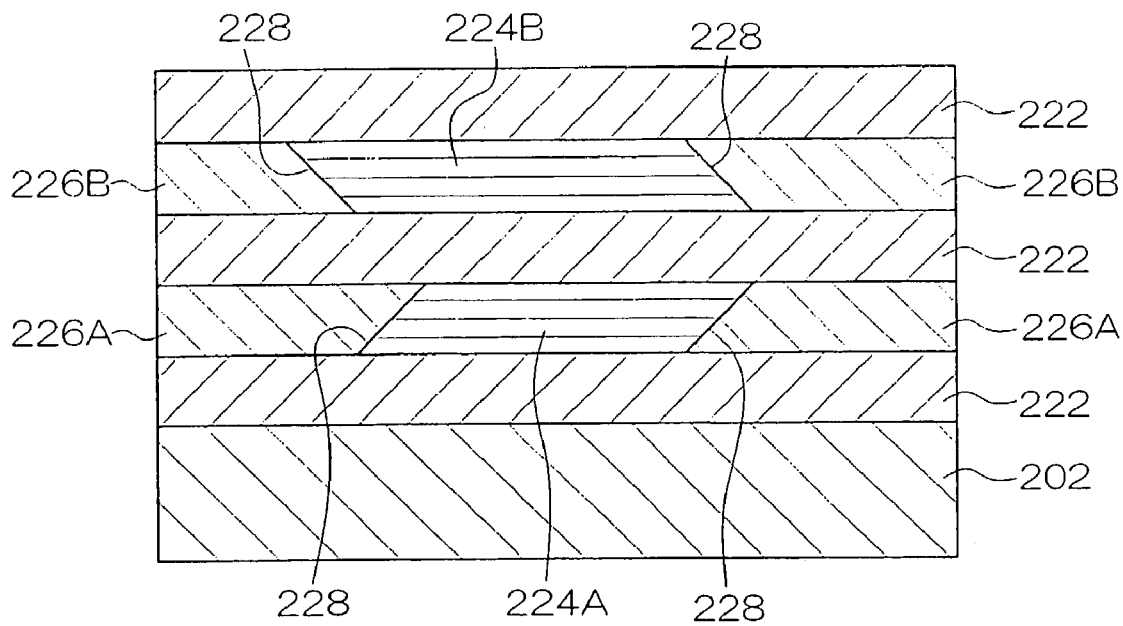
FIG. 27E is a diagram for explaining the fabrication process relating to the fourth embodiment, showing a state in which the second level core layer is covered by a cladding layer.

In FIG. 27E, the core layer 224B and cladding layer 226B are covered with the cladding layer 222, and a second level optical wiring circuit is formed. Finally, the temporary support 202 is stripped away and, as shown in FIG. 27F, an optical wiring substrate 240, in which optical wiring circuitry is provided at a plurality of levels, is completed.

Figure 27F:
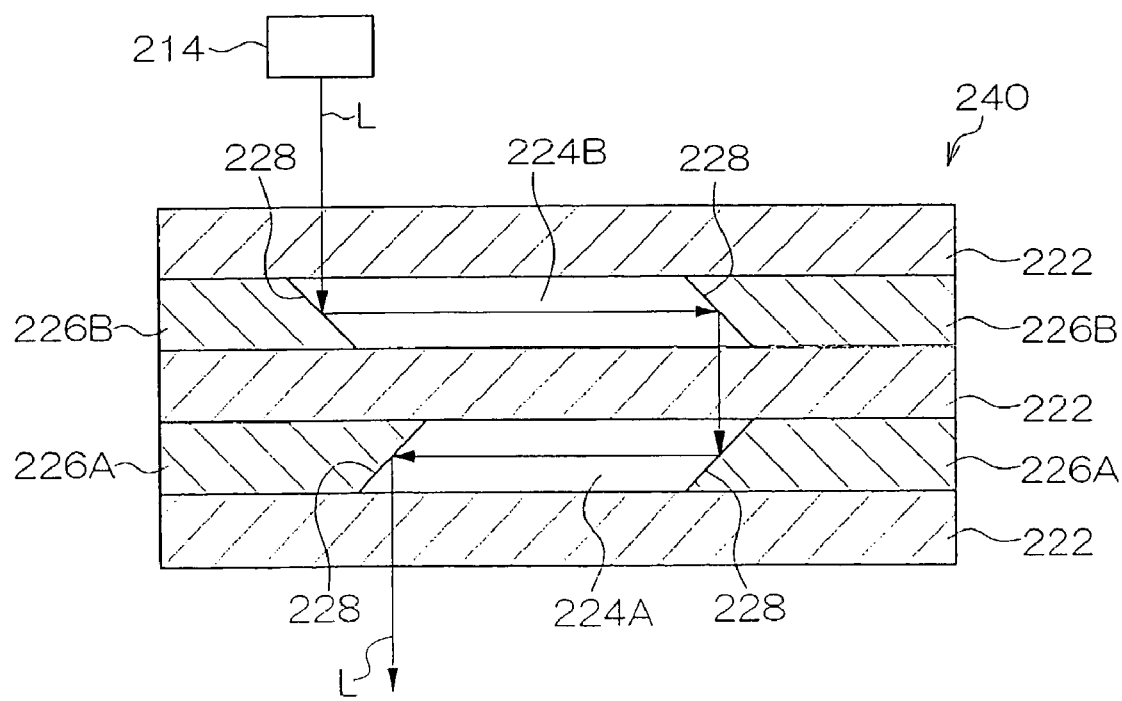
FIG. 27F is a diagram for explaining the fabrication process relating to the fourth embodiment, showing a completed state of the optical wiring substrate provided with a plurality of levels of optical wiring circuitry, which has been fabricated by the photo-bleaching method, and a usage example thereof.

A usage example of this optical wiring substrate 240 is shown in FIG. 27F. Light L from the light-emitting element 214 at the upper side is inputted on the inclined face 228 at the left side of the core layer 224B. Hence, the light L is reflected at the inclined face 228, is guided in the core layer 224B and reaches the inclined face 228 at the opposite end thereof, whereat the light L is reflected and emitted downward. The light L is incident on and reflected at the inclined face 228 at the right side of the lower level core layer 224A, is guided by the core layer 224A, is reflected at the left side inclined face 228, and is emitted to the lower side of the optical wiring substrate 240.

As is described above, when an optical wiring substrate provided with a plurality of levels of optical wiring circuitry is fabricated by a photo-bleaching method, the substrate can be formed more easily by digital maskless exposure using light beams than by conventional mask exposure. Moreover, similarly to the second embodiment, alignment, scaling and the like can be employed, and a plurality of levels of optical wiring circuitry can be positioned with high accuracy.

Fifth Embodiment

Next, a method for fabricating an optical wiring substrate (optical wiring circuitry) using the exposure apparatus 100, by using a direct exposure method, will be described. FIGS. 28A to 28G show a process for fabricating an optical wiring substrate by the direct exposure method. First, in FIG. 28A, a cladding layer 242 is formed by coating and baking polyimide or the like at the temporary support 202. In FIG. 28B, a core layer 244 is formed on the cladding layer 242 by coating and baking a light-curable material (a UV acrylate, a UV epoxy resin or the like) which has a refractive index larger than that of the cladding layer 242.

Then, this optical wiring substrate material is set on the stage 152 of the exposure apparatus 100 and a predetermined exposure pattern is exposed at the core layer 244 by laser light (UV light) irradiated from the scanner 162. As shown in FIG. 28C, a pattern formation (wiring) region of an optical wiring circuit to be structured by the core layer 244 is exposed by laser light. At a predetermined region of the core layer 244 corresponding to an inclined face to be formed at an end portion thereof, the number of overlapping exposures by multiple exposure is reduced stepwise from an inner side to a distal end side, and a distribution of exposure light amounts (the arrows UV) controls exposure light amounts such that the predetermined region is inclined as shown in the drawing (at about 45°).

Here, because of the characteristics of the light-curable material employed at the core layer 244, an exposure region of the core layer 244 which is exposed by the laser light of the exposure apparatus 100 is exposed and cured.

After the exposure process of the core layer 244 by the exposure apparatus 100 has been completed, the exposed optical wiring substrate material is removed from the stage 152, and the core layer 244 is developed. Unexposed portions of the core layer 244 are removed by this developing processing. Thus, as shown in FIG. 28D, a trapezoid cross-section core layer 244B with inverted taper faces (inclined faces 246) at end portions thereof is formed. Thereafter, in FIG. 28E, in order to increase the light reflectivity of the core layer 244 at the inclined faces 246, metal is vapor-deposited at the inclined faces 246 and thin film-form reflection mirrors 248 are formed. Finally, in FIG. 28F, the polyimide or the like is coated and baked, and the core layer 244 is covered by the cladding layer 242. The core layer 244 and cladding layer 242 are stripped from the temporary support 202, and an optical wiring substrate 250 is completed (FIG. 28G). An example of usage of the optical wiring substrate 250 is shown in FIG. 28G, but will not be described further.

As described above, in the method for fabrication of an optical wiring substrate by a direct exposure method relating to the present embodiment, image exposure is carried out using the exposure apparatus 100 with a light beam that is modulated by the DMD 50 in accordance with image information. Thus, the predetermined regions of the core layer 244 formed of the light-curable material which can be cured by light irradiation are exposed by the light beam and patterned. In consequence, the predetermined regions of the core layer 244 are cured. Moreover, the end portions of the core layer 244 are exposed and patterned by the light beam whose exposure light amounts are controlled in accordance with the inclined forms of the inclined faces 246. Consequently, angled face structures (the inclined faces 246) for provision of the reflection mirrors 248 are formed.

Thus, with fabrication of an optical wiring substrate by the direct exposure method too, a core layer, and inclined faces provided at end portions of the core layer, can be formed by maskless exposure, and fabrication of optical wiring circuitry and optical wiring substrates is simple.

Similarly to the etching method and the photo-bleaching method, because the exposure is maskless exposure, fabrication in accordance with circuit variations, complex circuit structures and the like is simple. Furthermore, because the exposure is line exposure, even with film that is supplied in roll form, circuit patterns such as optical sheet buses, optical wiring circuits and the like can be formed with high speeds and large areas. Further again, because the method uses a light beam with extremely high precision, at a resolution of the order of 0.1 μm, the pattern form can form optical waveguides and optical branching circuits in which propagation losses are excellently suppressed. At the inclined faces 246 provided at the end portions of the core layer 244, because control of exposure light amounts by multiple exposure is simple, the inclined forms can be made smooth.

Sixth Embodiment

Next, a method of fabricating an optical wiring substrate which is provided with optical wiring circuitry with a plurality of levels by the direct exposure method, using the exposure apparatus 171, will be described.

Figure 28A:
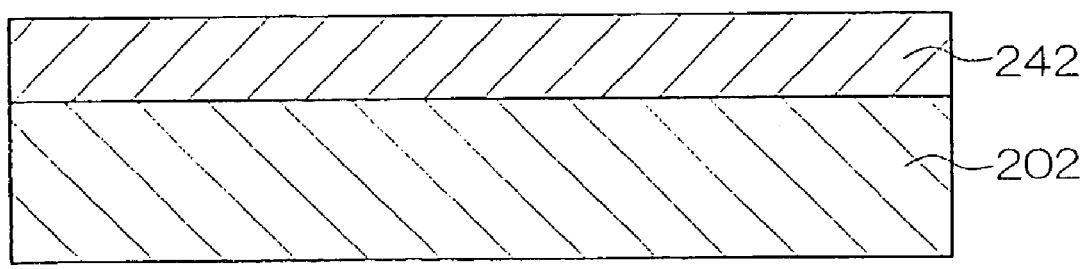
FIG. 28A is a diagram for explaining a process relating to a fifth embodiment of the present invention for fabrication of an optical wiring substrate, which is provided with a plurality of levels of optical wiring circuitry, by a direct exposure method, showing a state in which a cladding layer is formed on a temporary support.
Figure 28B:
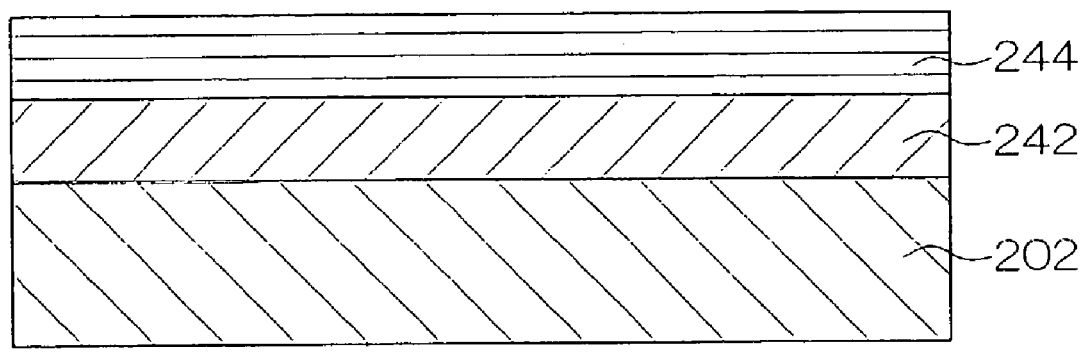
FIG. 28B is a diagram for explaining the fabrication process relating to the fifth embodiment, showing a state in which a core layer is formed on the cladding layer.
Figure 28C:
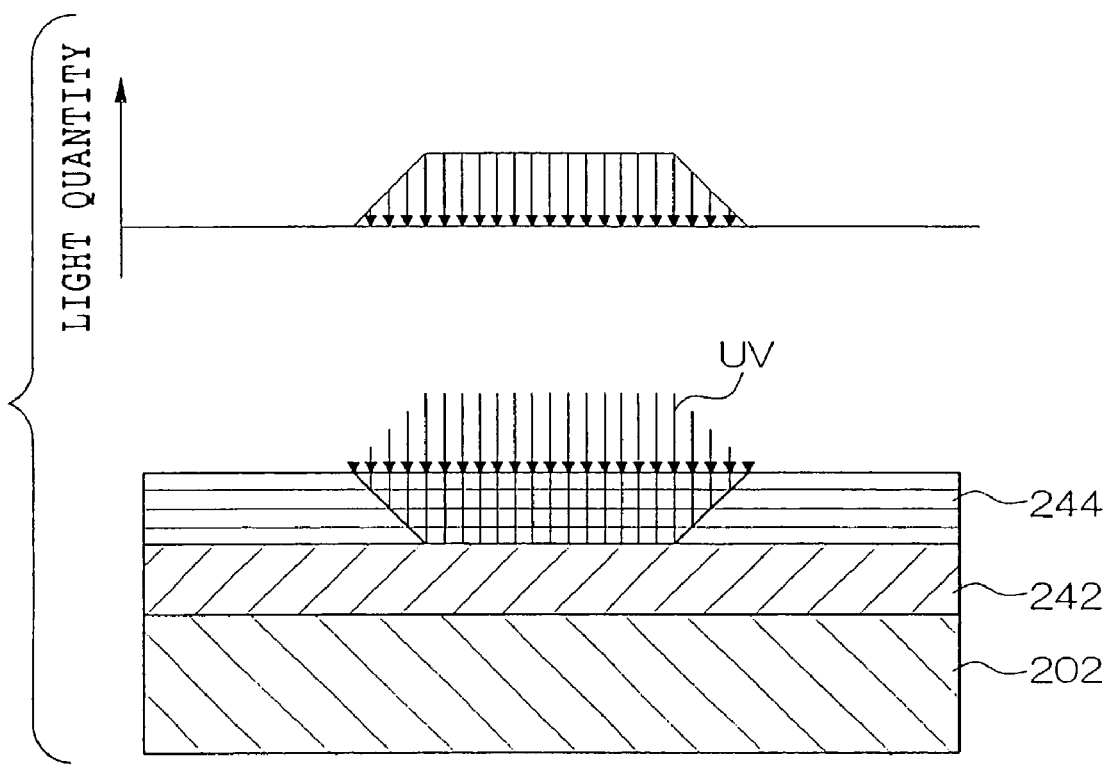
FIG. 28C is a diagram for explaining the fabrication process relating to the fifth embodiment, showing a stage at which the core layer is exposed with varying exposure light amounts by a light beam.
Figure 28D:
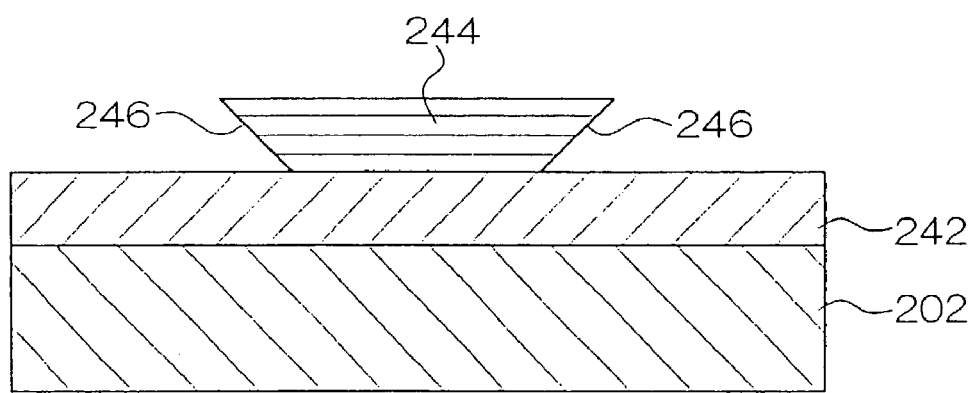
FIG. 28D is a diagram for explaining the fabrication process relating to the fifth embodiment, showing a state in which the core layer is developed.
Figure 28E:
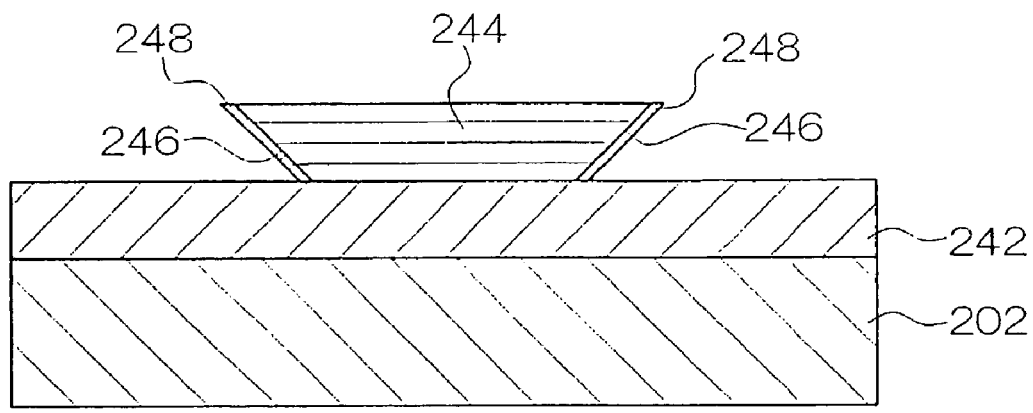
FIG. 28E is a diagram for explaining the fabrication process relating to the fifth embodiment, showing a state in which reflection mirrors are formed at inclined faces of end portions of the core layer.
Figure 28F:
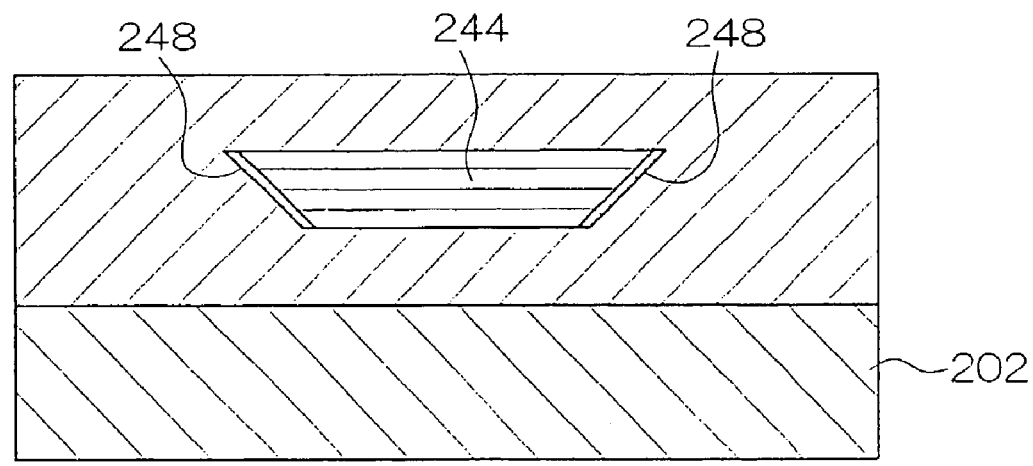
FIG. 28F is a diagram for explaining the fabrication process relating to the fifth embodiment, showing a state in which the core layer is covered by a cladding layer.
Figure 28G:
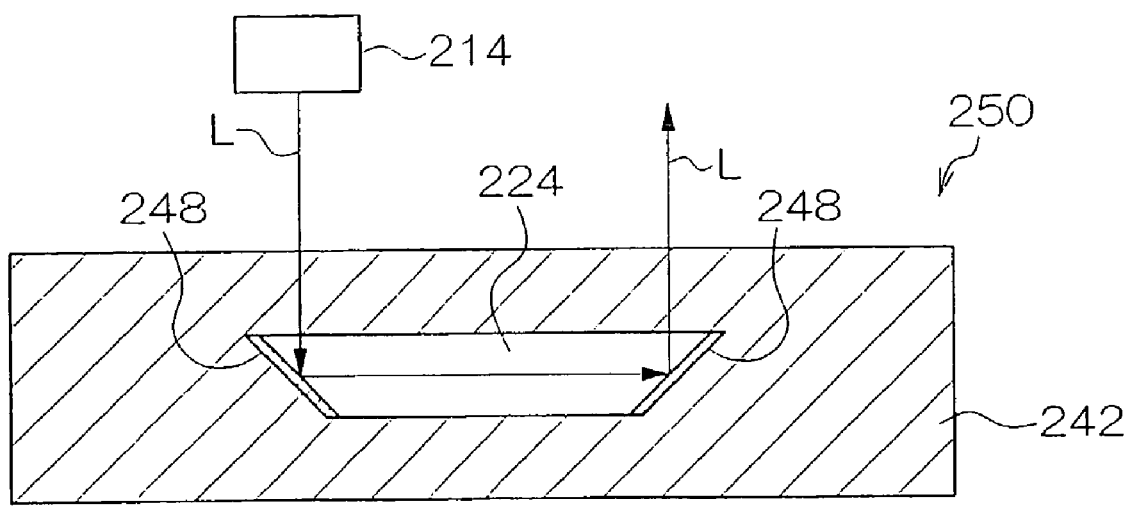
FIG. 28G is a diagram for explaining the fabrication process relating to the fifth embodiment, showing a completed state of the optical wiring substrate which has been fabricated by the direct exposure method, and a usage example thereof.

First, by the steps of FIGS. 28A to 28B of the fifth embodiment, the cladding layer (polyimide layer) 242 and the core layer (photo-curable material layer) 244, whose refractive index is larger than that of the cladding layer 242, are formed in this order on the temporary support 202, which is a glass plate or the like.

Figure 29A:
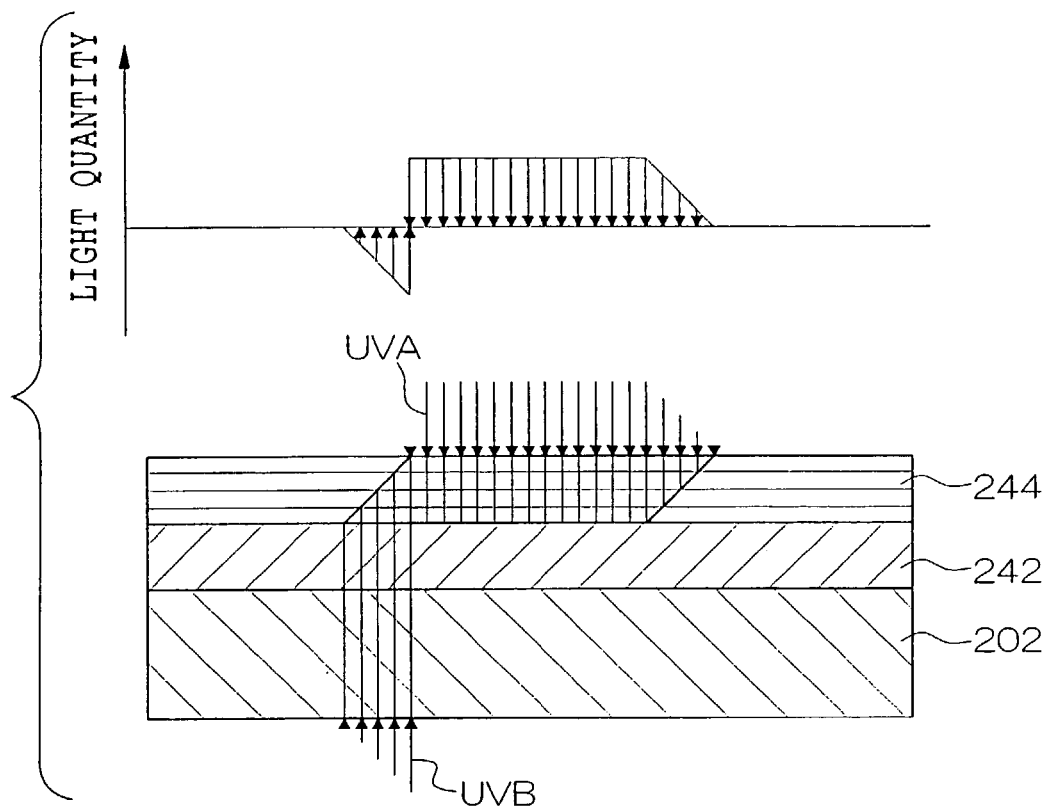
FIG. 29A is a diagram for explaining a process relating to a sixth embodiment of the present invention for fabrication of an optical wiring substrate, which is provided with a plurality of levels of optical wiring circuitry, by a direct exposure method, showing a stage at which a first level core layer is exposed by light beams with varying exposure light amounts from both sides.

This optical wiring substrate material is set on the stage 172 of the exposure apparatus 171. One end portion of the core layer 244 (the left side in the drawings) is exposed with laser light UVB, which is irradiated from the scanner 162B disposed at the lower side and transmitted through the stage 172, the temporary support 202 and the cladding layer 242. A pattern formation region of the optical wiring circuitry and the other end portion of the core layer 244 (the right side in the drawings) is exposed by laser light UVA from the scanner 162A disposed at the upper side. For the light amount distribution of each laser light, as shown in FIG. 29A, the number of overlapping exposures by multiple exposure is reduced stepwise from an inner side to a distal end side of a predetermined region, which corresponds to an inclined face to be formed at the end portion of the core layer 244. Thus, the distributions of exposure light amounts (the arrows UVA and the arrows UVB) control exposure light amounts such that the predetermined region is inclined (at about 45°) as shown in the drawing. Consequently, an exposure region of the core layer 244 is exposed and cured.

Figure 29B:
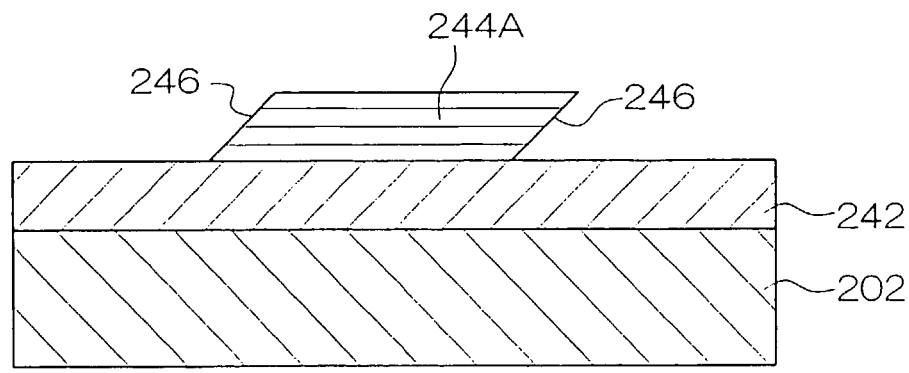
FIG. 29B is a diagram for explaining the fabrication process relating to the sixth embodiment, showing a state in which the first level core layer is developed.

After this exposure process of a first level core layer has been completed, the exposed optical wiring substrate material is removed from the stage 172, and the core layer 244 is developed. Unexposed portions of the core layer 244 are removed by this developing processing. Thus, as shown in FIG. 29B, a trapezoid-form cross-section core layer 244A with an inverted taper-form inclined face structure at the left side end portion thereof is formed.

Figure 29C:
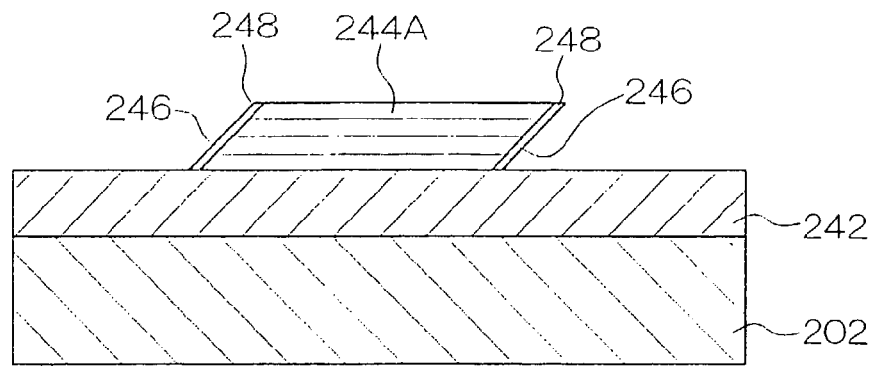
FIG. 29C is a diagram for explaining the fabrication process relating to the sixth embodiment, showing a state in which reflection mirrors are formed at inclined faces of end portions of the first level core layer.
Figure 29D:
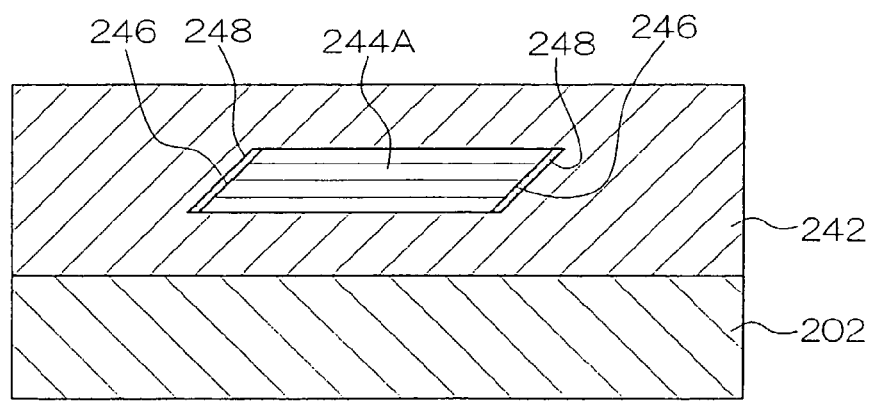
FIG. 29D is a diagram for explaining the fabrication process relating to the sixth embodiment, showing a state in which the first level core layer is covered by a cladding layer.

Thereafter, in FIG. 29C, metal is vapor-deposited at the inclined faces 246 at both end portions of the core layer 244A, and the thin film-form reflection mirrors 248 are formed. The core layer 244A is covered by the cladding layer 242 and, as shown in FIG. 29D, a first level optical wiring circuit is formed, which is structured by an optical waveguide (the core layer 244A) at both end portions of which reflection mirrors are provided.

Figure 29E:
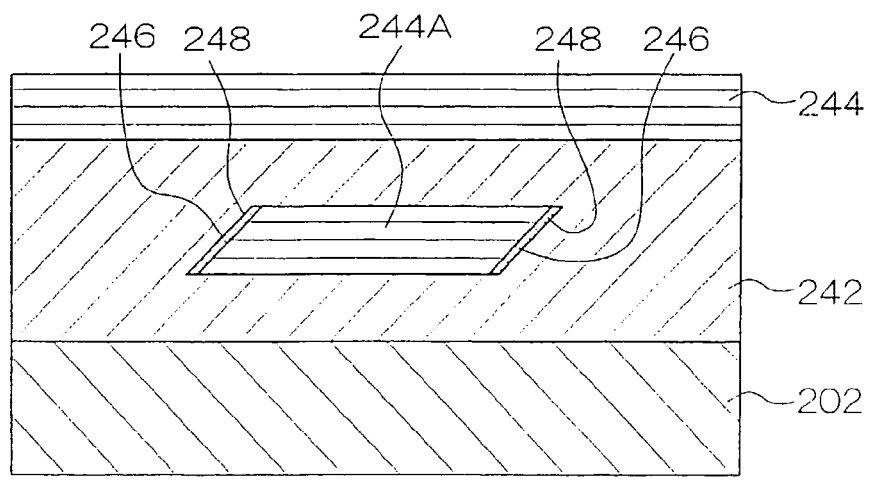
FIG. 29E is a diagram for explaining the fabrication process relating to the sixth embodiment, showing a state in which a second level core layer is formed on the cladding layer.

Thereafter, in order to form a second level of optical wiring circuitry, in FIG. 29E, the core layer 244 is formed on the cladding layer 242. Then, in FIG. 29F, exposure processing is again implemented by the exposure apparatus 171. In this second exposure, as shown in the drawing, a pattern formation region of the optical wiring circuitry and one end portion of the core layer 244 are exposed by laser light UVA from the scanner 162A disposed at the upper side. For a light amount distribution of the laser light UVA, the number of overlapping exposures by multiple exposure is reduced stepwise from an inner side to a distal end side of a predetermined region which corresponds to an inclined face to be formed at the end portion of the core layer 244. Accordingly, the distribution of exposure light amounts (the arrows UVA) controls exposure light amounts such that the predetermined region is inclined (at about 45°) as shown in the drawing.

The other end portion of the core layer 244 is exposed by laser light UVB from the scanner 162B disposed at the lower side. Here, the laser light UVB irradiates a region corresponding to the reflection mirror 248 at the left side end portion of the first level core layer 244A. For a light amount distribution of the laser light UVB, the number of overlapping exposures by multiple exposure is reduced stepwise from a distal end side to an inner side of the core layer 244A (the inclined face 246). Accordingly, the distribution of exposure light amounts (the arrows UVB) controls exposure light amounts so as to be inclined as shown in the drawing (at about 45°).

This laser light UVB is transmitted through the stage 172, the temporary support 202 and the cladding layer 242, and is incident on the reflection mirror 248 at the left side end portion of the core layer 244A. Hence, the laser light UVB is reflected by the reflection mirror 248 and enters the core layer 244. The laser light UVB is guided by the core layer 244A, and is reflected and emitted upward by the reflection mirror 248 at the right side end portion thereof. Thus, the other end portion of the core layer 244 is irradiated from below. The distribution of exposure light amounts of the laser light UVB at this other end portion of the core layer 244 is a distribution which reduces exposure light amounts step by step from an inner side thereof to a distal end side thereof.

Consequently, an exposure region of the second level core layer 224 is exposed and cured. The core layer 244 is developed, and unexposed portions are removed. Thus, as shown in FIG. 29G, a trapezoid cross-section core layer 244B with an inverted taper face at the left side end portion thereof is formed. This core layer 244B has a parallelogram form which is vertically inverted relative to the first level core layer 244A. Positions of inclined faces of the two end portions of each core layer are disposed to respectively substantially overlap in the vertical direction.

Figure 29I:
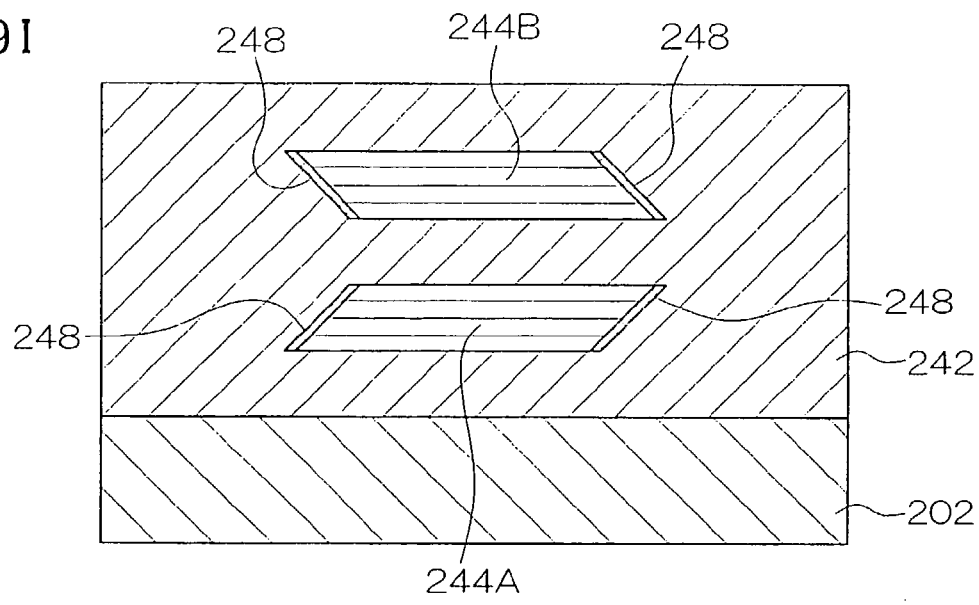
FIG. 29I is a diagram for explaining the fabrication process relating to the sixth embodiment, showing a state in which the second level core layer is covered by a cladding layer.
Figure 29J:
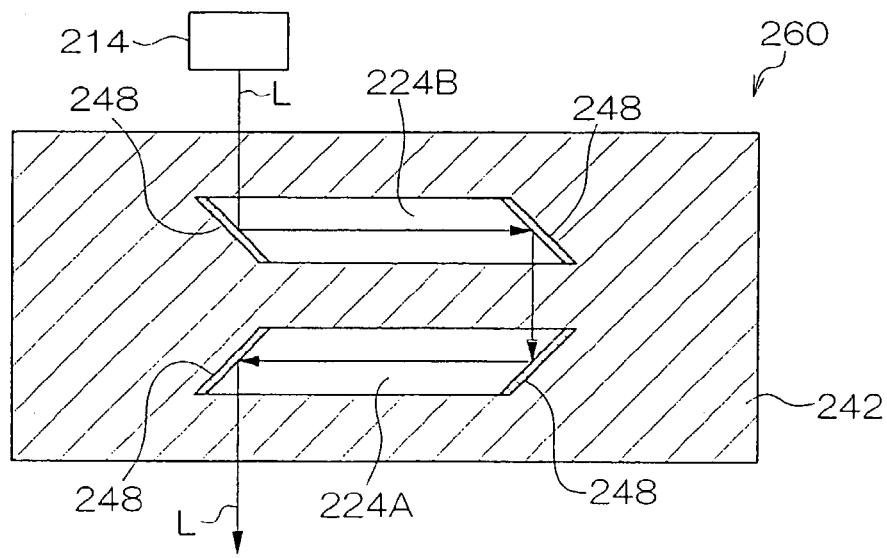
FIG. 29J is a diagram for explaining the fabrication process relating to the sixth embodiment, showing a completed state of the optical wiring substrate, which is provided with a plurality of levels of optical wiring circuitry, which has been fabricated by the direct exposure method, and a usage example thereof.

In FIG. 29H, the reflection mirrors 248 are formed at the inclined faces 246, at the two end portions of the core layer 244B, by vapor deposition of metal or the like. In FIG. 29I, the core layer 244B is covered by the cladding layer 242 and the second level of optical wiring circuitry is formed. Finally, the temporary support 202 is stripped away and, as shown in FIG. 29J, an optical wiring substrate 260, in which optical wiring circuitry is provided at a plurality of levels, is completed. An example of usage of the optical wiring substrate 260 is shown in FIG. 29J but, being similar to the case of the optical wiring substrate 220 shown in FIG. 23, will not be described further.

As described above, in the case of the method for fabrication of an optical wiring substrate provided with a plurality of levels of optical wiring circuitry by the direct exposure method, the substrate can be formed more easily by digital maskless exposure using a light beam than by conventional mask exposure. Moreover, similarly to the second and fourth embodiments, alignment, scaling and the like can be employed, and a plurality of levels of optical wiring circuitry can be positioned with high accuracy.

Hereabove, the present invention has been described in detail with the first to sixth embodiments. However, the present invention is not limited to these, and various other embodiments are possible within the scope of the present invention.

For example, in the first to sixth embodiments, control of exposure light amounts of light exposing a photosensitive material is implemented by multiple exposure in which two or more pixels are overlapped and exposed. However, exposure light amounts can be similarly varied by modulating intensity to alter light intensity at each pixel. Further, the optical wiring substrate is not limited to a structure in which a core layer (optical waveguide) is covered with a cladding layer, and the core layer may be laminated on the cladding layer.

Furthermore, in fabrication of each of the optical wiring substrates, the temporary support 202 has been employed. However, in a case in which, instead of this temporary support 202, a plastic film or the like whose refractivity is smaller than that of the core layer is employed, the step of forming the first level cladding layer may be omitted, with the core layer being formed directly on the plastic film.

Further still, exposure heads which are provided with DMDs as spatial modulation elements have been described. However, for example, MEMS (microelectro-mechanical systems) type spatial modulation elements (SLM: spatial light modulators), and optical elements (PLZT elements), liquid crystal shutters (FLC) and the like which modulate transmitted light by electro-optical effects, and spatial modulation elements other than MEMS types may be utilized. In these cases too, the same effects as above can be provided.

Here, MEMS is a general term for Microsystems in which micro-size sensors, actuators and control circuits are integrated by micro-machining technology based on IC fabrication processes. MEMS type spatial modulation elements means spatial modulation elements which are driven by electro-mechanical operations by utilization of static electric forces.

Because the present invention has structures as described above, optical wiring circuitry can be formed easily by maskless exposure. In particular, an optical wiring circuitry fabrication method which is capable of simple formation of inclined surface forms, for provision of reflection mirrors at end portions of optical waveguides, and/or circuit structures in which optical wiring circuits are formed at a plurality of levels in a lamination direction, and an optical wiring substrate provided with such optical wiring circuitry, are provided.

What is claimed is:

1. A method for fabricating an optical wiring substrate which includes a circuit structure including an optical waveguide, the method comprising the steps of:
   preparing an optical material;
   exposing a predetermined region of the optical material with a light beam modulated by a spatial modulation element in accordance with image information, for forming the optical waveguide, where said predetermined region corresponds to an area of at least two pixels of an array based apparatus; and
   carrying out multiple exposure so as to overlappingly expose said at least two pixels.

2. The method of claim 1, wherein the exposing step comprises controlling exposure light amounts in accordance with the form of an inclined face for a reflection mirror, for forming the inclined face at the optical waveguide.

3. The method of claim 1, further comprising a supplying step, wherein the supplying step comprises forming a photoresist as a film at one face of a core which is for structuring the optical waveguide, and the exposing step comprises exposing the photoresist from the one face side thereof.

4. The method of claim 3, wherein the supplying step further comprises providing a cladding layer and a temporary support in this order at another face of the core.

5. The method of claim 3, further comprising the step of, after the exposing step, developing the photoresist.

6. The method of claim 5, further comprising the step of, after the developing step, etching the photoresist and the core.

7. The method of claim 6, further comprising the step of, after the etching step, stripping away remaining photoresist.

8. The method of claim 7, further comprising the step of forming a reflection mirror on an inclined face, which is formed at the core by the etching step, by vapor-depositing predetermined metal.

9. The method of claim 8, further comprising the step of covering the core with cladding material.

10. The method of claim 9, further comprising the step of stripping away the temporary support.

11. The method of claim 3, wherein the exposing step further comprises exposing another region of the photoresist from an other face side of the photoresist.

12. The method according to claim 1, wherein the spatial modulation element is a digital micromirror device comprising a plurality of small mirrors, each supported by a respective support column, and wherein for each of the plurality of small mirrors a corresponding memory cell is provided.

13. The method according to claim 12, wherein a small mirror of the digital micromirror device is turned on and off based on an inclination angle of the small mirror.

14. The method according to claim 12, wherein:
   each of the plurality of small mirrors is configured to incline to provide light onto a respective pixel of the optical material,
   an inclination angle of each of the plurality of small mirrors is below or equal to ten degrees,
   when a small mirror from the plurality of small mirrors is inclined in one direction, the small mirror is in an on state, and
   when the small mirror is inclined in an opposite direction, the small mirror is in an off state.

15. The method according to claim 1, wherein the spatial modulation element comprises a digital micromirror device comprising a plurality of micromirrors, the plurality of micromirrors are disposed in a staggered pattern in which micromirror rows are shifted by respective predetermined intervals in a direction intersecting sub-scanning direction.

16. The method according to claim 12, wherein each of the plurality of small mirrors correspond to a respective pixel of the optical material.

17. A method for fabricating an optical wiring substrate which includes a circuit structure including an optical waveguide, the method comprising:
   preparing an optical material; and
   forming the optical waveguide by exposing a predetermined region of the optical material with a light beam modulated by a spatial modulation element in accordance with image information,
   wherein the optical material comprises a core layer, which is for structuring the optical waveguide, made of a material for photo-bleaching, and the exposing of the predetermined region comprises exposing the core layer from the side of one face thereof, and
   wherein the exposing step further comprises exposing another region of the core layer from the side of another face thereof.

18. The method of claim 17, comprising the step of forming an inclined face, which includes a plurality of layers with mutually different refractivities, at a boundary between an exposed portion and an unexposed portion of the core layer, the inclined face operating as a reflection mirror.

19. The method according to claim 17, wherein said optical waveguide is formed by not having a mask on the optical material during said exposure.

20. The method according to claim 17, wherein said modulation by the spatial element is controlled based on a number of overlapping light beams.

21. A method for fabricating an optical wiring substrate which includes a circuit structure including an optical waveguide, the method comprising:
preparing an optical material; and
forming the optical waveguide by exposing a predetermined region of the optical material with a light beam modulated by a spatial modulation element in accordance with image information,
wherein the optical material comprises a core layer, which is for structuring the optical waveguide, made of a light-curable material, and the exposing of the predetermined region comprises exposing the core layer from the side of one face thereof.

22. The method of claim 21, further comprising the step of, after the exposing step, developing to remove an unexposed portion of the core layer.

23. The method of claim 22, further comprising the step of forming a reflection mirror on an inclined face, which is formed at the core layer by the developing step, by vapor-depositing predetermined metal.

24. The method of claim 21, wherein the exposing step further comprises exposing another region of the core layer from the side of another face thereof.

25. The method according to claim 21, wherein said optical waveguide is formed by not having a mask on the optical material during said exposure.

26. The method according to claim 21, wherein said modulation by the spatial element is controlled based on a number of overlapping light beams.

27. The method according to claim 21, wherein said exposure from the side of the face of the core comprises first exposing an end portion of the core layer.

28. The method according to claim 21, wherein number of exposures are reduced step wise from the side of the face of the core layer being first exposed moving towards a center of the core layer.

* * * * *